US012628337B2

(12) United States Patent
Kang et al.

(10) Patent No.: US 12,628,337 B2
(45) Date of Patent: May 12, 2026

(54) SEMICONDUCTOR MEMORY DEVICE

(71) Applicant: SAMSUNG ELECTRONICS CO., LTD., Suwon-si (KR)

(72) Inventors: Taegyu Kang, Suwon-si (KR);
Taehyuk Kim, Suwon-si (KR);
Seok-Ho Shin, Suwon-si (KR);
Keunnam Kim, Suwon-si (KR);
Seokhan Park, Suwon-si (KR);
Joongchan Shin, Suwon-si (KR);
Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 337 days.

(21) Appl. No.: 18/242,817

(22) Filed: Sep. 6, 2023

(65) Prior Publication Data

US 2024/0147707 A1 May 2, 2024

(30) Foreign Application Priority Data

Oct. 28, 2022 (KR) ........................ 10-2022-0140981

(51) Int. Cl.
*H10B 12/00* (2023.01)
*H01L 23/522* (2006.01)
*H10B 41/27* (2023.01)

(52) U.S. Cl.
CPC ......... *H10B 12/50* (2023.02); *H01L 23/5225* (2013.01); *H10B 12/09* (2023.02); *H10B 12/315* (2023.02); *H10B 12/482* (2023.02)

(58) Field of Classification Search
CPC ...... H10B 12/50; H10B 12/09; H10B 12/315; H10B 12/482; H10B 12/05;
(Continued)

(56) References Cited

U.S. PATENT DOCUMENTS 7,372,091 B2 * 5/2008 Leslie ................ H10D 30/6728
257/E29.252
9,735,014 B2 * 8/2017 Jung ...................... H10B 43/35
(Continued)

FOREIGN PATENT DOCUMENTS

KR 10-2005-0041193 A 5/2005
KR 10-1096217 B1 12/2011
(Continued)

*Primary Examiner* — David Vu
(74) *Attorney, Agent, or Firm* — Muir Patent Law, PLLC

(57) ABSTRACT

A semiconductor memory device may include a substrate including a cell array region and a peripheral circuit region, an active pattern on the cell array region of the substrate, a peripheral active pattern on the peripheral circuit region of the substrate, a peripheral gate electrode disposed on a top surface of the peripheral active pattern, a first interlayer insulating pattern provided on the cell array region to cover a top surface of the active pattern, a first etch stop layer covering the first interlayer insulating pattern and the peripheral gate electrode with a uniform thickness, and a second interlayer insulating pattern disposed on the first etch stop layer and in the peripheral circuit region. In the cell array region, the second interlayer insulating pattern may have a top surface, which is located at substantially the same level as a top surface of the first etch stop layer.

20 Claims, 46 Drawing Sheets

(58) Field of Classification Search
CPC .... H10B 12/0335; H10B 41/27; H10B 41/30;
H10B 41/40; H10B 43/27; H10B 43/30;
H10B 43/40; H10B 12/48; H01L
23/5225; H10D 30/63
See application file for complete search history.

(56) References Cited

U.S. PATENT DOCUMENTS

| | | |
|---|---|---|
| 10,763,270 B2 | 9/2020 | Chen et al. |
| 10,985,257 B2 | 4/2021 | Lee et al. |
| 11,056,494 B2 | 7/2021 | Tomoyama |
| 11,088,143 B2 | 8/2021 | Kim et al. |
| 2021/0082924 A1 | 3/2021 | Seong et al. |
| 2023/0363143 A1 | 11/2023 | Lee et al. |
| 2023/0389310 A1 | 11/2023 | Kim et al. |
| 2024/0006250 A1 | 1/2024 | Kim et al. |

FOREIGN PATENT DOCUMENTS

| | | |
|---|---|---|
| KR | 10-2023-0155795 A | 11/2023 |
| KR | 10-2023-0165567 A | 12/2023 |
| KR | 10-2024-0002741 A | 1/2024 |

* cited by examiner

Figure 4B:
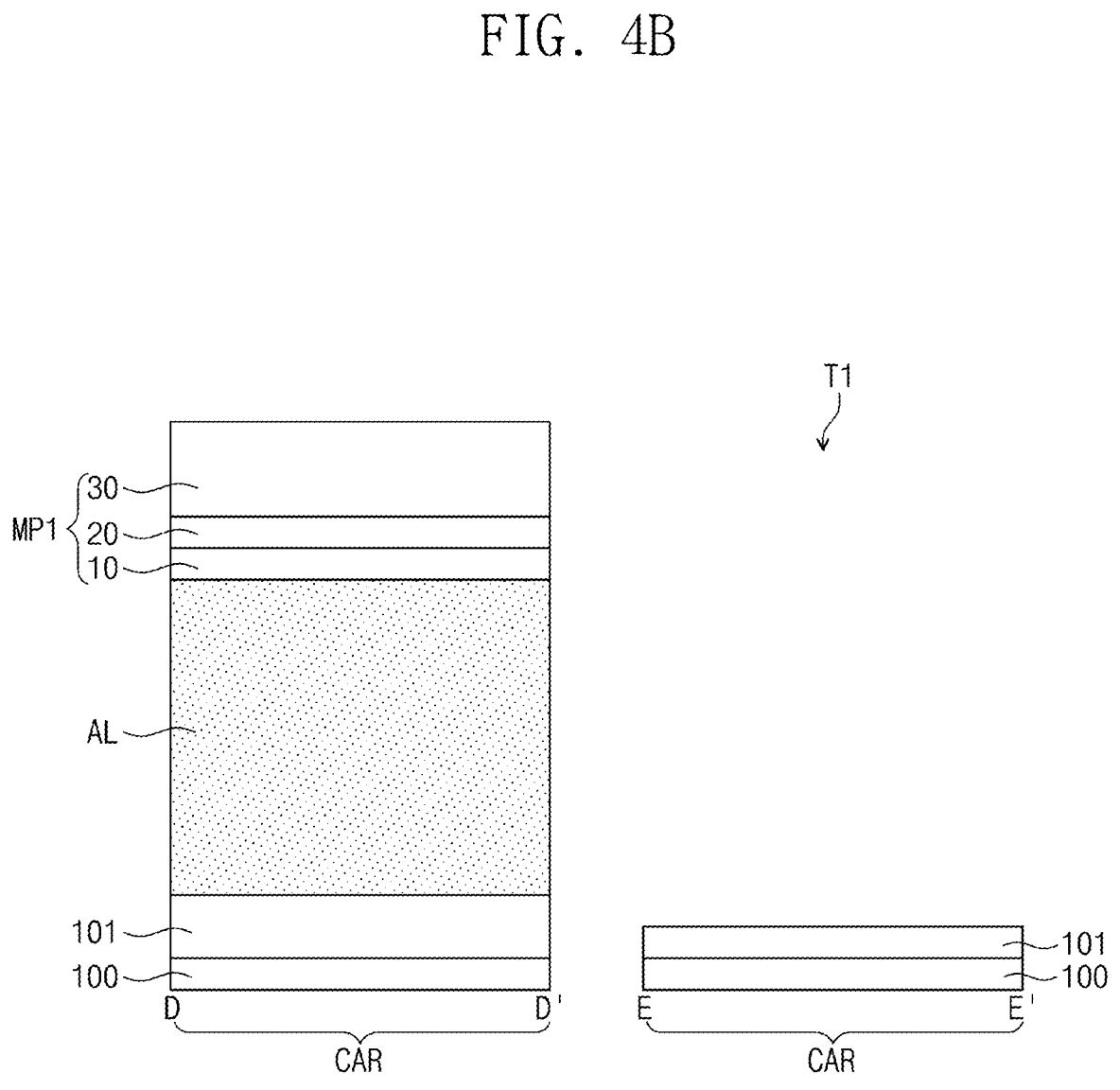

Figure 5B:
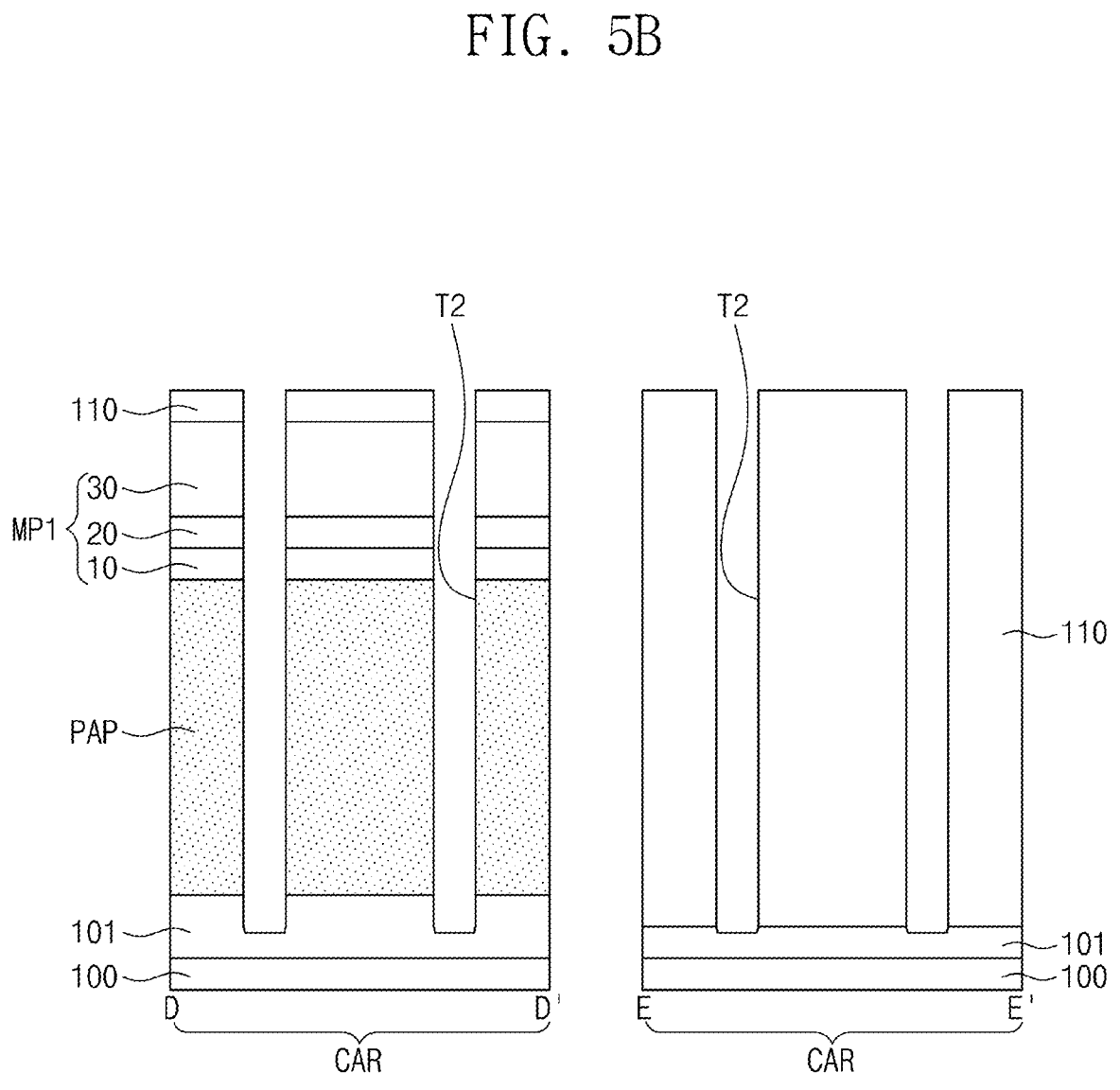

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0140981, filed on Oct. 28, 2022, in the Korean Intellectual Property Office, the entire contents of which are hereby incorporated by reference.

BACKGROUND

1. Field

The present disclosure relates to a semiconductor memory device.

2. Description of the Related Art

Higher integration of semiconductor devices is desired to satisfy consumer demands for superior performance and inexpensive prices. In the case of semiconductor devices, since a degree of integration is an important factor in determining product prices, increased integration is especially desirable. In the case of two-dimensional or planar semiconductor devices, their degree of integration is mainly determined by the area occupied by a unit memory cell. Integration may be greatly influenced by the level of fine patter-forming technology. However, the extremely expensive process equipment needed to increase pattern fineness sets a practical limitation on the ability to increase integration for two-dimensional or planar semiconductor devices. Accordingly, various semiconductor technologies have been suggested to improve integration density, resistance, and current driving ability of a semiconductor device.

SUMMARY

According to an embodiment, a semiconductor memory device may include a substrate including a cell array region and a peripheral circuit region, an active pattern on the cell array region of the substrate, a peripheral active pattern on a peripheral circuit region of the substrate, a peripheral gate electrode disposed on a top surface of the peripheral active pattern, a first interlayer insulating pattern provided on the cell array region to cover a top surface of the active pattern, a first etch stop layer covering the first interlayer insulating pattern and the peripheral gate electrode with a uniform thickness, and a second interlayer insulating pattern on the first etch stop layer and in the peripheral circuit region. In the cell array region, the second interlayer insulating pattern may have a top surface that is located at substantially the same level as a top surface of the first etch stop layer.

According to an embodiment, a semiconductor memory device may include a substrate including a cell array region and a peripheral circuit region, a bit line that extends from the cell array region in a first direction, a first active pattern and a second active pattern disposed on the bit line, a back-gate electrode disposed between the first and second active patterns and that extend in a second direction to cross the bit line, a first word line disposed adjacent to a first side surface of the first active pattern and extending in the second direction, a second word line disposed adjacent to a second side surface of the second active pattern and extending in the second direction, a peripheral active pattern on the peripheral circuit region of the substrate, a peripheral gate electrode on the peripheral active pattern, a first interlayer insulating pattern disposed in the cell array region to cover a top surface of the active pattern, a first etch stop layer covering the first interlayer insulating pattern and the peripheral gate electrode with a uniform thickness, a second etch stop layer disposed between the first interlayer insulating pattern and the top surface of the active pattern in in the cell array region and between the first etch stop layer and a top surface of the peripheral active pattern and the peripheral gate electrode in the peripheral circuit region, and a second interlayer insulating pattern disposed on the first etch stop layer in the peripheral circuit region.

According to an embodiment, a semiconductor memory device may include a substrate including a cell array region and a peripheral circuit region, bit lines provided on the cell array region of the substrate and extending in a first direction, a shielding conductive pattern including line portions, which are respectively disposed between adjacent ones of the bit lines and which extend in the first direction. First and second active patterns may be alternately disposed in the first direction on each of the bit lines, back-gate electrodes, which are respectively disposed between the first and second active patterns that are adjacent to each other in the first direction, and which extend in the second direction to cross the bit lines, first word lines, which are respectively disposed adjacent to first side surfaces of the first active patterns and extend in the second direction, second word lines, which are respectively disposed adjacent to second side surfaces of the second active patterns and extend in the second direction, a first interlayer insulating pattern disposed in the cell array region to cover a top surface of the active pattern, a peripheral active pattern on the peripheral circuit region of the substrate, a peripheral gate electrode on the peripheral active pattern, a first interlayer insulating pattern disposed in the cell array region to cover top surfaces of the first and second active patterns, a first etch stop layer covering the first interlayer insulating pattern and the peripheral gate electrode with a uniform thickness, a second interlayer insulating pattern disposed on the first etch stop layer and in the peripheral circuit region, a second etch stop layer, which is disposed between the first interlayer insulating pattern and the top surface of the active pattern in the cell array region and is disposed between the first etch stop layer and a top surface of the peripheral active pattern in the peripheral circuit region, contact patterns, which are disposed in the cell array region to penetrate the first etch stop layer, the first interlayer insulating pattern, and the second etch stop layer and are respectively coupled to the first and second active patterns, a peripheral contact plug, which is disposed in the peripheral circuit region to penetrate the second interlayer insulating pattern, the first etch stop layer, and the second etch stop layer and is in contact with the top surface of the peripheral active pattern, and data storage patterns coupled to the contact patterns, respectively.

BRIEF DESCRIPTION OF THE DRAWINGS

Features will become apparent to those of skill in the art by describing in detail exemplary embodiments with reference to the attached drawings in which:

FIGS. 4A to 16A are sectional views, which are taken along the lines A-A', B-B', and C-C' of FIG. 1 to illustrate a method of fabricating a semiconductor memory device according to an embodiment.

FIGS. 4B to 16B are sectional views that are taken along the lines D-D' and E-E' of FIG. 1 to illustrate the method of fabricating a semiconductor memory device according to an embodiment.

FIGS. 4C to 16C are sectional views that are taken along the lines F-F', G-G', and H-H' of FIG. 1 to illustrate the method of fabricating a semiconductor memory device according to an embodiment.

DETAILED DESCRIPTION

Example embodiments s will now be described more fully with reference to the accompanying drawings, in which example embodiments are shown.

Figure 1:
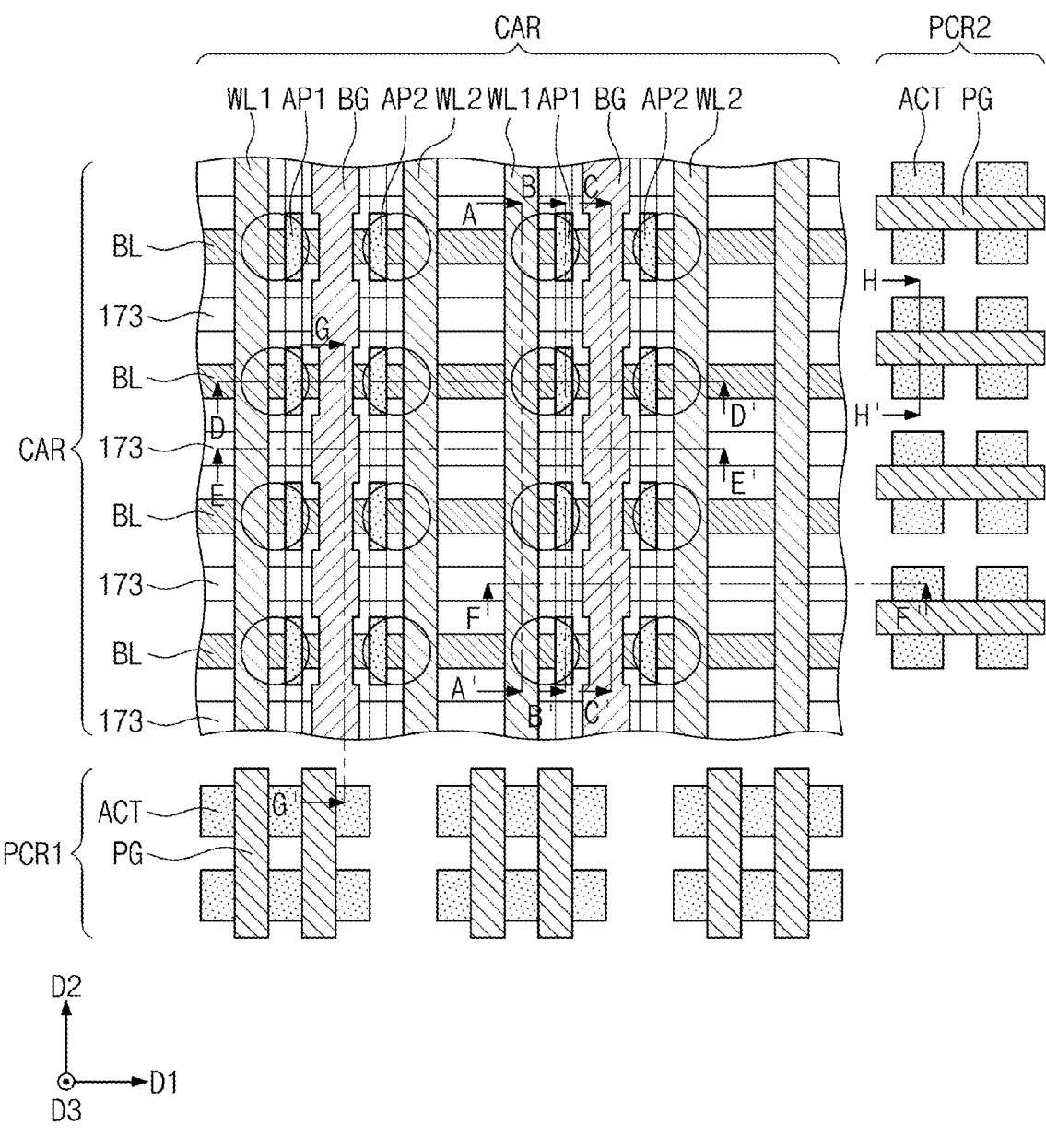
FIG. 1 is a plan view illustrating a semiconductor memory device according to an embodiment.
Figure 2A:
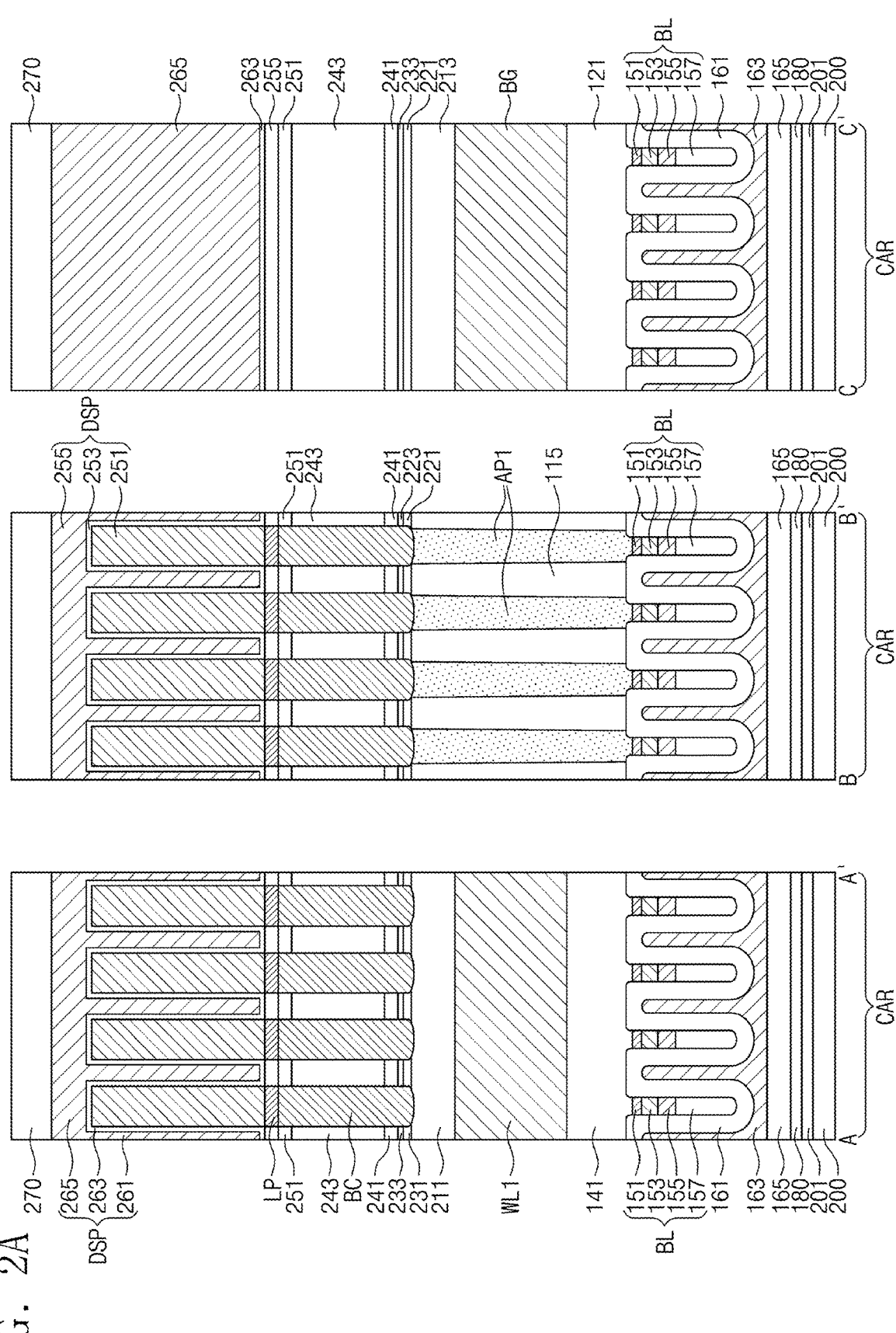
FIG. 2A is a sectional view that is taken along lines A-A', B-B', and C-C' of FIG. 1 to illustrate a semiconductor memory device according to an embodiment.
Figure 2B:
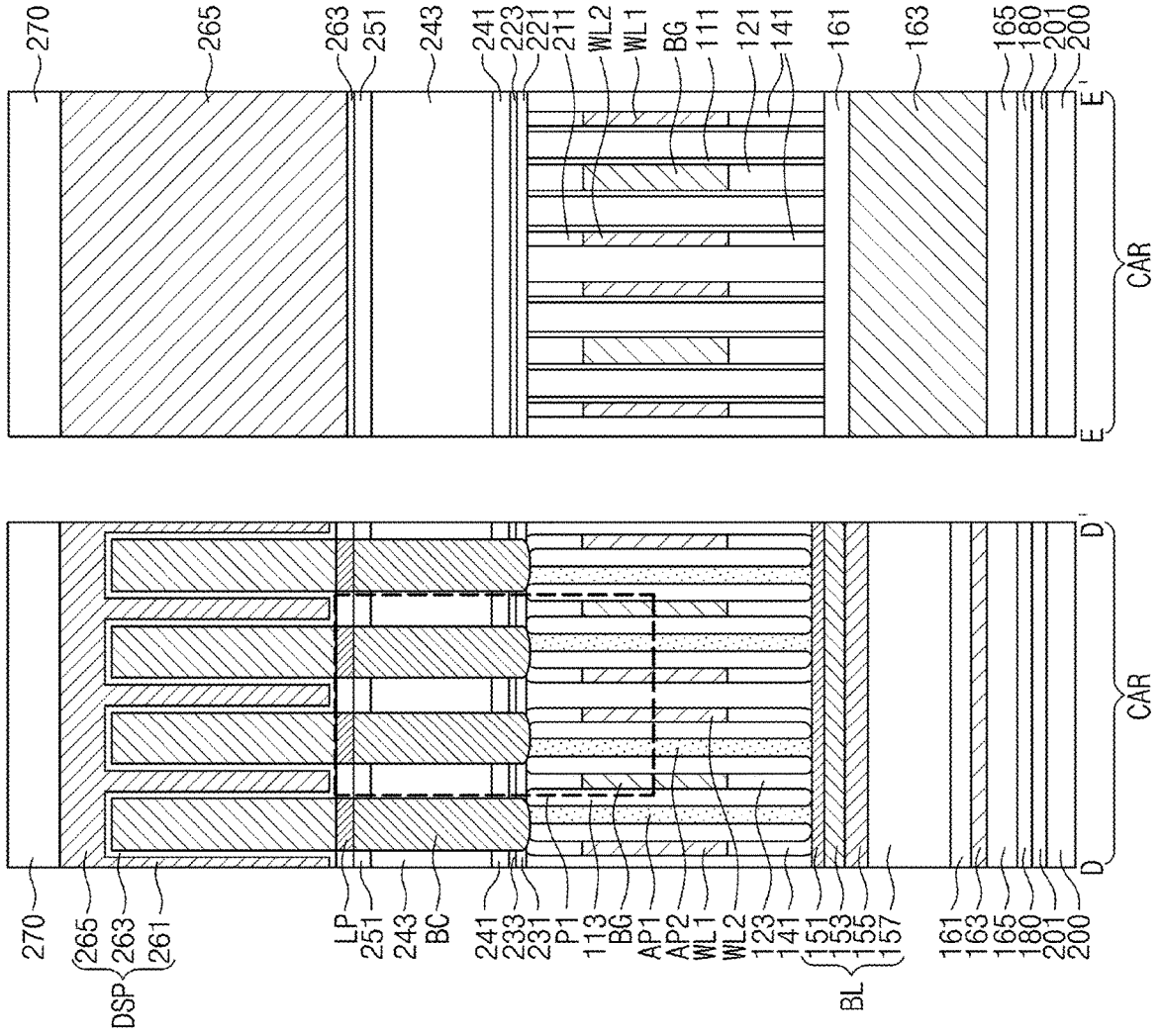
FIG. 2B is a sectional view that is taken along lines D-D' and E-E' of FIG. 1 to illustrate a semiconductor memory device according to an embodiment.
Figure 2C:
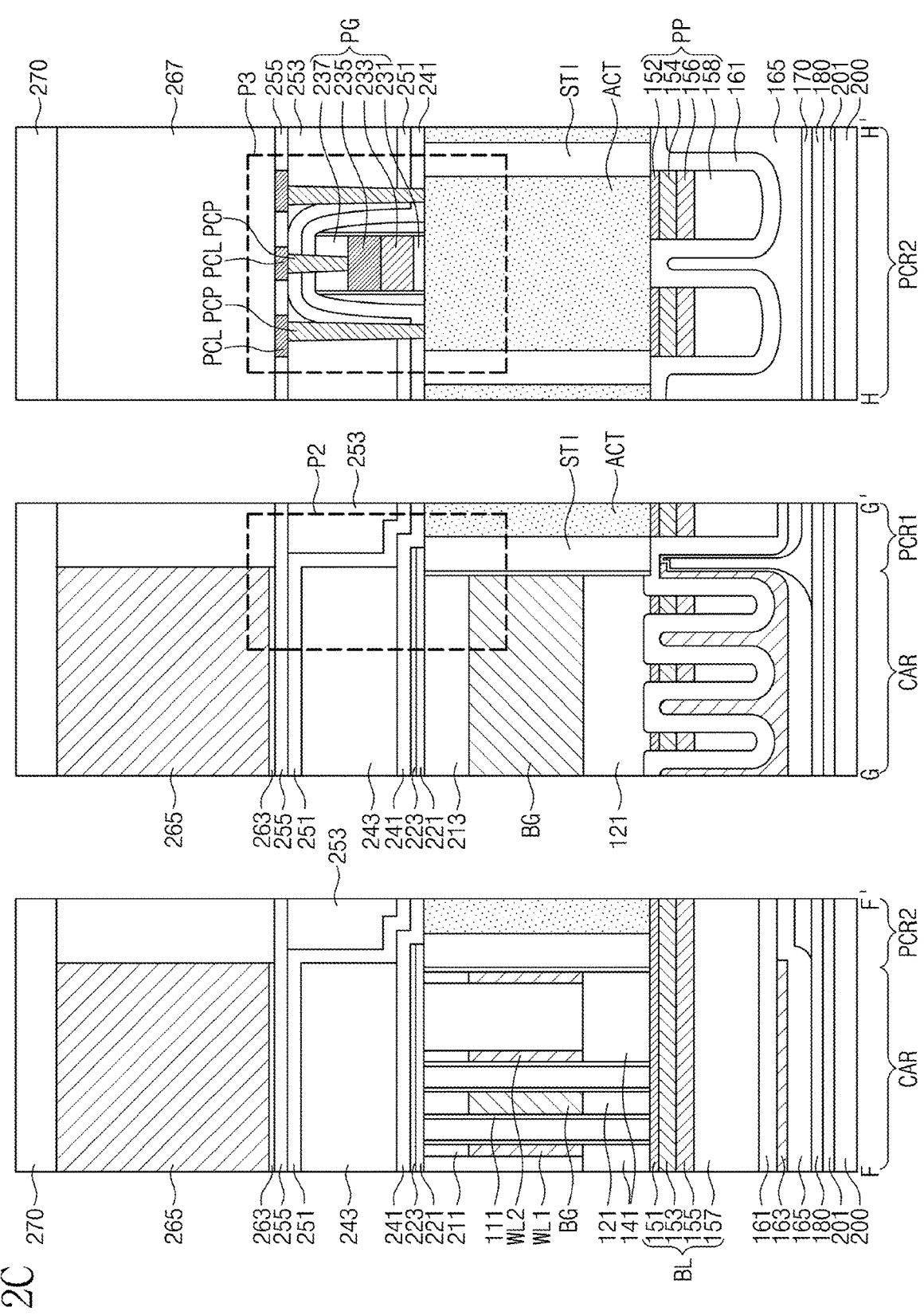
FIG. 2C is a sectional view that is taken along lines F-F', G-G', and H-H' of FIG. 1 to illustrate a semiconductor memory device according to an embodiment.
Figure 3A:
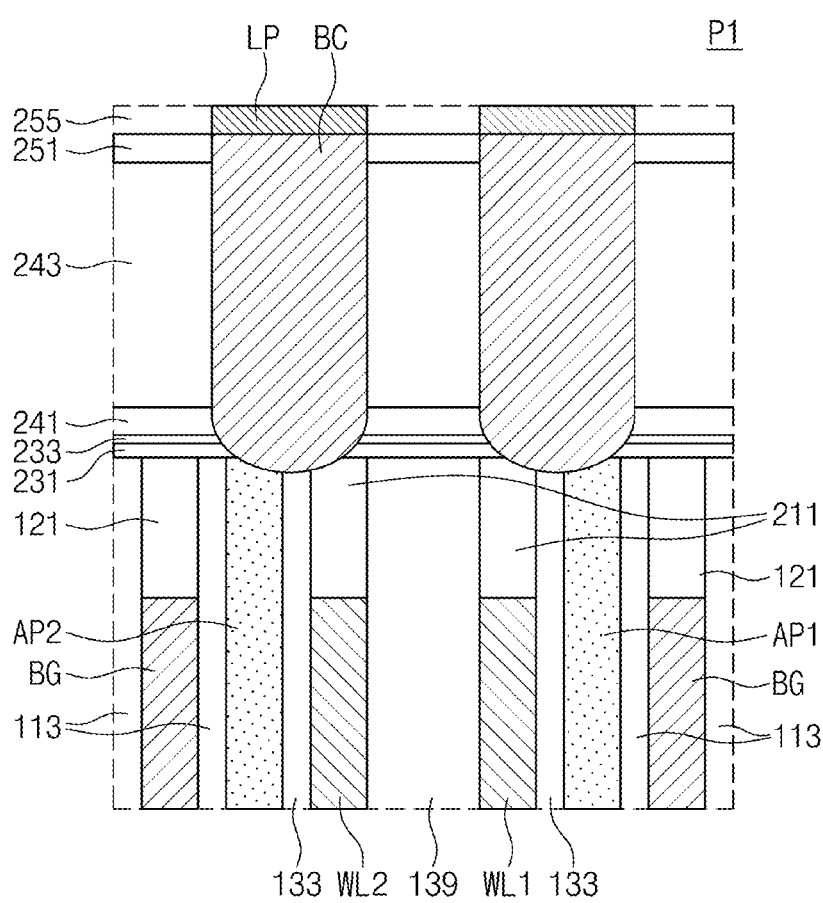
FIG. 3A is an enlarged sectional view illustrating a portion 'P1' of FIG. 2B.
Figure 3B:
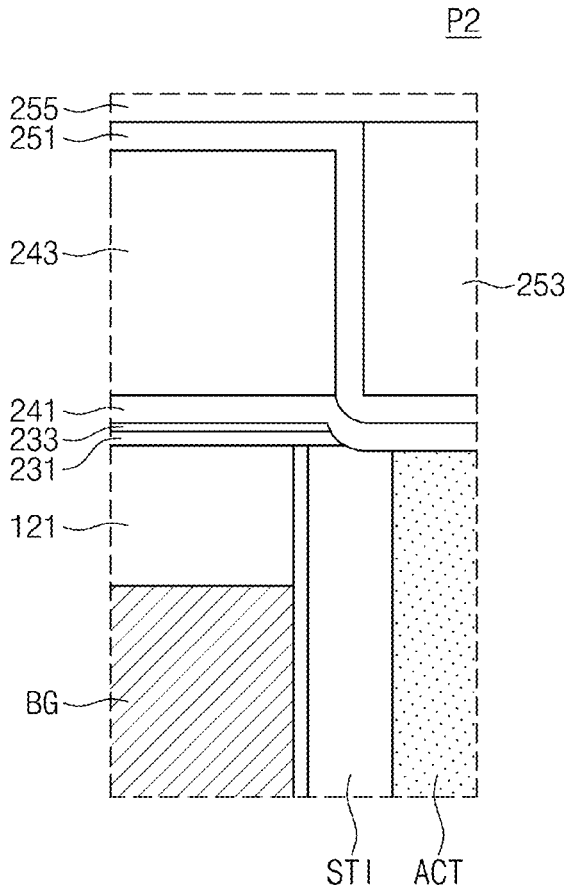
FIG. 3B is an enlarged sectional view illustrating a portion 'P2' of FIG. 2C.
Figure 3C:
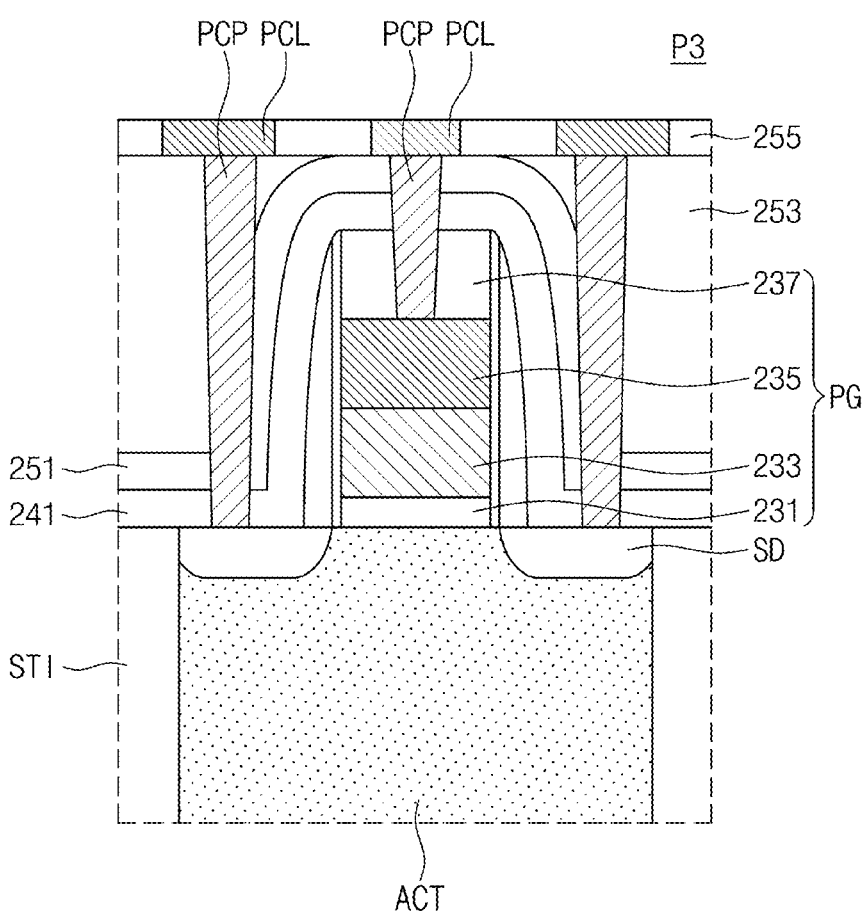
FIG. 3C is an enlarged sectional view illustrating a portion 'P3' of FIG. 2C.
Figure 4A:
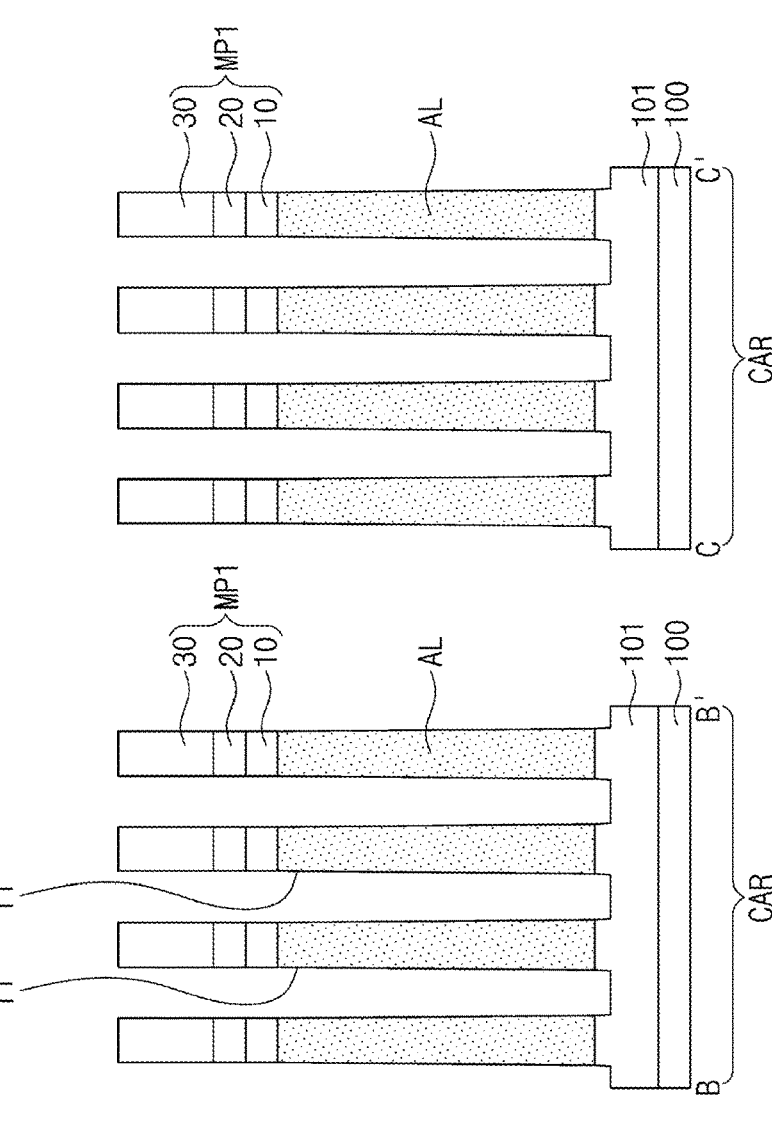
Figure 4A:
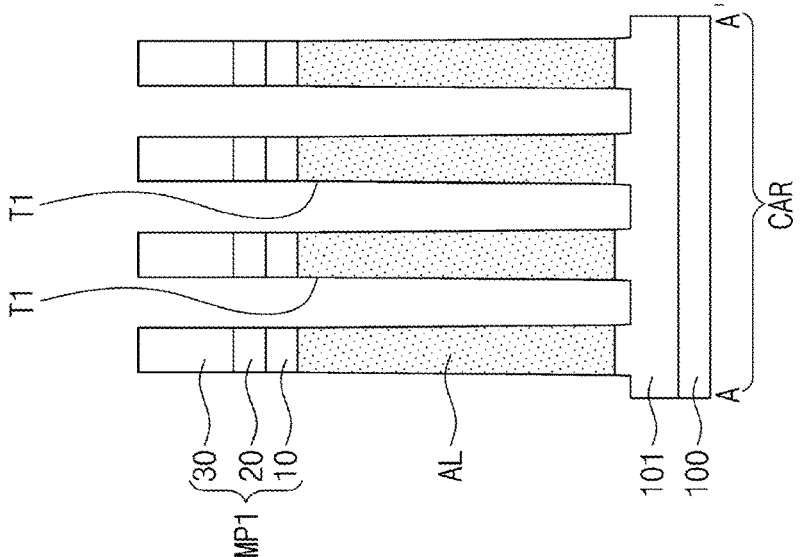
Figure 4C:
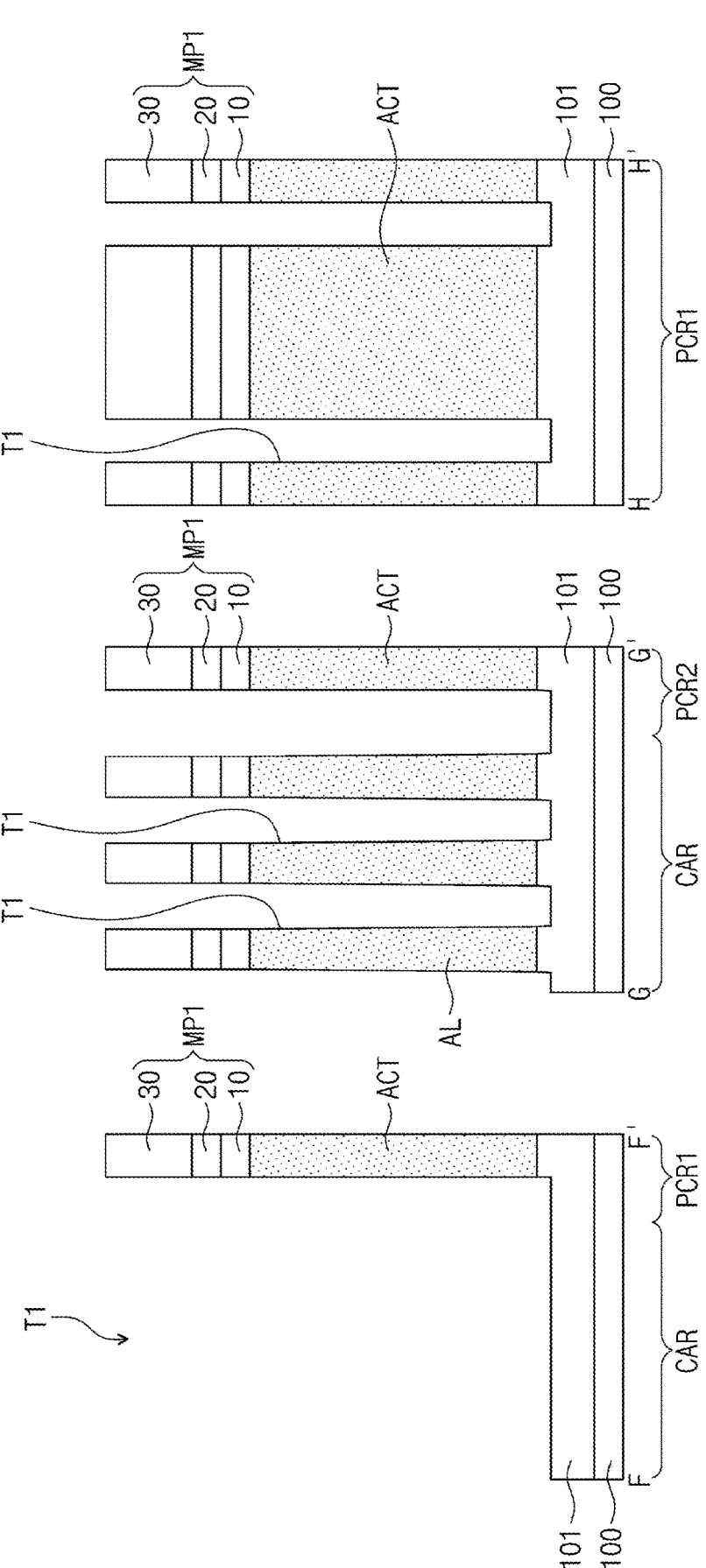
Figure 5A:
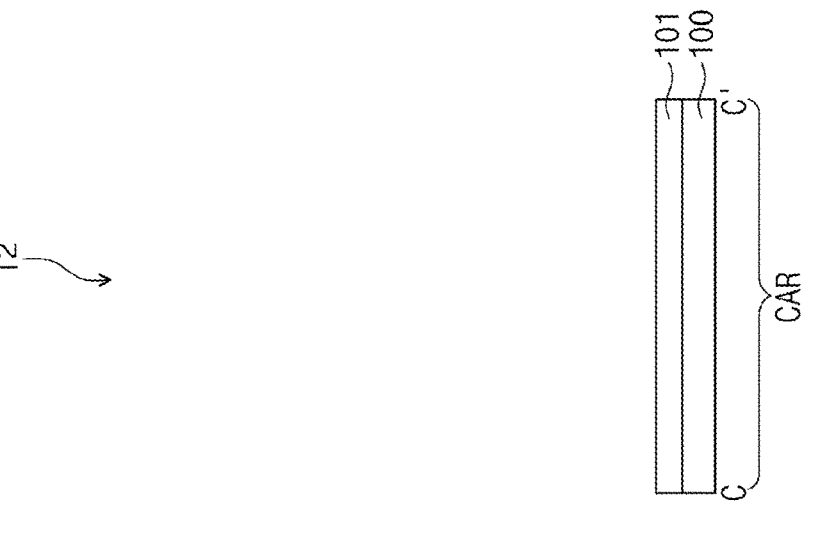
Figure 5A:
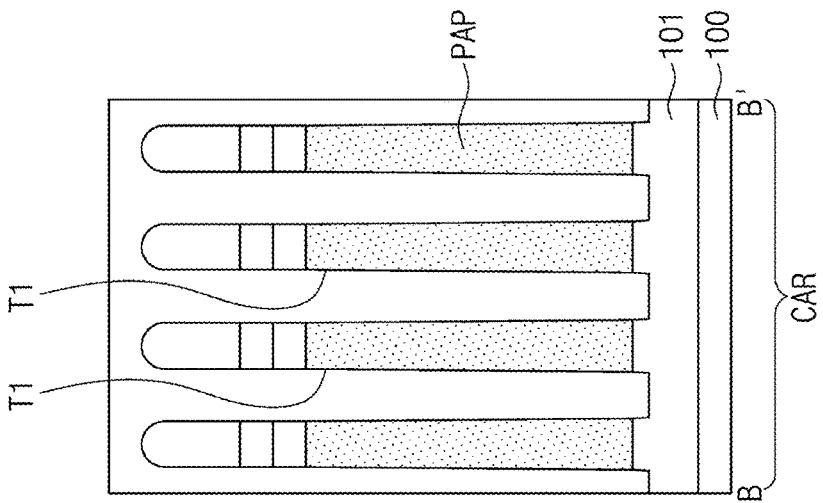
Figure 5A:
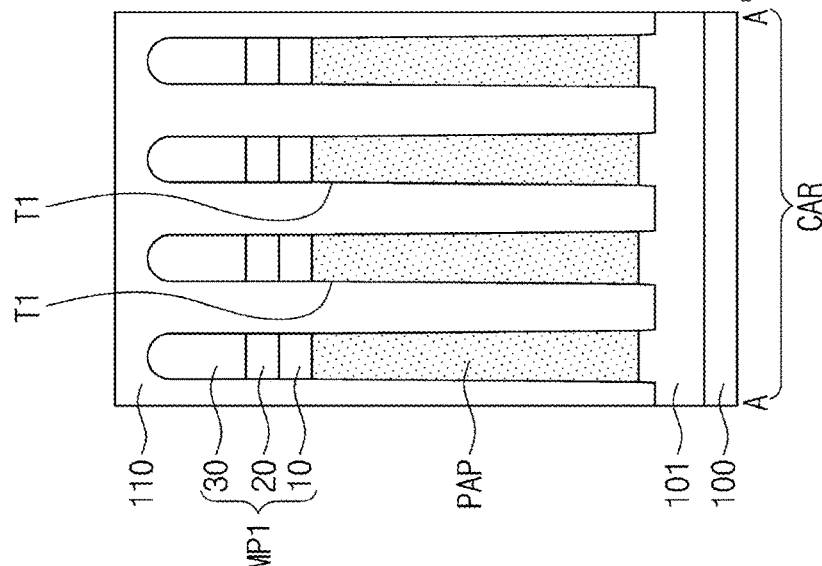
Figure 5C:
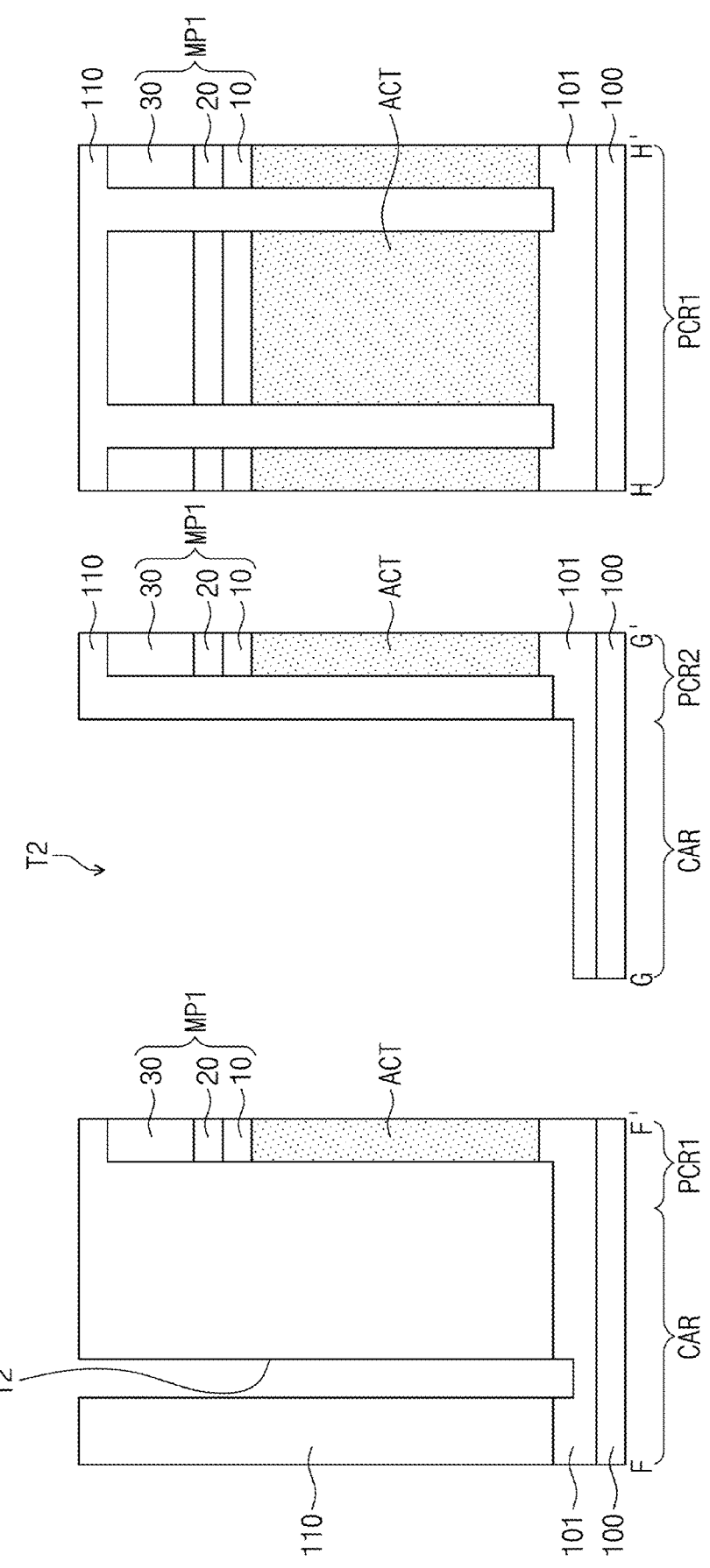
Figure 6A:
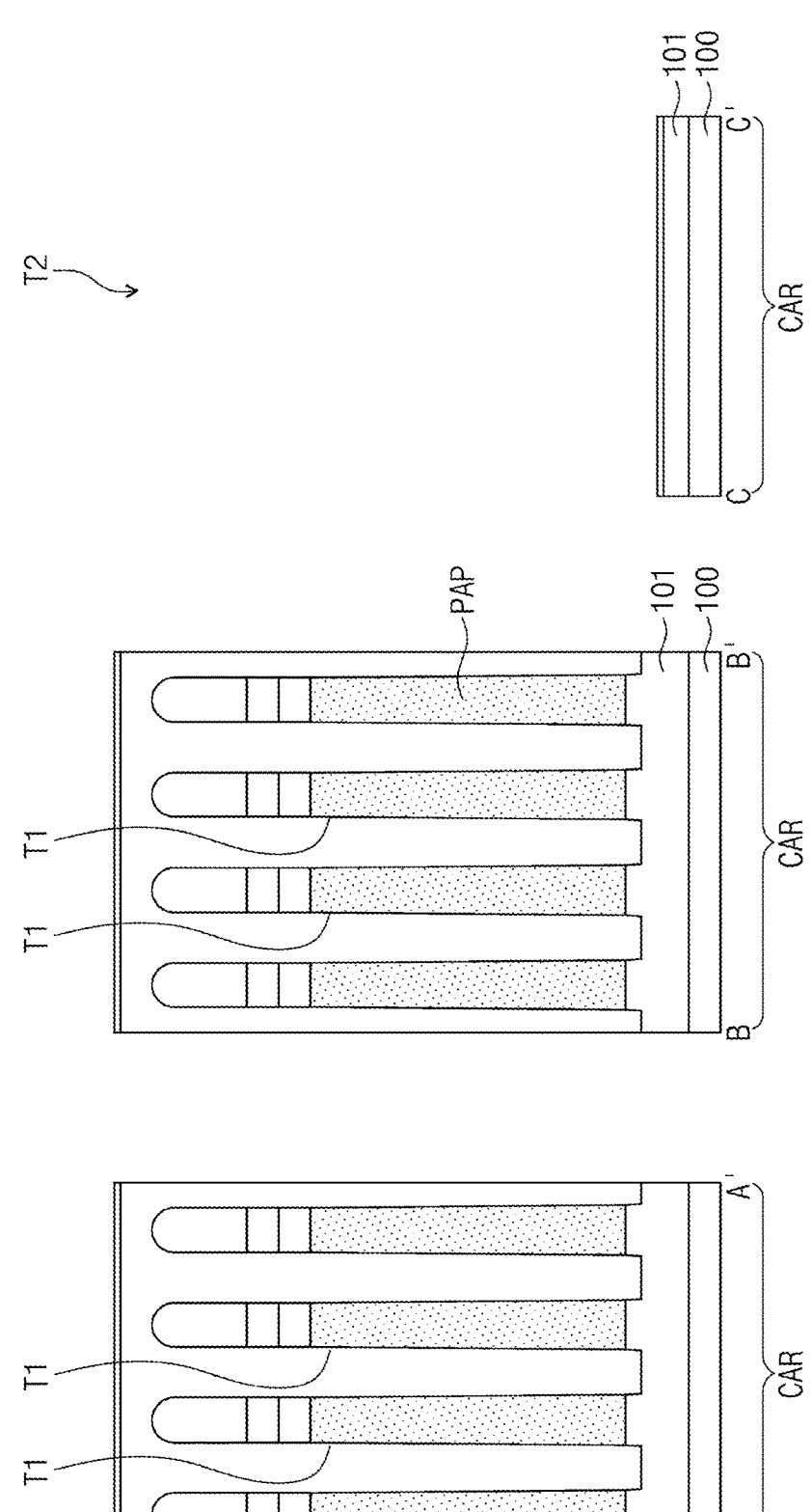
Figure 6B:
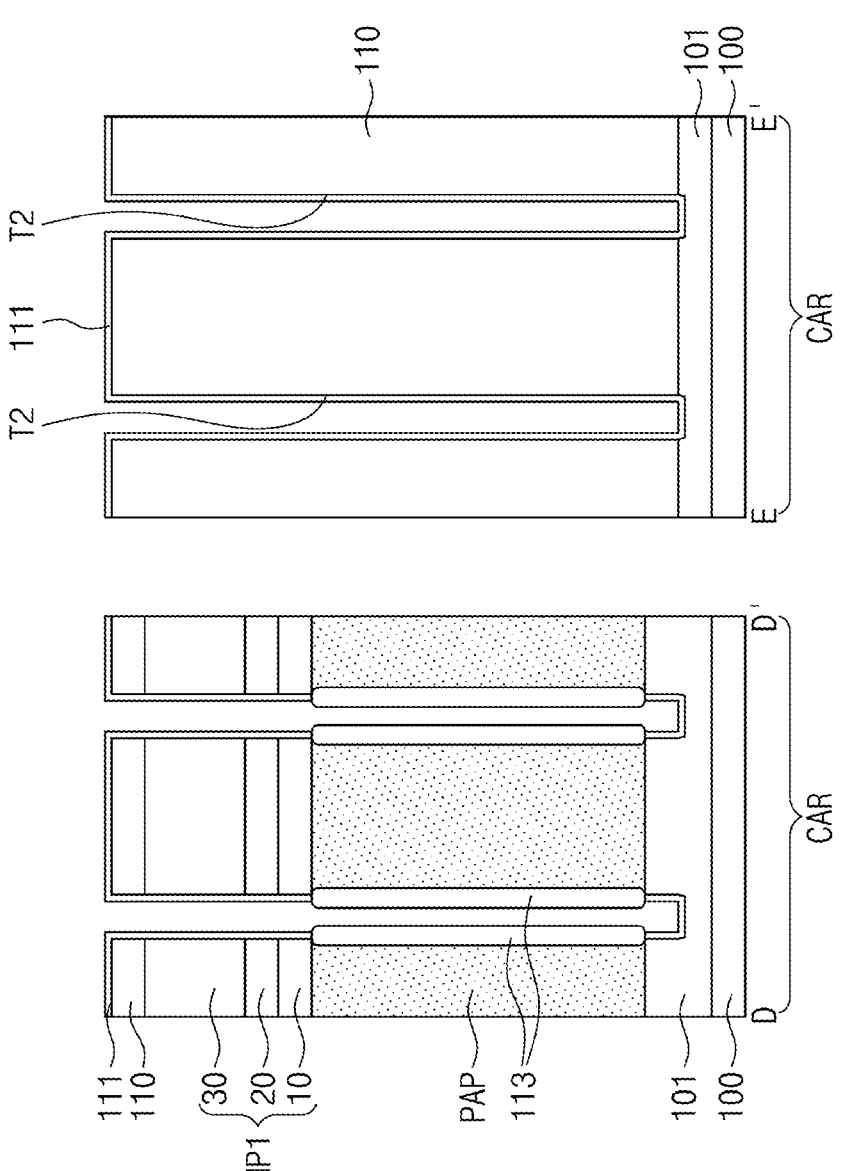
Figure 6C:
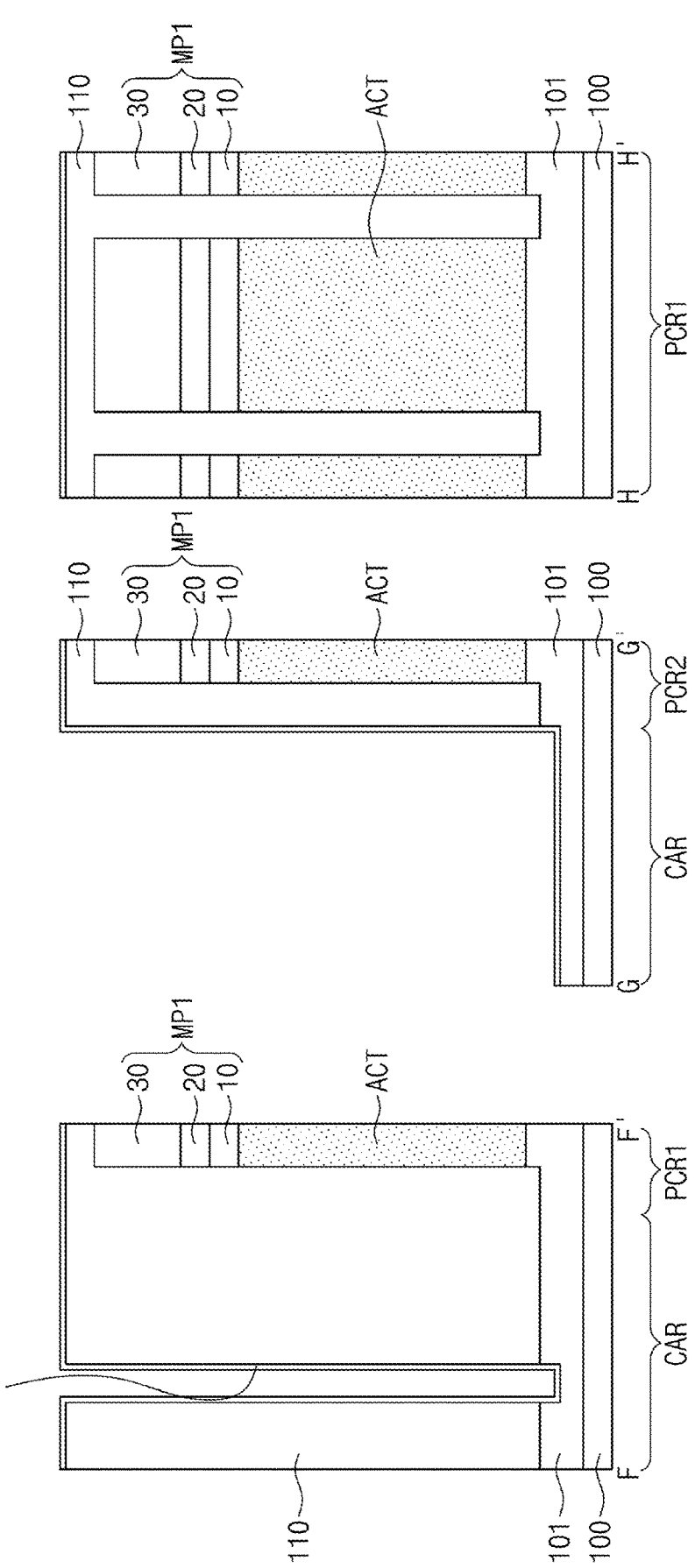

FIG. 1 is a plan view illustrating a semiconductor memory device according to an embodiment. FIGS. 2A, 2B, and 2C are sectional views illustrating semiconductor memory device according to an embodiment. Here, FIG. 2A illustrates cross-sections taken along lines A-A', B-B', and C-C' of FIG. 1, FIG. 2B illustrates cross-sections taken along lines D-D' and E-E' of FIG. 1, and FIG. 2C illustrates cross-sections taken along lines F-F', G-G', and H-H' of FIG. 1. FIG. 3A is an enlarged sectional view illustrating a portion 'P1' of FIG. 2B. FIG. 3B is an enlarged sectional view illustrating a portion 'P2' of FIG. 2C. FIG. 3C is an enlarged sectional view illustrating a portion 'P3' of FIG. 2C.

A semiconductor memory device according to an embodiment may include memory cells, each of which may include a vertical channel transistor (VCT).

Referring to FIGS. 1, 2A, 2B, and 2C, the semiconductor memory device may include a cell array region CAR and first and second peripheral circuit regions PCR1 and PCR2. The cell array region CAR may be adjacent to the first peripheral circuit region PCR1 in a first direction D1 and may be adjacent to the second peripheral circuit region PCR2 in a second direction D2. The first and second directions D1 and D2 may be parallel to a top surface of a substrate 200 and may be perpendicular to each other.

The substrate 200 may be made of one of a semiconductor material (e.g., silicon wafer), an insulating material (e.g., glass), or a semiconductor or conductor covered with an insulating material.

Bit lines BL may extend in the first direction D1 on the substrate 200 of the cell array region CAR. The bit lines BL may be spaced apart from each other in the second direction D2.

Each of the bit lines BL may include a polysilicon pattern 151, a metal silicide pattern 153, a metal pattern 155, and a hard mask pattern 157, which may be sequentially stacked. The polysilicon pattern 151 may be formed of or include doped polysilicon. The metal silicide pattern 153 may be formed of or include metal silicide materials (e.g., titanium silicide, cobalt silicide, or nickel silicide). The metal pattern 155 may be formed of or include at least one of conductive metal nitride materials (e.g., titanium nitride and tantalum nitride) or metallic materials (e.g., tungsten, titanium, and tantalum). The hard mask pattern 157 may be formed of or include at least one of insulating materials (e.g., silicon nitride or silicon oxynitride). In an embodiment, the bit lines BL may include at least one of two- and three-dimensional material. For example, the bit lines BL may be formed of or include a carbon-based two-dimensional material (e.g., graphene), a carbon-based three-dimensional material (e.g., carbon nanotube), or combinations thereof.

In the first and second peripheral circuit regions PCR1 and PCR2, peripheral circuit patterns PP may be disposed on the substrate 200. The peripheral circuit patterns PP may have a same stacking structure as the bit lines BL. In other words, the peripheral circuit patterns PP may include a peripheral poly-silicon pattern 152, a peripheral silicide pattern 154, a peripheral metal pattern 156, and a peripheral hard mask pattern 158, which are sequentially stacked.

A spacer insulating layer 161, a shielding conductive pattern 163, and a capping insulating layer 165 may be disposed between the bit lines BL and the substrate 200.

In detail, the spacer insulating layer 161 may be disposed between the shielding conductive pattern 163 and the bit lines BL. The spacer insulating layer 161 may have a substantially uniform thickness and may cover opposite side surfaces and top surfaces of the bit lines BL. The spacer insulating layer 161 may define gap regions between the bit lines BL. The gap regions of the spacer insulating layer 161 may extend parallel to the bit lines BL and in the first direction D1. The spacer insulating layer 161 may include, for example, a silicon oxide layer, a silicon nitride layer, a silicon oxynitride layer, and/or a low-k dielectric layer.

The spacer insulating layer 161 may extend from the cell array region CAR to the first and second peripheral circuit regions PCR1 and PCR2. The spacer insulating layer 161 may conformally cover the peripheral circuit patterns PP.

The shielding conductive pattern 163 may be disposed between the substrate 200 and the bit lines BL. The shielding conductive pattern 163 may be disposed on the spacer insulating layer 161 to fill gap regions of the spacer insulating layer 161. In other words, the shielding conductive pattern 163 may include line portions that are respectively disposed between an adjacent ones of the bit lines BL.

The shielding conductive pattern 163 may be formed of or include a conductive material and may include an air gap or a void defined therein. The shielding conductive pattern 163 may be formed of or include at least one of metallic materials (e.g., tungsten (W), titanium (Ti), nickel (Ni), or cobalt (Co)). In an embodiment, the shielding conductive pattern 163 may be formed of or include at least one of conductive two-dimensional (2D) materials (e.g., graphene). The shielding conductive pattern 163 may reduce a coupling noise between adjacent ones of the bit lines BL.

The capping insulating layer 165 may be disposed between the shielding conductive pattern 163 and the substrate 200. The capping insulating layer 165 may have a substantially uniform thickness and may cover the shielding conductive pattern 163. The capping insulating layer 165 may include, for example, a silicon oxide layer, a silicon nitride layer, a silicon oxynitride layer, and/or a low-k dielectric layer.

In the first and second peripheral circuit regions PCR1 and PCR2, the capping insulating layer 165 may be in direct contact with the spacer insulating layer 161.

In the first and second peripheral circuit regions PCR1 and PCR2, a planarization insulating layer 170 may cover the capping insulating layer 165.

A first adhesive layer 180 and a second adhesive layer 201 may be disposed between the substrate 200 and the capping insulating layer 165 and between the substrate 200 and the planarization insulating layer 170. The first and second adhesive layers 180 and 201 may be formed of or include an insulating nitride (e.g., silicon carbon nitride).

On each of the bit lines BL, first and second active patterns AP1 and AP2 may be alternately disposed in the first direction D1. In other words, the first and second active patterns AP1 and AP2 may be two-dimensionally arranged in the first and second directions D1 and D2, which are not parallel to each other. The first active patterns AP1 may be spaced apart from each other by a specific distance in the second direction D2. The second active patterns AP2 may be spaced apart from each other by a specific distance in the second direction D2.

In an embodiment, the first and second active patterns AP1 and AP2 may be formed of a single-crystalline semiconductor material. For example, the first and second active patterns AP1 and AP2 may be formed of single-crystalline silicon. In the case where the first and second active patterns AP1 and AP2 are formed of the single-crystalline semiconductor material, it may be possible to reduce a leakage current during an operation of the semiconductor memory device.

Each of the first and second active patterns AP1 and AP2 may have a width in the first direction D1, a length in the second direction D2, and a height in a direction perpendicular to the first and second directions D1 and D2. Each of the first and second active patterns AP1 and AP2 may have a substantially uniform width.

Each of the first and second active patterns AP1 and AP2 may have a first or top surface and a second or bottom surface, which are opposite to each other in a vertical direction, and may have substantially the same width on the first and second surfaces. The second surfaces of the first and second active patterns AP1 and AP2 may be in contact with the bit lines BL.

A width of each of the first and second active patterns AP1 and AP2 in the first direction D1 may range from several nanometers to several tens of nanometers. For example, the width of each of the first and second active patterns AP1 and AP2 may range from 1 nm to 30 nm (in particular, from 1 nm to 10 nm). A length of each of the first and second active patterns AP1 and AP2 in the second direction D2 may be larger than a linewidth of the bit line BL.

Each of the first and second active patterns AP1 and AP2 may have a first side surface and a second side surface that are opposite to each other in the first direction D1. The first side surface of the first active pattern AP1 may be adjacent to a first word line WL1, and the second side surface of the second active pattern AP2 may be adjacent to a second word line WL2.

Each of the first and second active patterns AP1 and AP2 may include a first dopant region adjacent to the bit line BL, a second dopant region adjacent to a contact pattern BC, and a channel region between the first and second dopant regions. The channel regions of the first and second active patterns AP1 and AP2 may be adjacent to the first and second word lines WL1 and WL2. The first and second dopant regions may be dopant-containing regions in the first and second active patterns AP1 and AP2 and may have a dopant concentration that is higher than a dopant concentration in the channel region. During the operation of the semiconductor memory device, the channel regions of the first and second active patterns AP1 and AP2 may be controlled by the first and second word lines WL1 and WL2 and back-gate electrodes BG.

The back-gate electrodes BG may be disposed on the bit lines BL to be spaced apart from each other by a specific distance in the first direction D1. The back-gate electrodes BG may extend in the second direction D2 to cross the bit lines BL.

Each of the back-gate electrodes BG may be disposed between the first and second active patterns AP1 and AP2, which are adjacent to each other in the first direction D1. That is, the first active pattern AP1 may be disposed at a side of each of the back-gate electrodes BG, and the second active pattern AP2 may be disposed at an opposite side of each of the back-gate electrodes BG.

The back-gate electrode BG may have a first or top surface that is close to the contact pattern BC, and a second or bottom surface that is close to the bit line BL. The first and second surfaces of the back-gate electrode BG may be placed at vertical levels that are different from the first and second surfaces of the first and second active patterns AP1 and AP2.

When measured in the vertical direction, the back-gate electrodes BG may have a height that is less than the height of the first and second active patterns AP1 and AP2. In other words, the top surface of the back-gate electrode BG may be lower than the top surfaces of the first and second active patterns AP1 and AP2, and the bottom surface of the back-gate electrode BG may be higher than the bottom surfaces of the first and second active patterns AP1 and AP2.

In an embodiment, the back-gate electrodes BG may be formed of or include at least one of doped polysilicon, conductive metal nitride materials (e.g., titanium nitride and tantalum nitride), metallic materials (e.g., tungsten, titanium, and tantalum), conductive metal silicide materials, or conductive metal oxide materials.

During the operation of the semiconductor memory device, a negative voltage may be applied to the back-gate electrodes BG to increase a threshold voltage of the vertical channel transistor. In this case, it may be possible to prevent a leakage current property of the vertical channel transistor from being deteriorated by a reduction of the threshold voltage of the vertical channel transistor, which may occur when the vertical channel transistor is scaled down.

A first back-gate capping pattern 121 may be disposed on the bottom surface of the back-gate electrode BG, and a second back-gate capping pattern 213 may be disposed on the top surface of the back-gate electrode BG.

The first back-gate capping pattern 121 may be disposed between the bit lines BL and the bottom surface of the back-gate electrode BG. The second back-gate capping pattern 213 may be disposed between the contact patterns BC and the top surface of the back-gate electrode BG. The first and second back-gate capping patterns 121 and 213 may be disposed between the first and second active patterns AP1 and AP2, which are adjacent to each other in the first direction D1.

The first and second back-gate capping patterns 121 and 213 may extend parallel to the back-gate electrodes BG or in the second direction D2. In an embodiment, the first and second back-gate capping patterns 121 and 213 may be formed of or include at least one of silicon oxide, silicon oxynitride, or silicon nitride.

The first back-gate capping pattern 121 may be in contact with the polysilicon patterns 151 of the bit lines BL. A thickness of the first back-gate capping pattern 121 between the bit lines BL may be different from a thickness of the first back-gate capping pattern 121 on the bit lines BL.

Each of the first and second back-gate capping patterns 121 and 213 may have a seam or void that is formed therein and that extends in the second direction D2.

A liner insulating layer 111 and a back-gate insulating layer 113 may be disposed on opposite side surfaces of the back-gate electrode BG. The liner insulating layer 111 may be disposed between the opposite side surfaces of the back-gate electrode BG and side surfaces of a first separation insulating patterns 115. The back-gate insulating layer 113 may be disposed between the opposite side surfaces of the back-gate electrode BG and the side surfaces of the first and second active patterns AP1 and AP2. The back-gate insulating layer 113 may be thicker than the liner insulating layer 111. The liner insulating layer 111 and the back-gate insulating layer 113 may be formed of or include silicon oxide.

The first separation insulating patterns 115 may be disposed between the first active patterns AP1 and between the second active patterns AP2, which are adjacent to each other in the second direction D2. Second separation insulating patterns 139 may be disposed between the first and second word lines WL1 and WL2, which face each other. The second separation insulating patterns 139 may extend in the second direction D2. The first and second separation insulating patterns 115 and 139 may be formed of or include silicon oxide. Top surfaces of the first and second separation insulating patterns 115 and 139 may be substantially coplanar with the top surfaces of the first and second active patterns AP1 and AP2.

The first and second word lines WL1 and WL2 may extend in the first direction D1 on the bit lines BL and may be alternatively arranged in the second direction D2.

The first word line WL1 may be disposed at a side of the first active pattern AP1, and the second word line WL2 may be disposed at an opposite side of the second active pattern AP2. The first and second word lines WL1 and WL2 may be vertically spaced apart from the bit lines BL and the contact patterns BC. In other words, the first and second word lines WL1 and WL2 may be placed between the bit lines BL and the contact patterns BC, when viewed in a vertical view.

Each of the first and second word lines WL1 and WL2 may have a width in the second direction D2. The width on the bit line BL may be different from the width on a shielding conductive pattern 173. Portions of the first word lines WL1 may be disposed between the first active patterns AP1, which are adjacent to each other in the first direction D1, and portions of the second word lines WL2 may be disposed between the second active patterns AP2, which are adjacent to each other in the first direction D1.

In an embodiment, the first and second word lines WL1 and WL2 may be formed of or include at least one of doped polysilicon, metallic materials, conductive metal nitride materials, conductive metal silicide materials, conductive metal oxide materials, or combinations thereof.

Adjacent ones of the first and second word lines WL1 and WL2 may have side surfaces that face each other. Each of the first and second word lines WL1 and WL2 may have a first surface that is close to the bit line BL, and a second surface that is close to the contact pattern BC.

The first surfaces of the first and second word lines WL1 and WL2 may have various shapes. In an embodiment, each of the first and second word lines WL1 and WL2 may have an L-shaped section.

The first and second word lines WL1 and WL2 may have a height that is smaller than the height of the first and second active patterns AP1 and AP2, when measured in the vertical direction. The first and second word lines WL1 and WL2 may be located at a level lower than the top surfaces of the first and second active patterns AP1 and AP2. The height of the first and second word lines WL1 and WL2 may be equal to or smaller than the height of the back-gate electrodes BG, when measured in the vertical direction.

Referring to FIG. 3A, top surfaces of the first and second word lines WL1 and WL2 may be located at substantially the same level as the top surface of the back-gate electrode BG. In some implementations, the top surfaces of the first and second word lines WL1 and WL2 may be located at a vertical level that is different from the top surface of the back-gate electrode BG, when measured from the substrate 200.

First gate insulating patterns 131 may be disposed between the first separation insulating patterns 115 and the first and second word lines WL1 and WL2. Second gate insulating patterns 133 may be disposed between the first and second word lines WL1 and WL2 and the first and second active patterns AP1 and AP2. The second gate insulating patterns 133 may be thicker than the first gate insulating patterns 131. The second gate insulating pattern 133 may cover the first side surface of the first active pattern AP1 and may cover the second side surface of the second active pattern AP2. The second gate insulating pattern 133 may have a substantially uniform thickness.

The first and second gate insulating patterns 131 and 133 may be formed of or include at least one of silicon oxide, silicon oxynitride, or high-k dielectric materials having dielectric constants higher than silicon oxide. The high-k dielectric materials may include metal oxide materials or metal oxynitride materials. For example, the high-k dielectric materials for the first and second gate insulating patterns 131 and 133 may include $HfO_2$, HfSiO, HfSiON, HfTaO, HfTiO, HfZrO, $ZrO_2$, $Al_2O_3$, or combinations thereof, as examples.

First gate capping patterns 141 may be disposed between the first and second word lines WL1 and WL2 and the bit lines BL. Second gate capping patterns 211 may be disposed between the first and second word lines WL1 and WL2 and the contact patterns BC. The first and second gate capping patterns 141 and 211 may be disposed between the second gate insulating patterns 133 and the second separation insulating patterns 139.

The first gate capping patterns 141 may be in contact with the polysilicon patterns 151 of the bit lines BL. The second gate capping patterns 211 may be in contact with portions of the contact patterns BC.

Each of the first gate capping patterns 141 may have a seam that is spaced apart from the first and second word lines WL1 and WL2 and is adjacent to the bit lines BL. In other words, the seam in the first gate capping pattern 141 may be formed in the same direction as the seam in the second back-gate capping pattern 123 The seam may be located at substantially the same vertical level as the substrate 200.

The first and second gate capping patterns 141 and 211 may extend parallel to the first and second word lines WL1 and WL2 and in the first direction D1. In an embodiment, the first and second gate capping patterns 141 and 211 may be formed of silicon nitride.

According to an embodiment, a peripheral active pattern ACT may be disposed on the substrate 200 and in the first and second peripheral circuit regions PCR1 and PCR2. The peripheral active pattern ACT may be formed of or include the same single-crystalline semiconductor material as the first and second active patterns AP1 and AP2 in the cell array region CAR. The peripheral active pattern ACT may have a bottom surface that is adjacent to the substrate 200, and a top surface that is opposite to the bottom surface.

The peripheral circuit patterns PP may be disposed on a bottom surface of the peripheral active pattern ACT.

A top surface of the peripheral active pattern ACT may be substantially coplanar with the top surfaces of the first and second active patterns AP1 and AP2. The bottom surface of the peripheral active pattern ACT may be substantially coplanar with the bottom surfaces of the first and second active patterns AP1 and AP2.

A device isolation layer STI may be disposed on the substrate 200 in the first and second peripheral circuit regions PCR1 and PCR2 to penetrate or enclose the peripheral active pattern ACT.

Peripheral circuit transistors may be provided on the top surface of the peripheral active pattern ACT. In an embodiment, the peripheral transistors may constitute row and column decoders, sense amplifiers, or control logics.

In detail, a peripheral gate electrode PG may be disposed on the top surface of the peripheral active pattern ACT. The peripheral gate electrode PG may include a peripheral gate insulating layer 231, a peripheral conductive pattern 233, a peripheral metal pattern 235, and a peripheral mask pattern 237.

Impurity regions SD that are doped with impurities may be provided in portions of the peripheral active pattern ACT that are located at both sides of the peripheral gate electrode PG.

In the cell array region CAR, first and second etch stop layers 221 and 223 may cover the second surfaces of the first and second active patterns AP1 and AP2. The first and second etch stop layers 221 and 223 may be sequentially stacked on the top surfaces of the second gate capping patterns 211, the top surfaces of the second back-gate capping patterns 123, and the top surfaces of the first and second separation insulating patterns 115 and 139. The first and second etch stop layers 221 and 223 may be formed of different insulating materials from each other. In an embodiment, the first etch stop layer 221 may be formed of silicon oxide, and the second etch stop layer 223 may be formed of silicon nitride.

In the cell array region CAR, a third etch stop layer 241 may cover the top surface of the second etch stop layer 223. The third etch stop layer 241 may be provided to have a uniform thickness and may extend continuously from the cell array region CAR to the first and second peripheral circuit regions PCR1 and PCR2 to cover the peripheral active patterns ACT. The third etch stop layer 241 may cover the top surfaces of the peripheral active patterns ACT and the peripheral gate electrode PG with a uniform thickness. In an embodiment, the third etch stop layer 241 may be formed of silicon nitride.

In the cell array region CAR, a first interlayer insulating pattern 243 may be disposed on the third etch stop layer 241. A top surface of the first interlayer insulating pattern 243 may be located at a level that is higher than a top surface of the peripheral gate electrode PG. The first interlayer insulating pattern 243 may be formed of an insulating material that is different from the third etch stop layer 241. The first interlayer insulating pattern 243 may include, for example, a silicon oxide layer, a silicon nitride layer, a silicon oxynitride layer, and/or a low-k dielectric layer.

A fourth etch stop layer 251 may cover the cell array region CAR and the first and second peripheral circuit regions PCR1 and PCR2 and may have a substantially uniform thickness.

The fourth etch stop layer 251 may cover the first interlayer insulating pattern conformally 243 in the cell array region CAR and may cover the third etch stop layer 241 conformally in the first and second peripheral circuit regions PCR1 and PCR2. The fourth etch stop layer 251 may be in direct contact with the third etch stop layer 241.

The fourth etch stop layer 251 may be formed of an insulating material different from the first interlayer insulating pattern 243. The fourth etch stop layer 251 may be formed of an insulating material that is the same as or different from the third etch stop layer 241.

A second interlayer insulating pattern 253 may be disposed on the fourth etch stop layer 251 and in the first and second peripheral circuit regions PCR1 and PCR2. The second interlayer insulating pattern 253 may be formed of an insulating material that is different from the fourth etch stop layer 251. The second interlayer insulating pattern 253 may include, for example, a silicon oxide layer, a silicon nitride layer, a silicon oxynitride layer, and/or a low-k dielectric layer.

In the cell array region CAR, the top surface of the second interlayer insulating pattern 253 may be located at substantially the same level as the top surface of the fourth etch stop layer 251. In the first and second peripheral circuit regions PCR1 and PCR2, the top surface of the second interlayer insulating pattern 253 may be located at substantially the same level as the uppermost surface of the fourth etch stop layer 251.

A fifth etch stop layer 255 may cover the cell array region CAR and the first and second peripheral circuit regions PCR1 and PCR2 and may have a substantially uniform thickness.

The fifth etch stop layer 255 may cover the top surface of the fourth etch stop layer 251 in the cell array region CAR and may cover the top surface of the second interlayer insulating pattern 253 in the first and second peripheral circuit regions PCR1 and PCR2. Also, the fifth etch stop layer 255 may cover a portion of the fourth etch stop layer 251 in the first and second peripheral circuit regions PCR1 and PCR2.

The contact patterns BC may be provided in the cell array region CAR to penetrate the fourth etch stop layer 251, the first interlayer insulating pattern 243, the third etch stop layer 241, and the first and second etch stop layers 221 and 223. The contact patterns BC may be coupled to the first and second active patterns AP1 and AP2, respectively. For example, the contact patterns BC may be coupled to the second dopant regions of the first and second active patterns AP1 and AP2, respectively. A lower width of the contact pattern BC may be larger than an upper width thereof. Adjacent ones of the contact patterns BC may be spaced apart from each other by separation insulating patterns 245. Each of the contact patterns BC may have one of various shapes (e.g., circular, elliptical, rectangular, square, rhombic, and hexagonal shapes), when viewed in a plan view.

The contact patterns BC may be formed of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to this example.

In the first and second peripheral circuit regions PCR1 and PCR2, peripheral contact plugs PCP may be coupled to the peripheral transistors. The peripheral contact plugs PCP may be provided to penetrate the second interlayer insulating pattern 253, the fourth etch stop layer 251, and the third etch stop layer 241 and may be connected to the source/drain impurity regions SD in the peripheral active pattern ACT.

In the cell array region CAR, landing pads LP may be disposed in the fifth etch stop layer 255. The landing pads LP may be connected to the contact patterns BC, respectively.

Each of the landing pads LP may have one of various shapes (e.g., circular, elliptical, rectangular, square, rhombic, and hexagonal shapes), when viewed in a plan view. The landing pads LP may be arranged in the first and second directions D1 and D2 or in a matrix shape, when viewed in a plan view. The landing pads LP may be provided to have top surfaces that are substantially coplanar with top surfaces of the separation insulating patterns 245.

The landing pads LP may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, as examples.

Peripheral interconnection lines PCL may be disposed in the fifth etch stop layer 255 and may be connected to the peripheral contact plugs PCP.

In the cell array region CAR, data storage patterns DSP may be disposed on the landing pads LP, respectively. The data storage patterns DSP may be electrically connected to the first and second active patterns AP1 and AP2, respectively. The data storage patterns DSP may be arranged in the first and second directions D1 and D2 or in a matrix shape. The data storage patterns DSP may be fully or partially overlapped with the landing pads LP. Each of the data storage patterns DSP may be in contact with the entire or partial region of the top surface of a corresponding one of the landing pads LP.

In an embodiment, the data storage patterns DSP may be capacitors and may include storage electrodes 261, a plate electrode 265, and a capacitor dielectric layer 263, which is interposed between the storage electrodes 261 and the plate electrode 265. In this case, the storage electrode 261 may be in contact with the landing pad LP and may have one of various shapes (e.g., circular, elliptical, rectangular, square, rhombic, and hexagonal shapes), when viewed in a plan view.

In some implementations, the data storage pattern DSP may be a variable resistance pattern whose resistance can be switched to one of at least two states by an electric pulse applied thereto. For example, the data storage pattern DSP may be formed of or include at least one of phase-change materials whose crystal state can be changed depending on an amount of a current applied thereto. Examples thereof may include perovskite compounds, transition metal oxides, magnetic materials, ferromagnetic materials, or antiferromagnetic materials.

A peripheral circuit insulating layer 267 may be disposed in the first and second peripheral circuit regions PCR1 and PCR2 and on the fifth etch stop layer 255. The peripheral circuit insulating layer 267 may have a top surface that is substantially coplanar with a top surface of the plate electrode 265.

An upper insulating layer 270 may be disposed on the data storage patterns DSP. The upper insulating layer 270 may cover a top surface of the plate electrode 265 and a top surface of the peripheral circuit insulating layer 267.

FIGS. 4A to 16A, 4B to 16B, and 4C to 16C are sectional views illustrating a method of fabricating a semiconductor memory device according to an embodiment. Here, FIGS. 6A to 20A illustrate cross-sections taken along the lines A-A', B-B', and C-C' of FIG. 1, FIGS. 6B to 20B illustrate cross-sections taken along the lines D-D' and E-E' of FIG. 1, and FIGS. 6C to 20C illustrate cross-sections taken along the lines F-F', G-G', and H-H' of FIG. 1.

Referring to FIGS. 1, 4A, 4B, and 4C, a first substrate structure including a first substrate 100, a buried insulating layer 101, and an active layer AL may be prepared.

The buried insulating layer 101 and the active layer AL may be provided on the first substrate 100. The first substrate 100, the buried insulating layer 101, and the active layer AL may constitute a silicon-on-insulator (SOI) substrate.

In an embodiment, the first substrate 100 may be a silicon substrate, a germanium substrate, and/or a silicon-germanium substrate. The first substrate 100 may include a cell array region CAR, a first peripheral circuit region PCR1, which is adjacent to the cell array region CAR in a first direction D1, and a second peripheral circuit region PCR2, which is adjacent to the cell array region CAR in a second direction D2. Here, the first and second directions D1 and D2 may be parallel to a top surface of the first substrate 100. In some implementations, the first and second directions D1 and D2 may not be parallel to each other.

The buried insulating layer 101 may be a buried oxide (BOX) layer, which is formed by a separation-by-implanted oxygen (SIMOX) method or by a bonding and layer-transfer method. In some implementations, the buried insulating layer 101 may be an insulating layer that is formed by a chemical vapor deposition method. The buried insulating layer 101 may include, for example, a silicon oxide layer, a silicon nitride layer, a silicon oxynitride layer, and/or a low-k dielectric layer.

The active layer AL may be a single-crystalline semiconductor layer. The active layer AL may be, for example, a single-crystalline silicon substrate, a germanium substrate, and/or a silicon-germanium substrate. The active layer AL may have a first surface and a second surface that are opposite to each other. The second surface may be in contact with the buried insulating layer 101.

A first mask pattern MP1 may be formed on the first surface of the active layer AL. The first mask pattern MP1 may have line-shaped openings, which extend from the cell array region CAR in the first direction D1.

The first mask pattern MP1 may include a first mask layer 10, a second mask layer 20, and a third mask layer 30, which are sequentially stacked. Here, the third mask layer 30 may be formed of or include a material having an etch selectivity with respect to the second mask layer 20. The first mask layer 10 may be formed of or include a material having an etch selectivity with respect to the second mask layer 20. In an embodiment, the first and third mask layers 10 and 30 may be formed of or include silicon oxide, and the second mask layer 20 may be formed of or include silicon nitride.

Thereafter, the active layer AL in the cell array region CAR may be anisotropically etched using the first mask pattern MP1 as an etch mask. Accordingly, first trenches T1, which extend in the first direction D1, may be formed in the active layer AL in the cell array region CAR. The first trenches T1 may be formed to expose the buried insulating layer 101 and may be spaced apart from each other in the second direction D2 by a specific distance. As a result of the formation of the first trenches T1, the active layer AL may be divided into a plurality of line patterns that extend in the first direction D1.

In an embodiment, the active layer AL in the cell array region CAR may be doped with n- or p-type impurities by performing a doping process, such as a gas phase doping (GPD) process or a plasma doping (PLAD) process, through the first trenches T1.

Furthermore, peripheral active patterns ACT may be formed in the first and second peripheral circuit regions PCR1 and PCR2 when the first trenches T1 are formed.

Referring to FIGS. 1, 5A, 5B, and 5C, after the formation of the first trenches T1, a separation insulating layer 110 may be formed to fill the first trenches T1.

The separation insulating layer 110 may be formed of an insulating material (e.g., silicon oxide or silicon nitride). The separation insulating layer 110 may be formed by at least one of low-pressure chemical vapor deposition (LP-CVD), plasma-enhanced chemical vapor deposition (PE-CVD), and atomic layer deposition (ALD) techniques. In the case where the separation insulating layer 110 is formed using the deposition technique, the separation insulating layer 110 may have a discontinuous interface (e.g., seam or void), which may be formed in in the first trench T1 and may extend in the first direction D1.

Thereafter, a mask pattern (not shown) may be formed on the separation insulating layer 110 to cross the first trenches T1. Then, second trenches T2 that extend in the second direction D2, may be formed by patterning the separation insulating layer 110, the first mask pattern MP1, and the active layer AL using the mask pattern. The second trenches T2 may be formed to expose the buried insulating layer 101. The second trenches T2 may be spaced apart from each other in the first direction D1 by a specific distance. A top surface of the buried insulating layer 101 may be recessed when the second trenches T2 are formed. As a result of the formation of the second trenches T2, preliminary active patterns PAP, which are spaced apart from each other in the first and second directions D1 and D2, may be formed.

In an embodiment, after the formation of the preliminary active patterns PAP, the preliminary active patterns PAP, which are exposed through inner surfaces of the second trenches T2, may be doped with impurities by performing a GPD or PLAD process.

Next, referring to FIGS. 1, 6A, 6B, and 6C, a liner insulating layer 111 may be formed to conformally cover the inner surfaces of the second trenches T2.

The liner insulating layer 111 may be formed by at least one of low-pressure chemical vapor deposition (LP-CVD), plasma-enhanced chemical vapor deposition (PE-CVD), and atomic layer deposition (ALD) techniques. Accordingly, the liner insulating layer 111 of a substantially uniform thickness may be formed on a top surface of the separation insulating layer 110, a side surface of the separation insulating layer 110 exposed by the second trench T2, and a top surface of the buried insulating layer 101 exposed by the second trench T2. In an embodiment, the liner insulating layer 111 may be formed of or include silicon oxide. In some implementations, the liner insulating layer 111 may be formed of or include at least one of high-k dielectric materials (e.g., hafnium oxide and zirconium oxide).

In an embodiment, a thermal oxidation process may be performed before the formation of the liner insulating layer 111. In this case, a back-gate insulating layer 113 may be formed on side surfaces of the preliminary active patterns PAP exposed by the second trenches T2. The back-gate insulating layer 113 may be formed of silicon oxide. The back-gate insulating layer 113 may be thicker than the liner insulating layer 111. The back-gate insulating layer 113 may be formed of silicon oxide.

Referring to FIGS. 1, 7A, 7B, and 7C, a first gate conductive layer 120 may be formed in the second trench T2, in which the liner insulating layer 111 and the back-gate insulating layer 113 are formed.

The formation of the first gate conductive layer 120 may include depositing a conductive layer to fill the second trenches T2 and performing an isotropic etching process to partially etch the conductive layer. Accordingly, the first gate conductive layer 120 may be formed to fill lower portions of the second trenches T2 with the liner insulating layer 111 and the back-gate insulating layer 113. The first gate conductive layer 120 may have a top surface that is located at a level lower than top surfaces of the preliminary active patterns PAP, when measured from the top surface of the first substrate 100.

Referring to FIGS. 1, 8A, 8B, and 8C, after the formation of the first gate conductive layer 120, a first back-gate capping pattern 121 may be formed in the second trench T2.

Figure 7A:
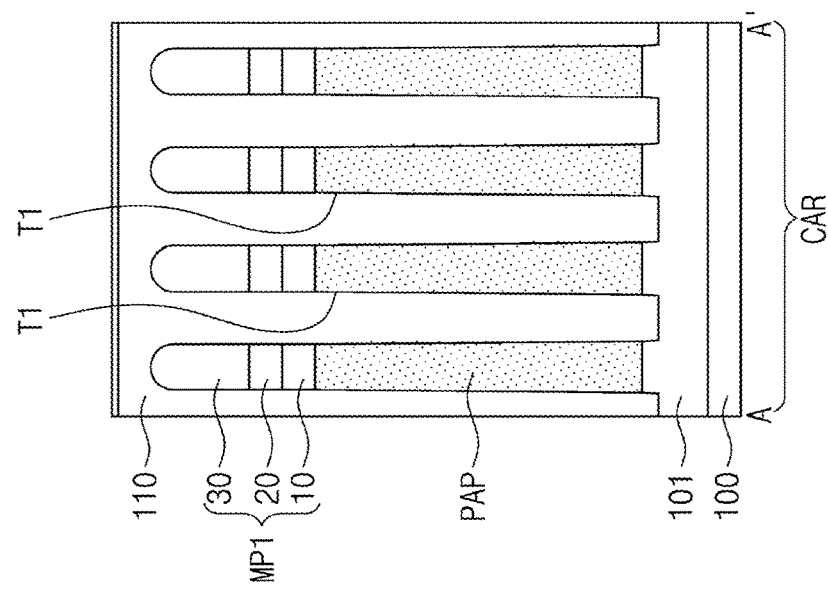
Figure 7B:
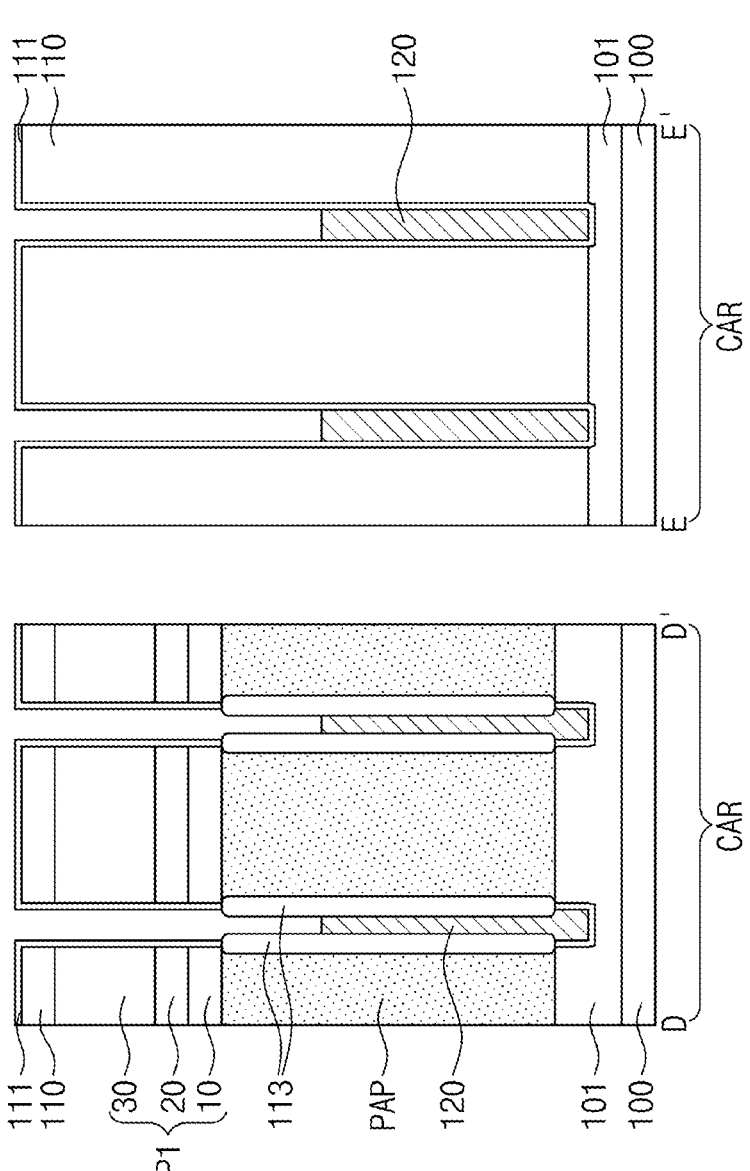
Figure 7C:
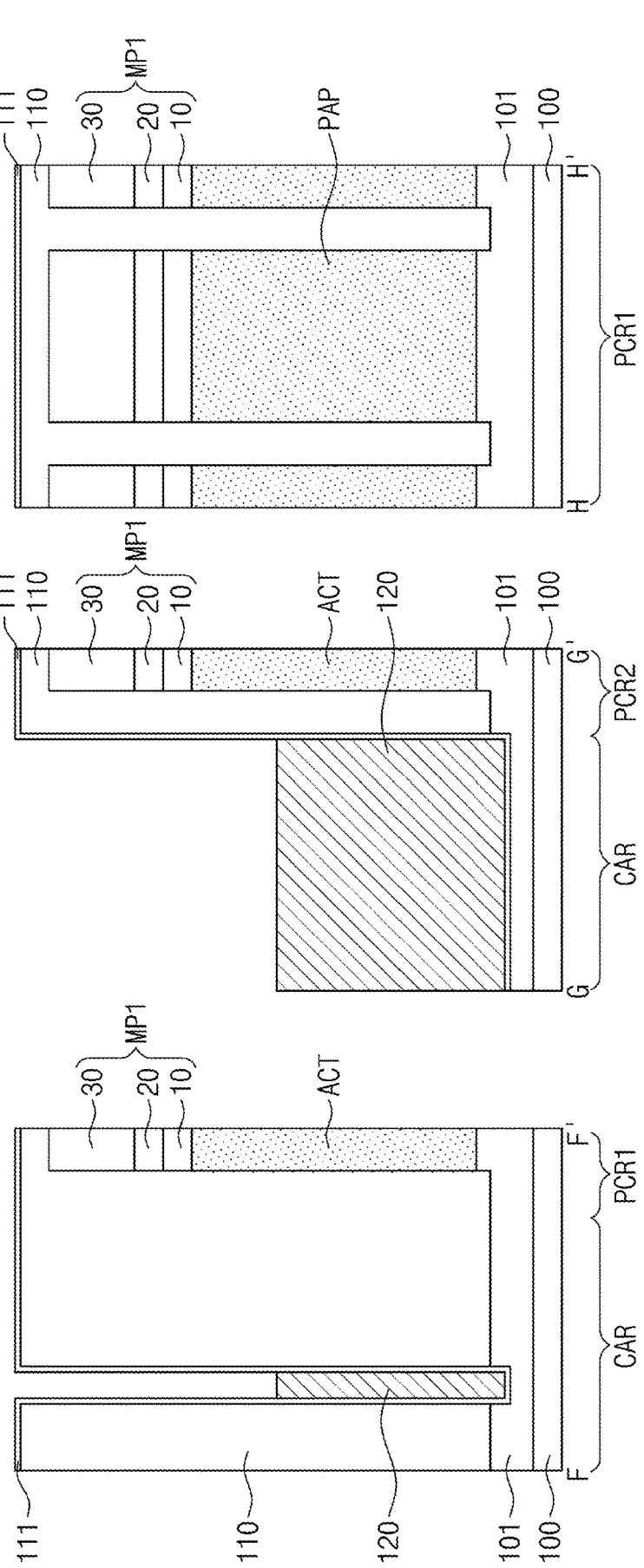
Figure 8A:
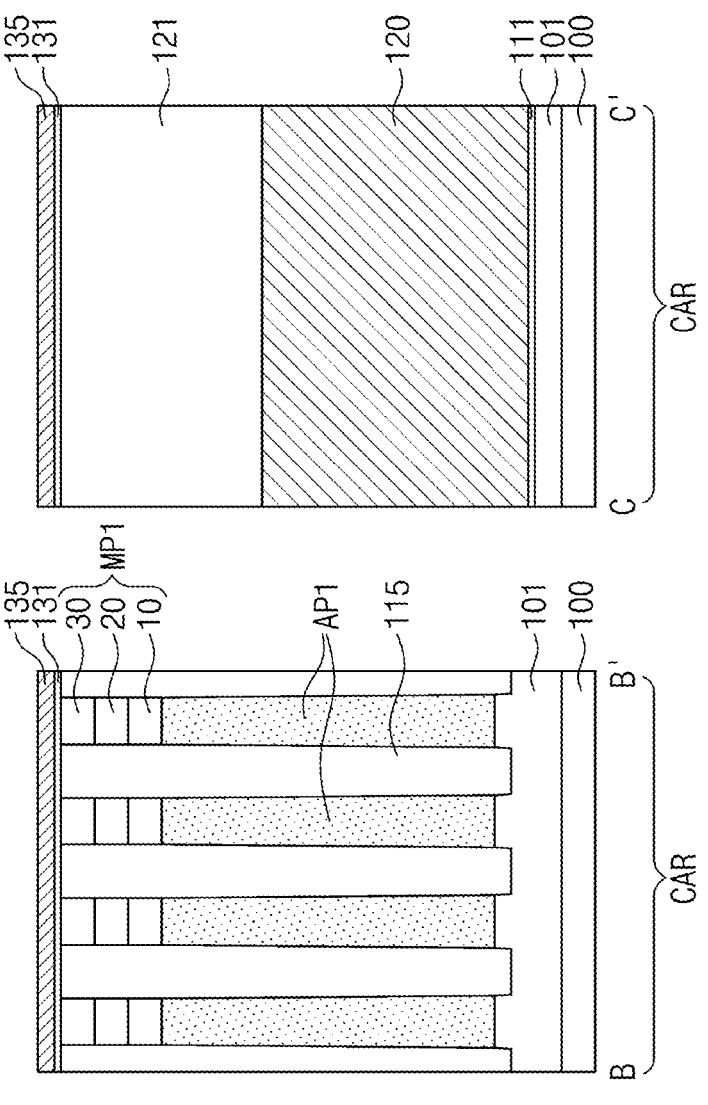
Figure 8A:
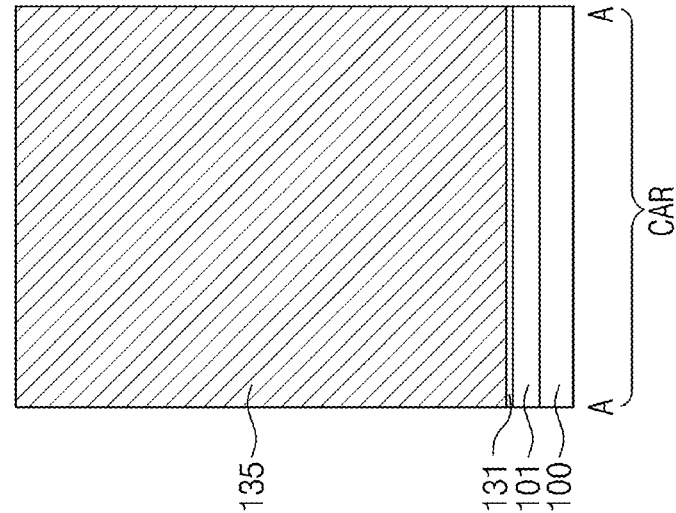
Figure 8B:
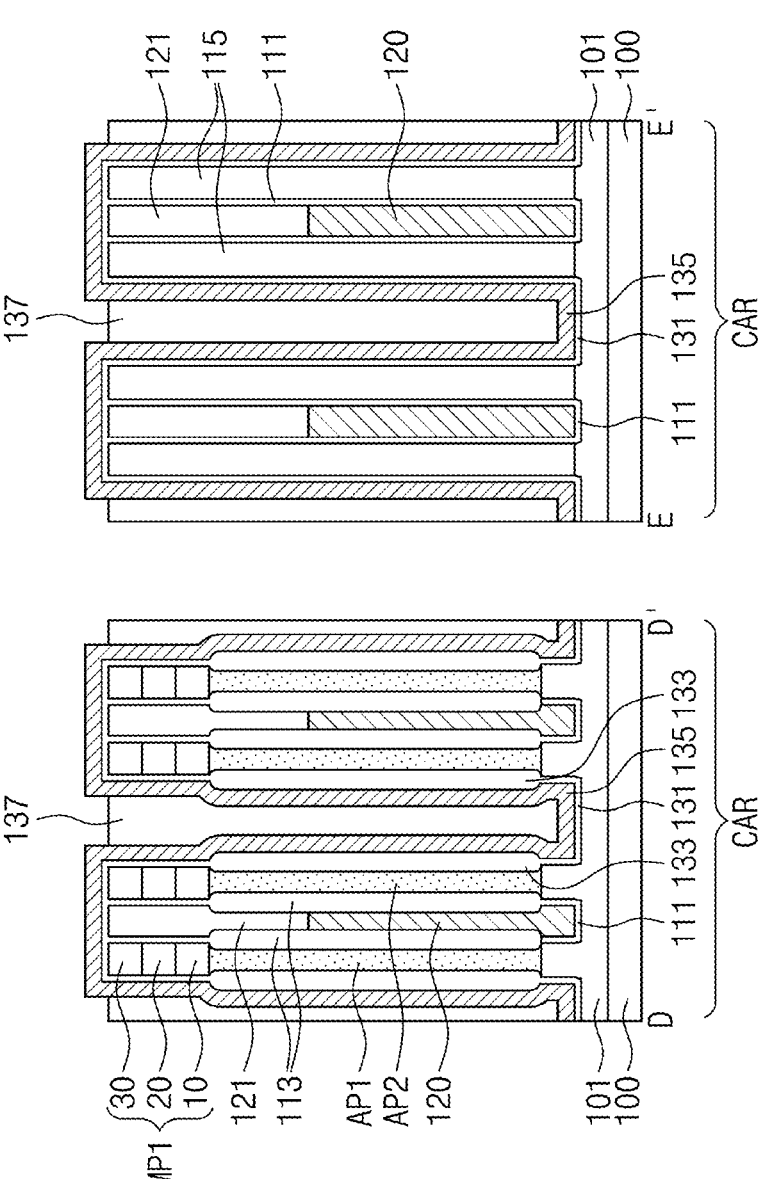
Figure 8C:
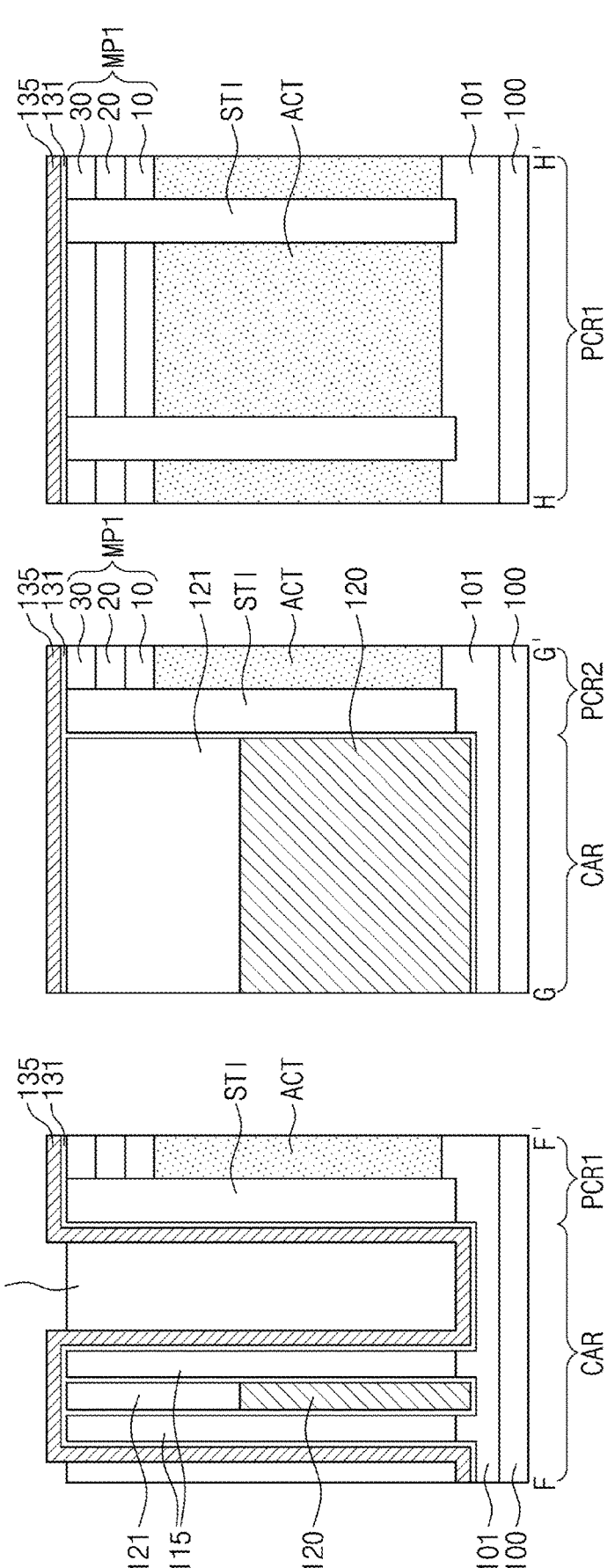
Figure 9A:
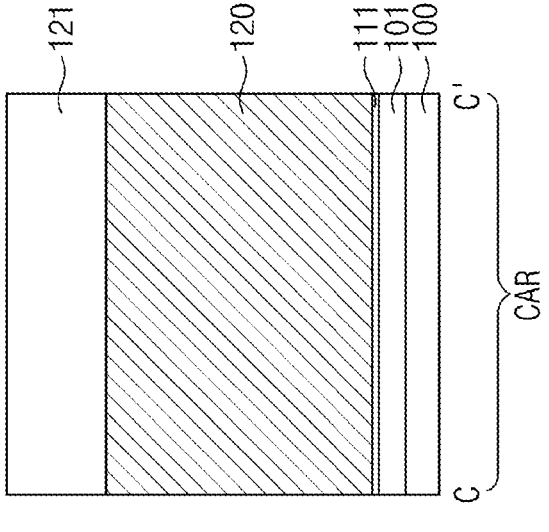
Figure 9A:
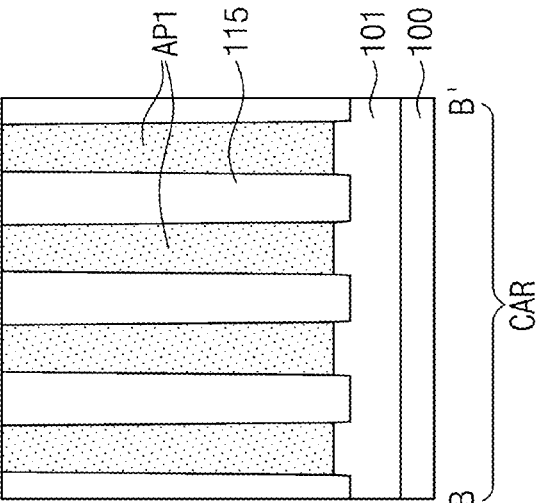
Figure 9A:
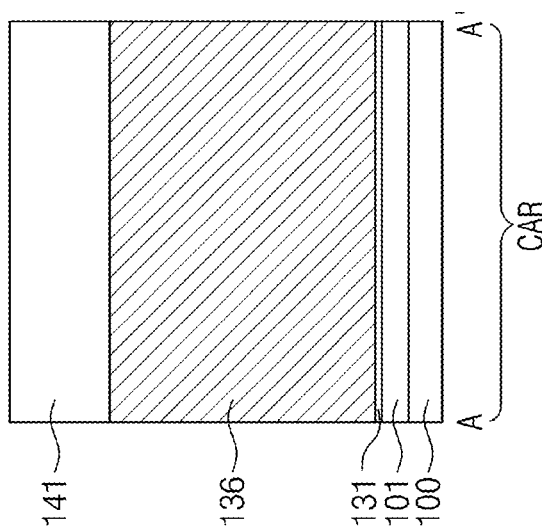
Figure 9B:
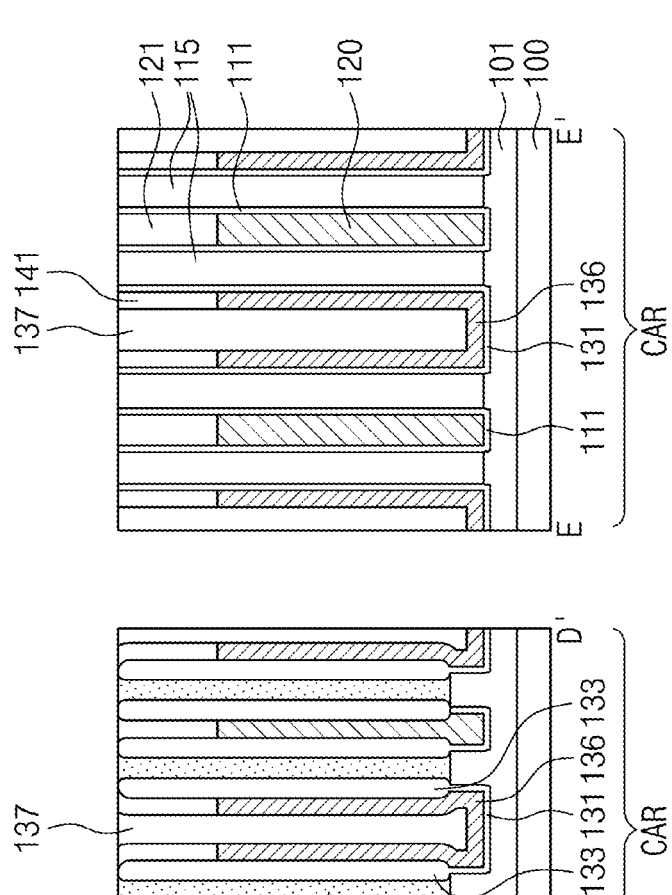
Figure 9C:
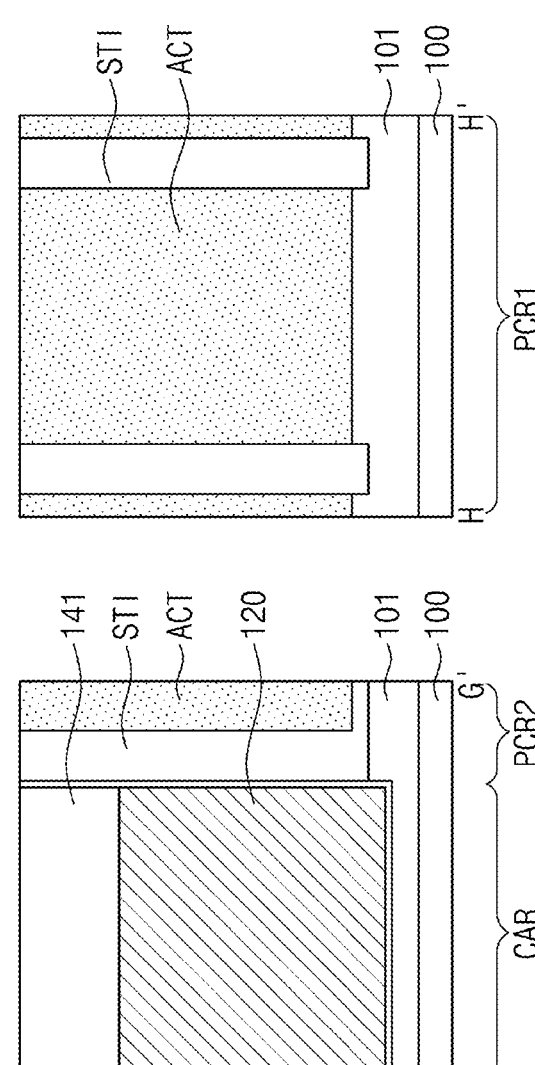
Figure 9C:
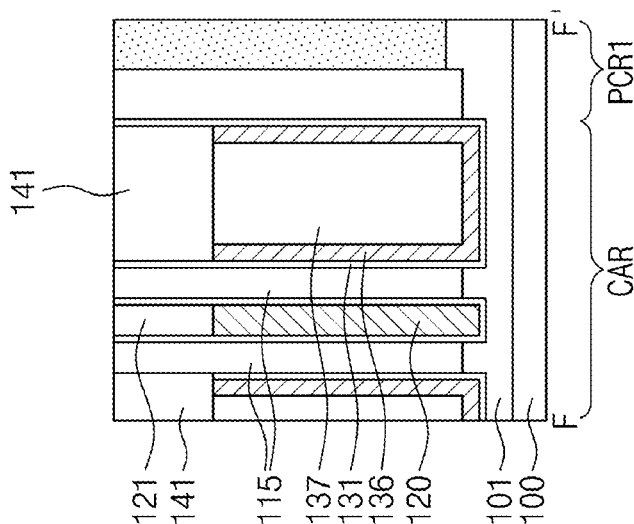
Figure 10A:
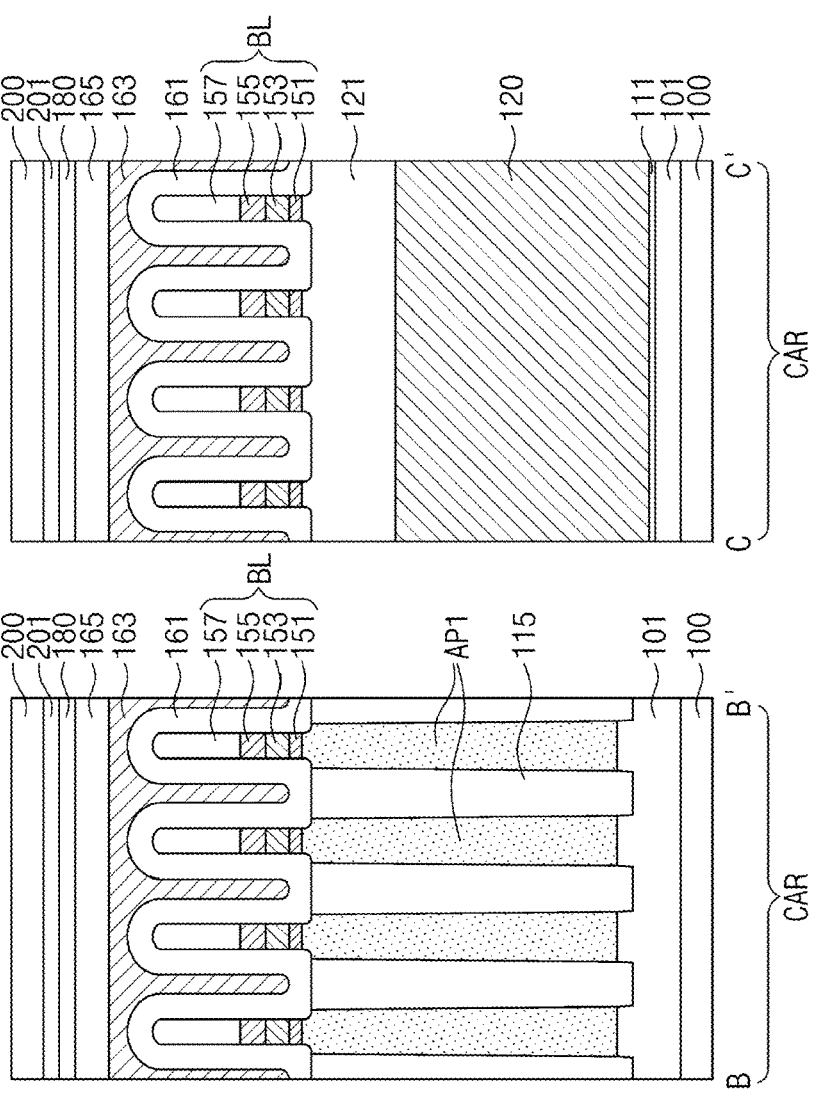
Figure 10A:
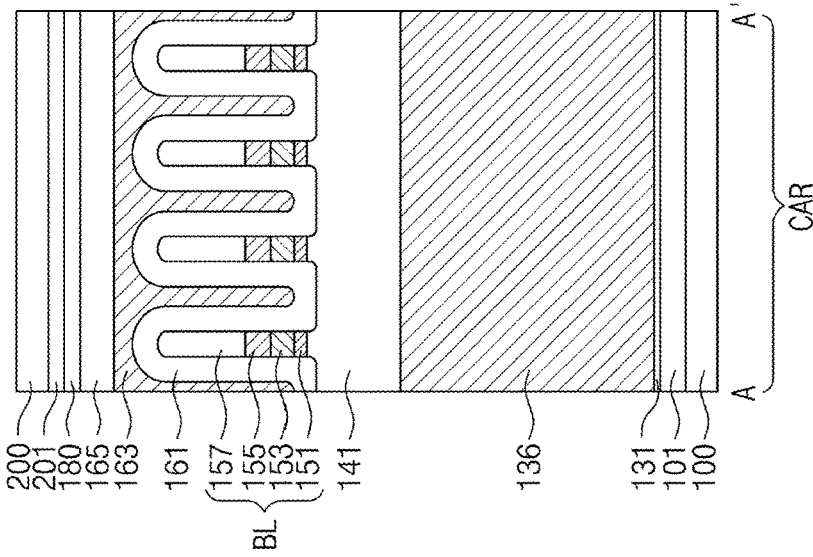
Figure 10B:
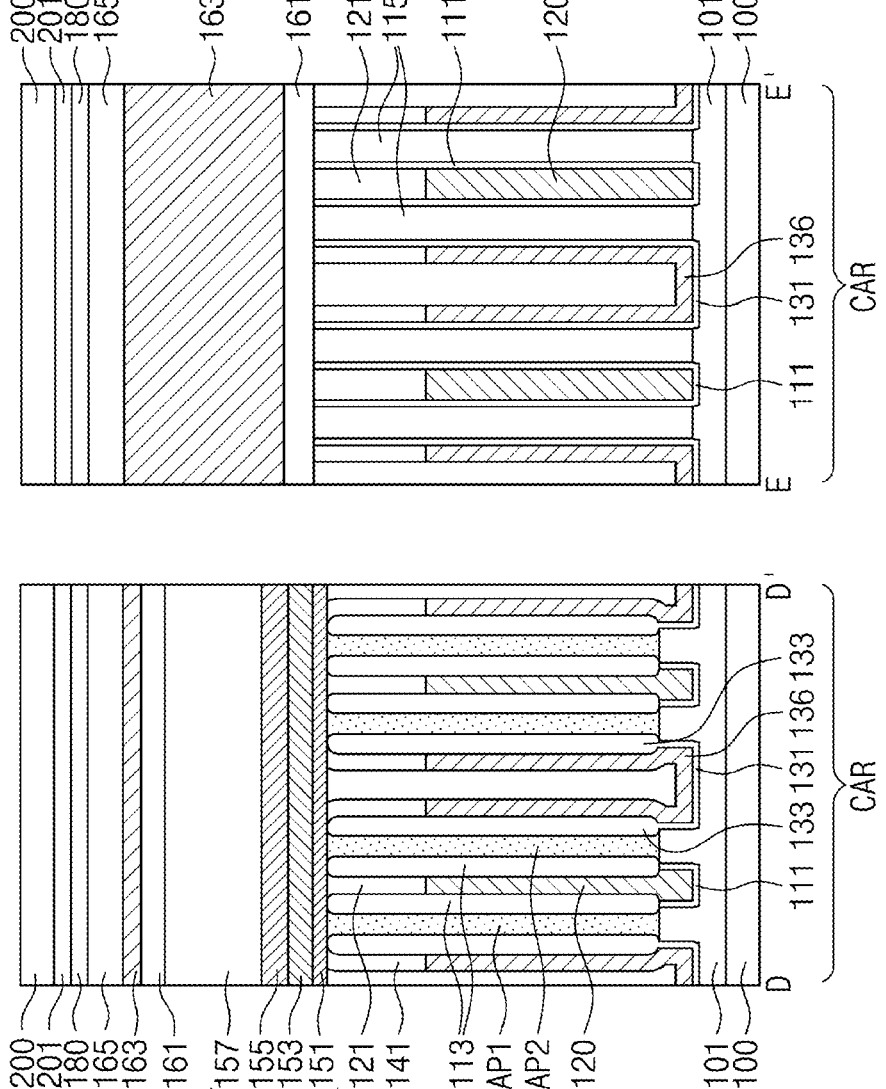
Figure 10C:
Figure 11A:
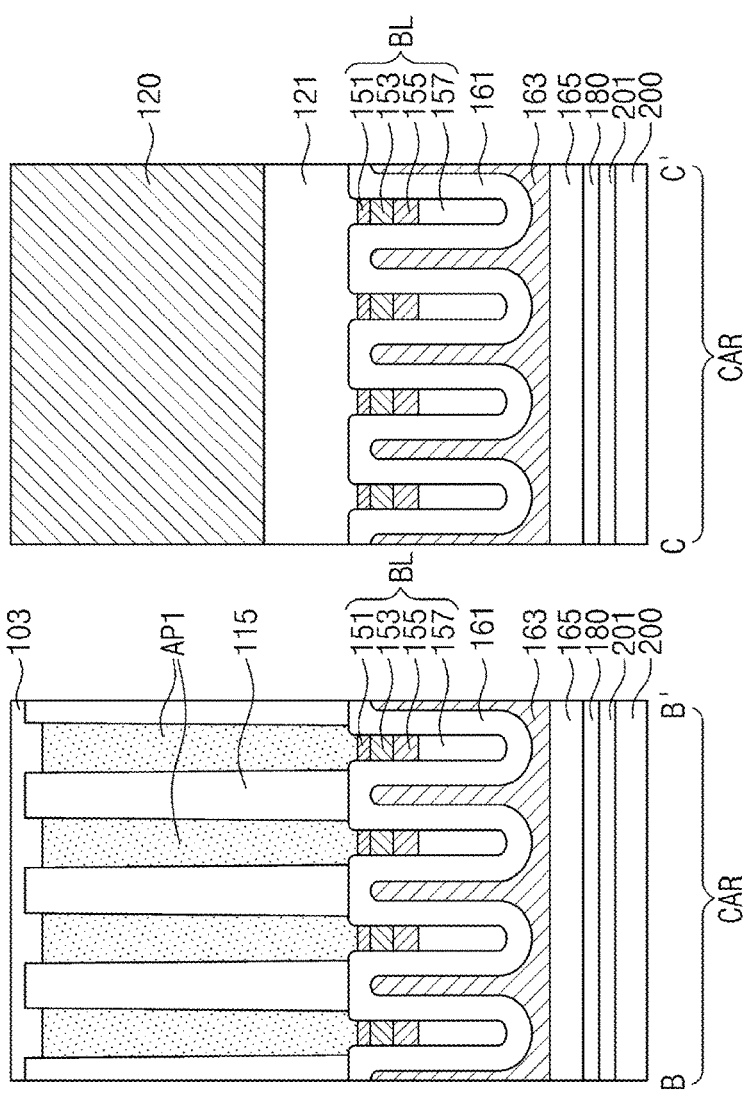
Figure 11A:
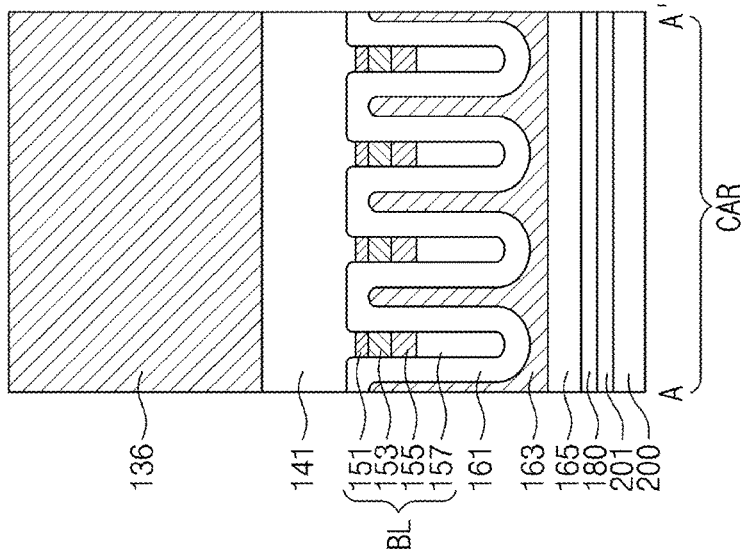
Figure 11B:
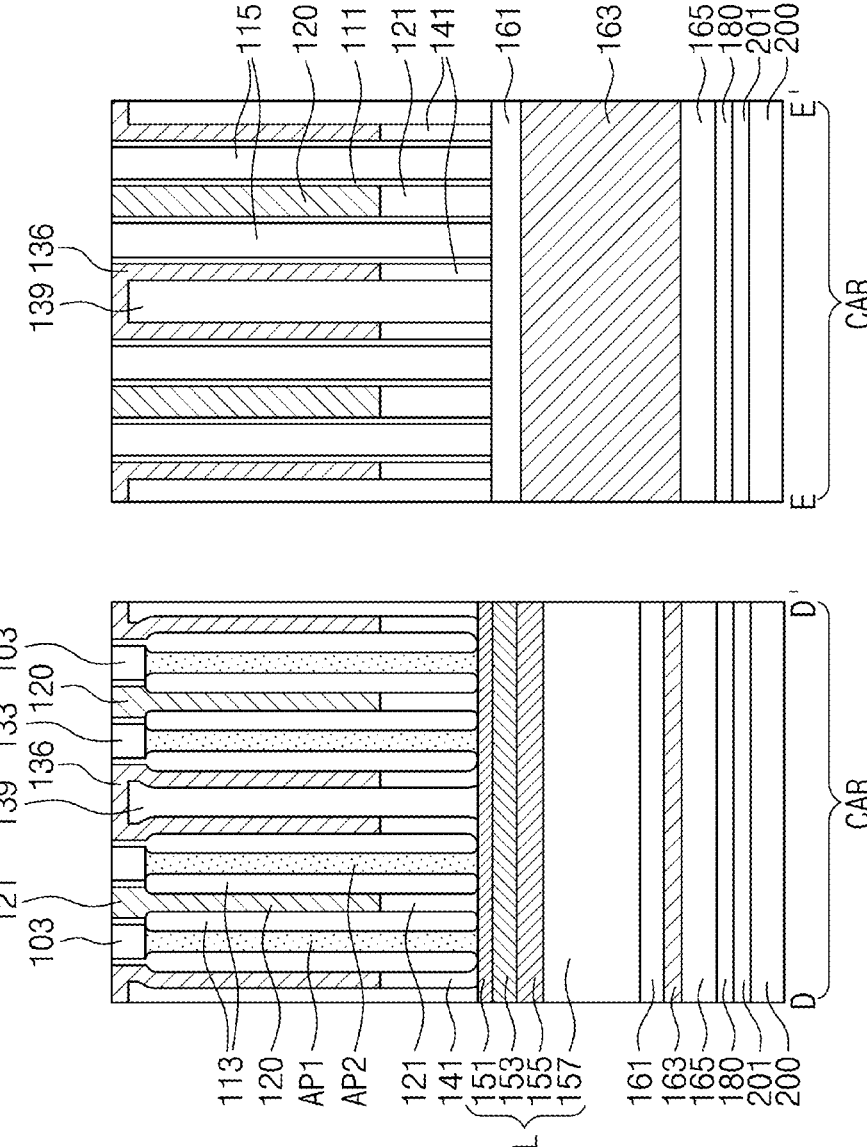
Figure 11C:
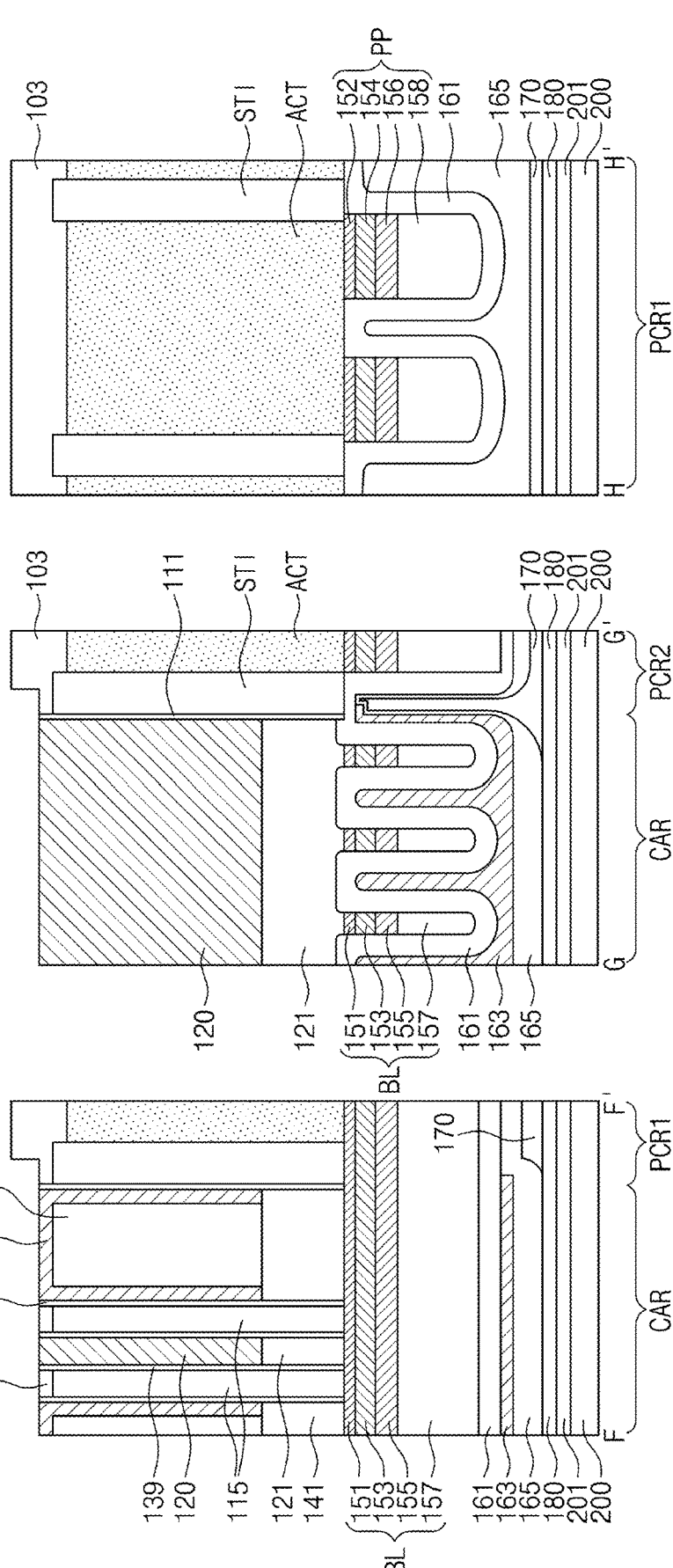
Figure 12A:
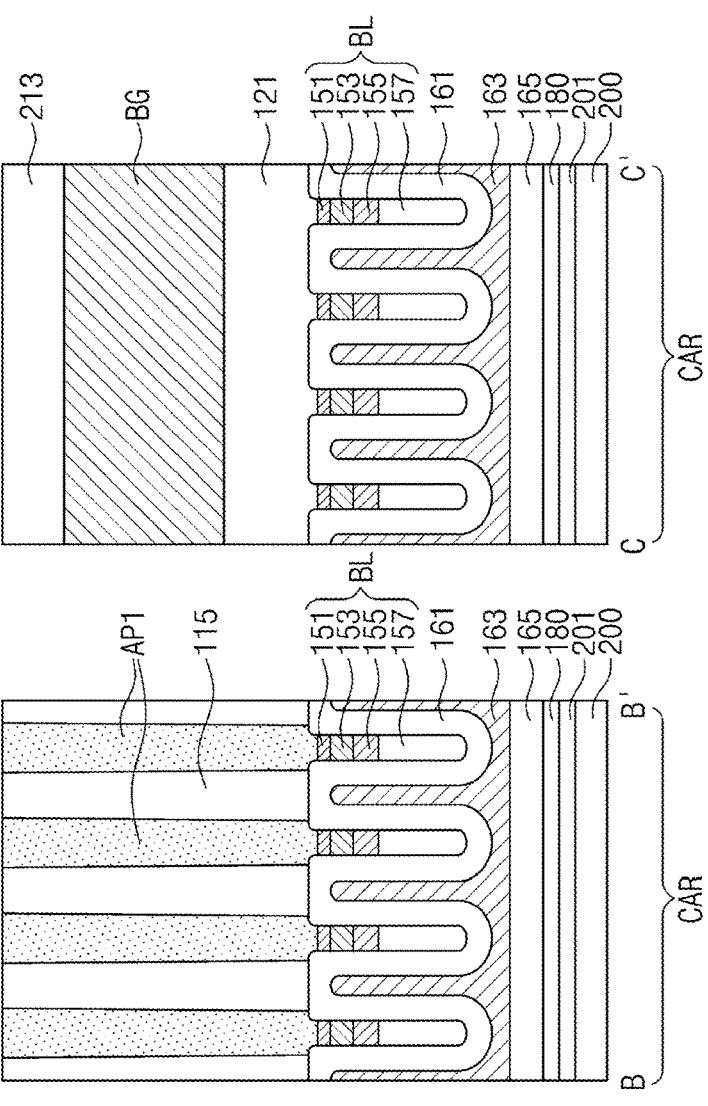
Figure 12A:
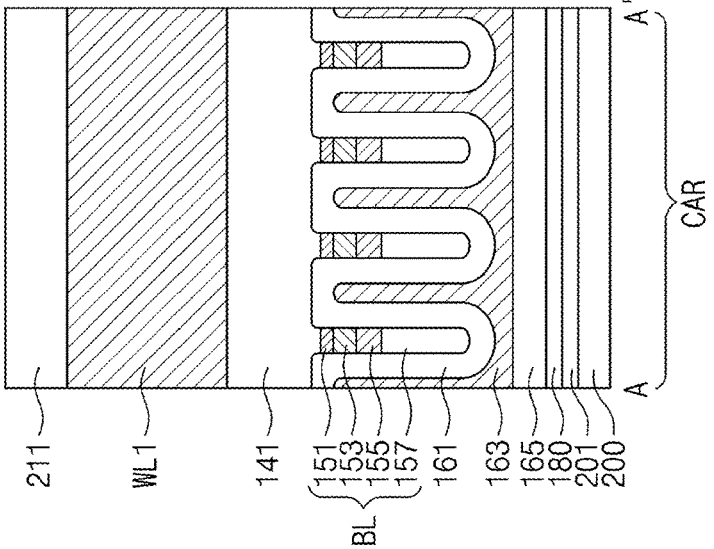
Figure 12B:
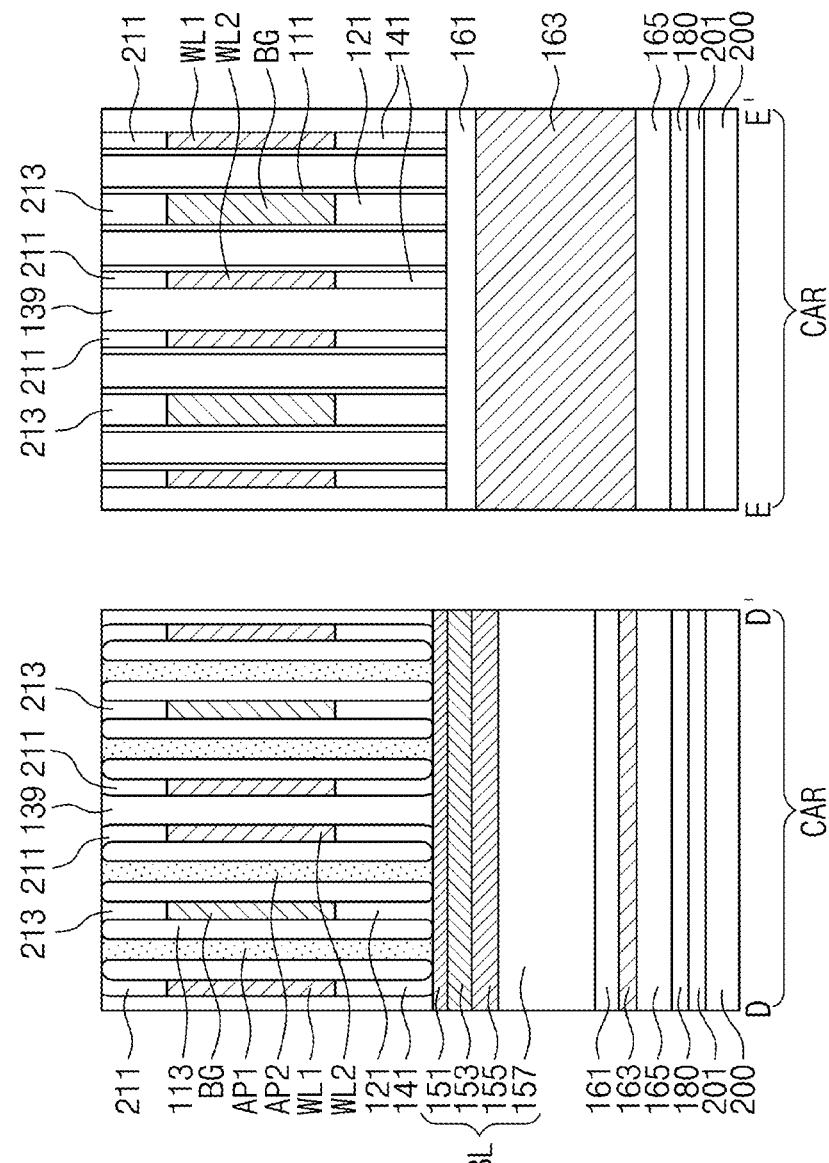
Figure 12C:
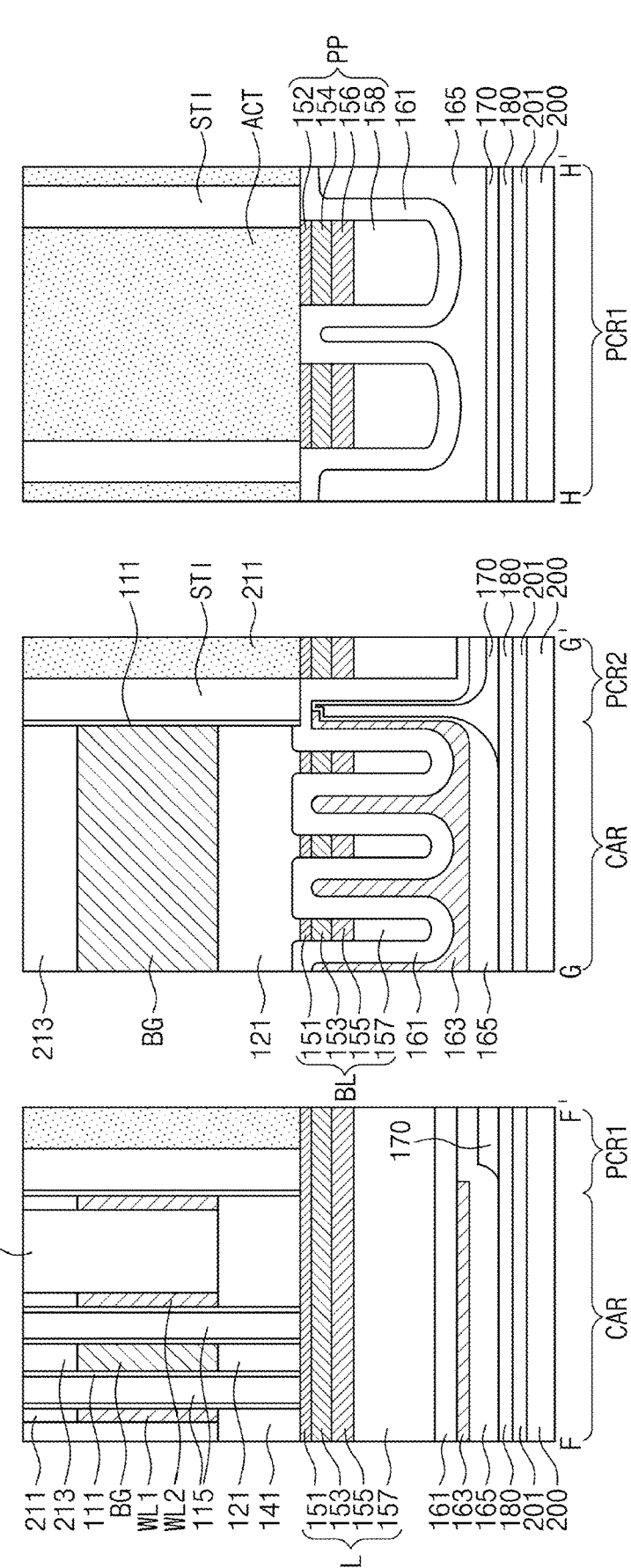
Figure 13A:
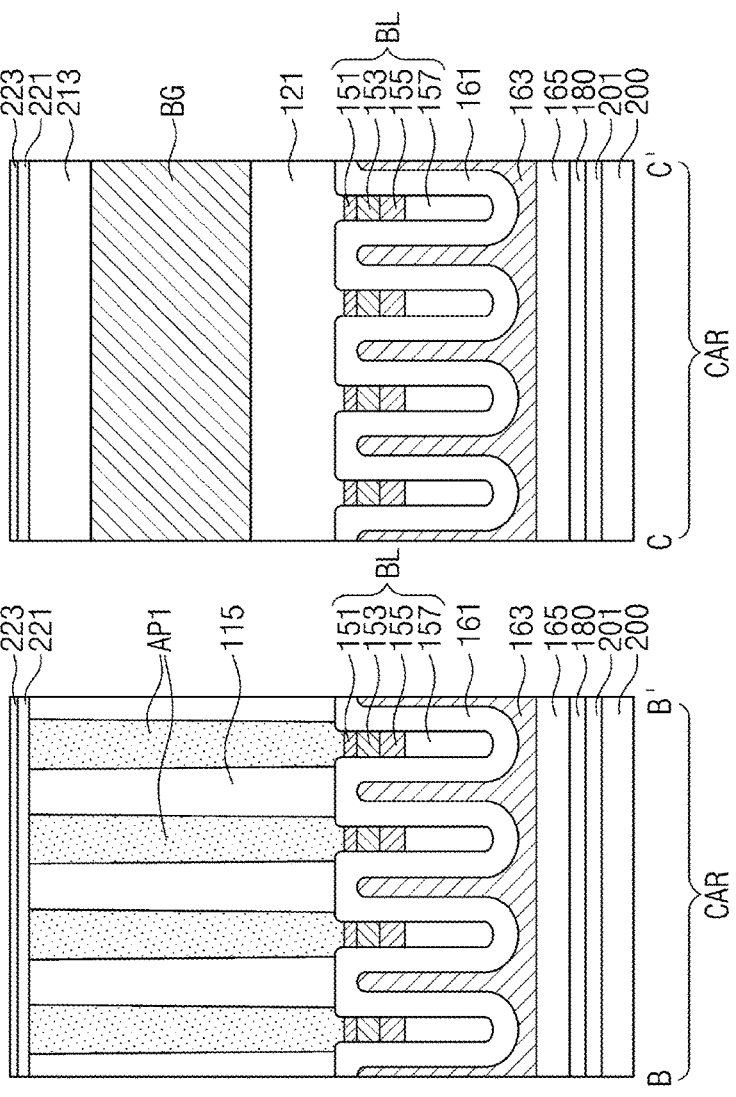
Figure 13A:
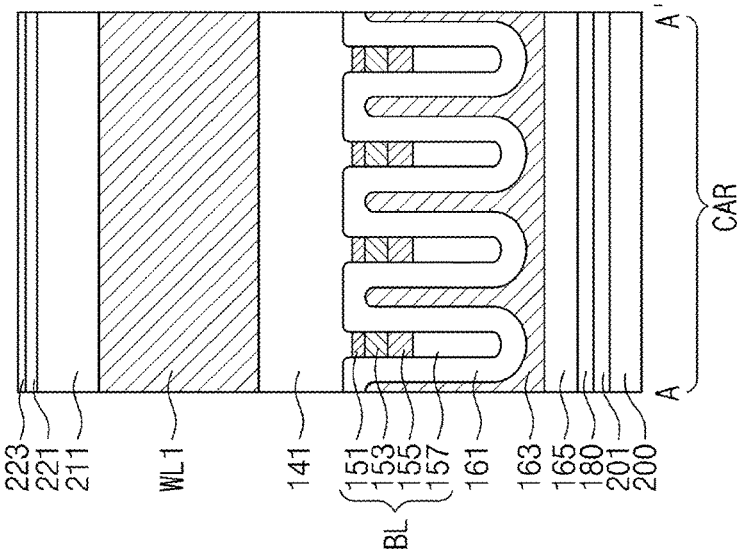
Figure 13B:
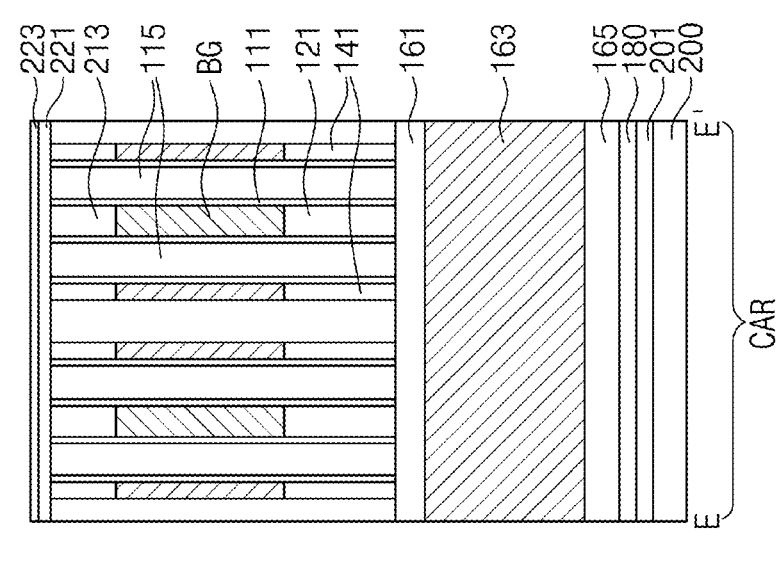
Figure 13B:
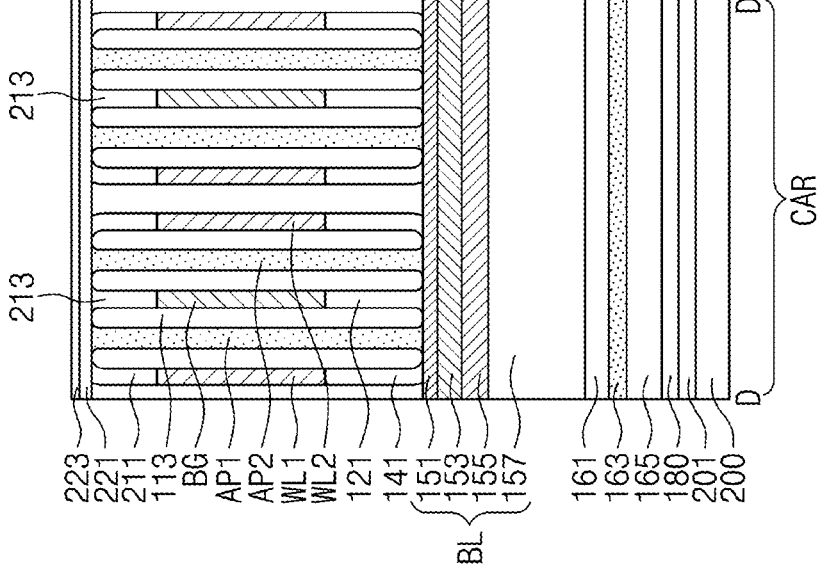
Figure 13C:
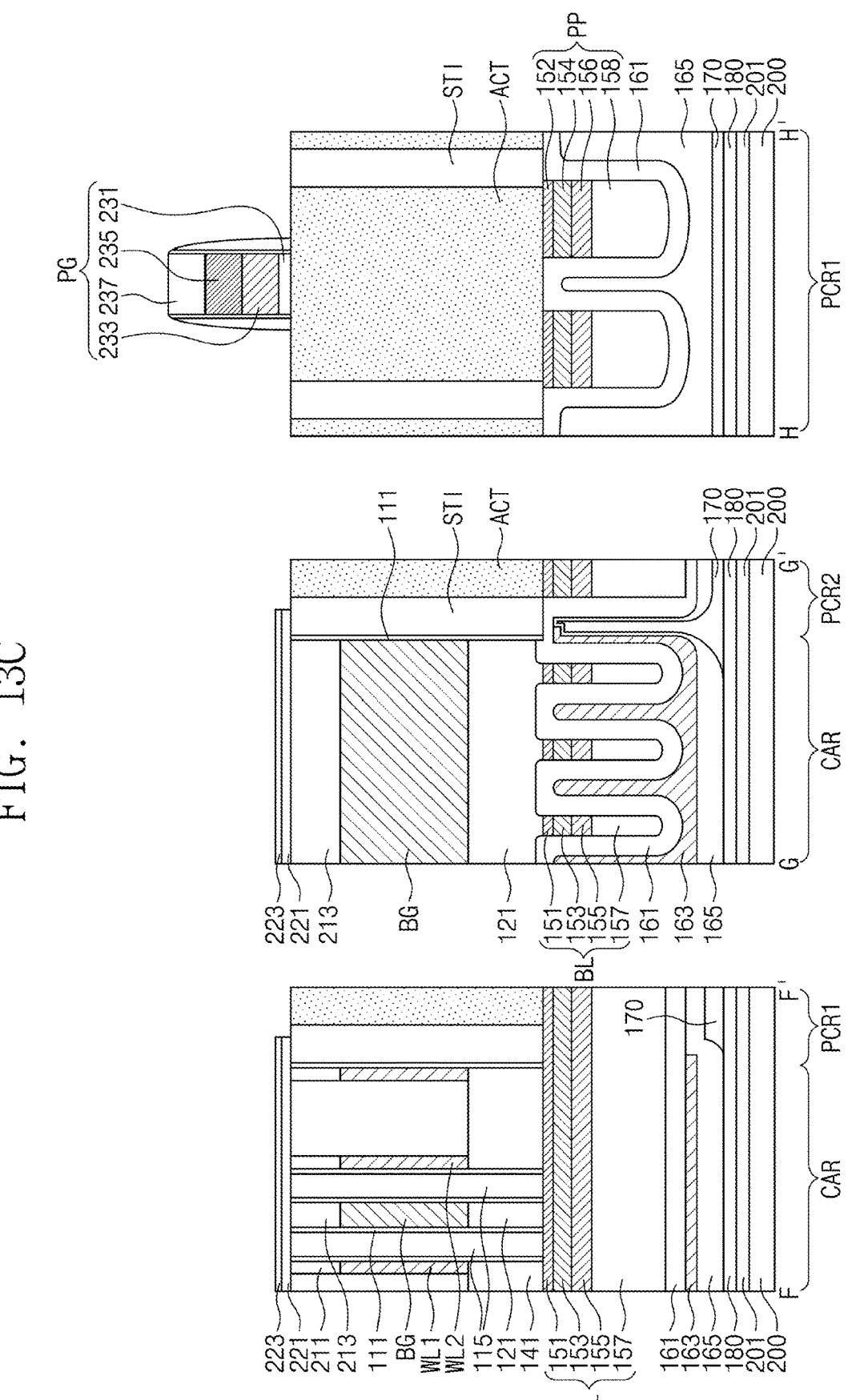
Figure 14A:
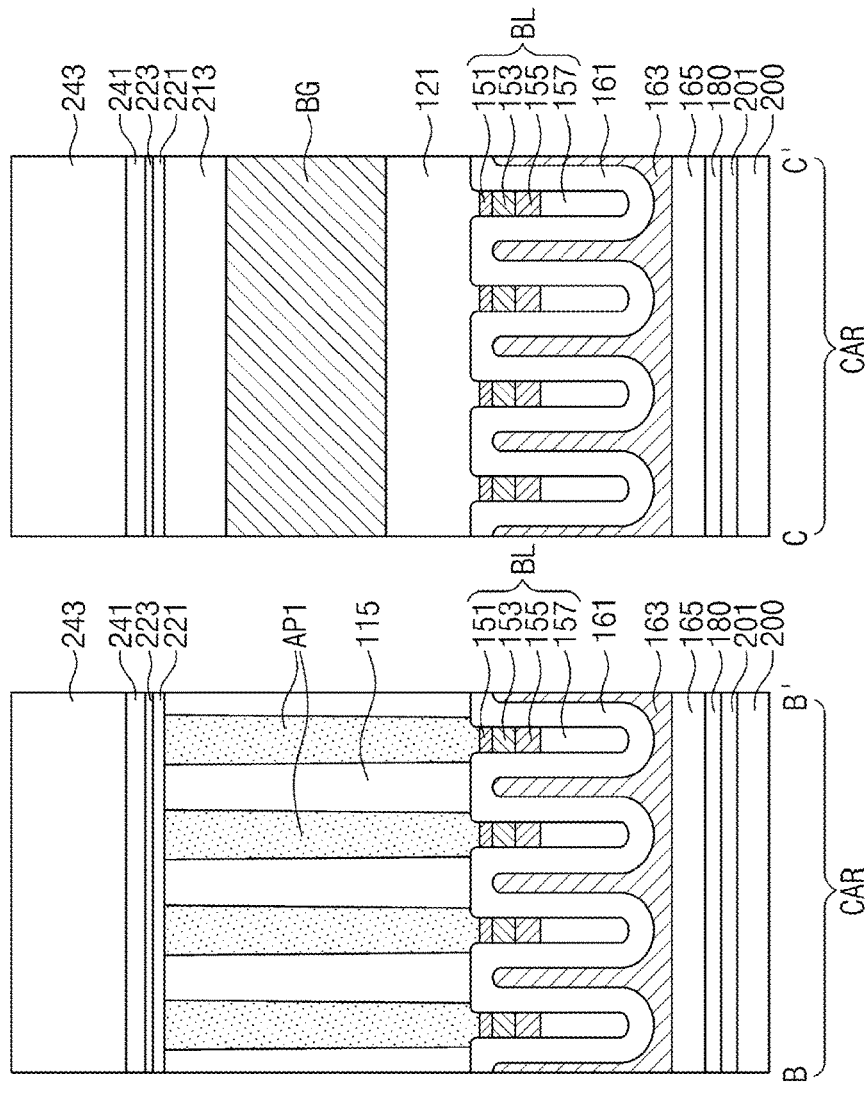
Figure 14A:
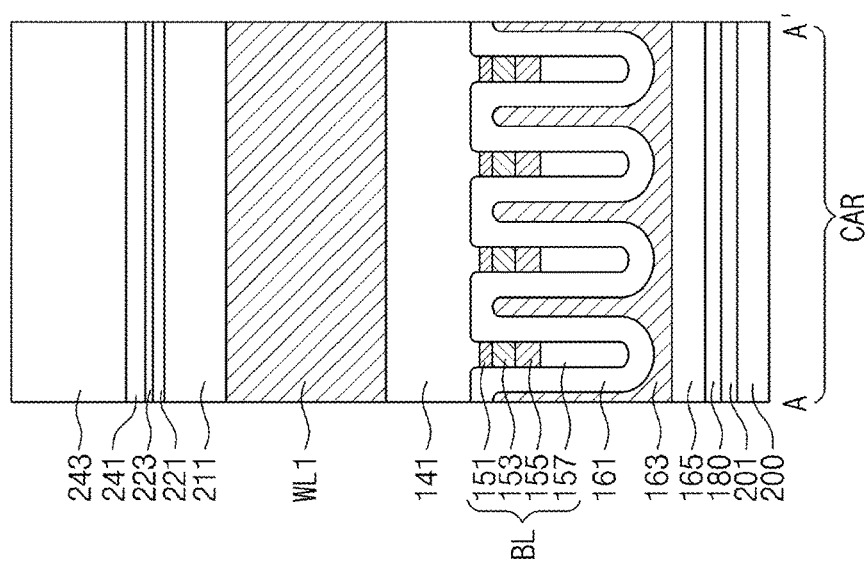
Figure 14B:
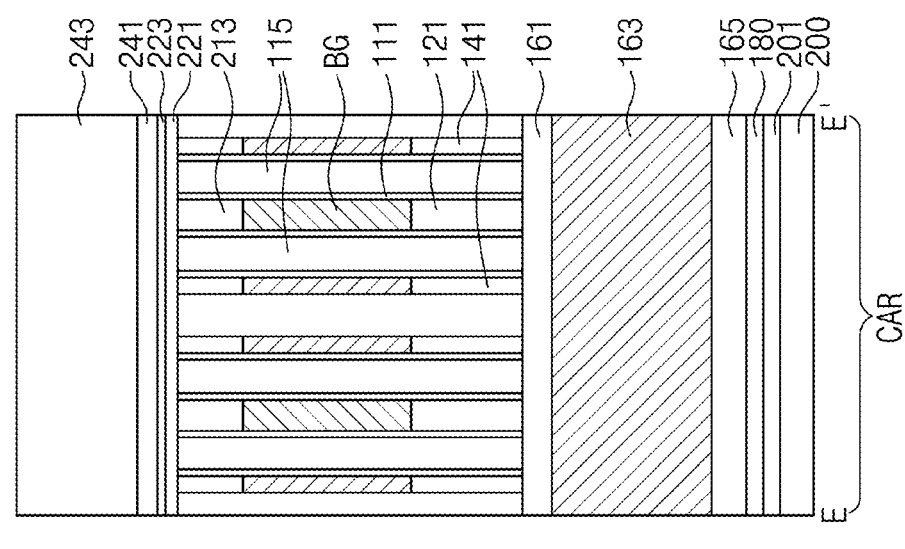
Figure 14B:
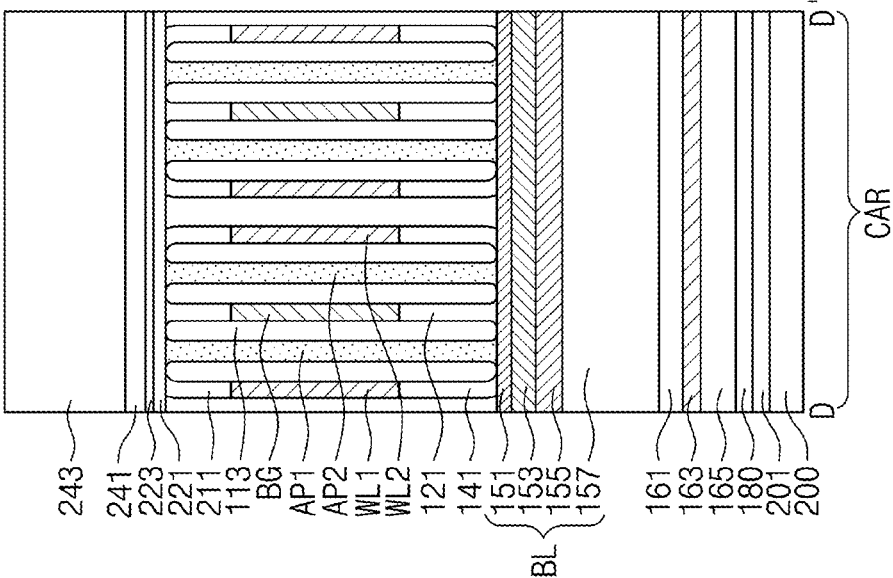
Figure 14C:
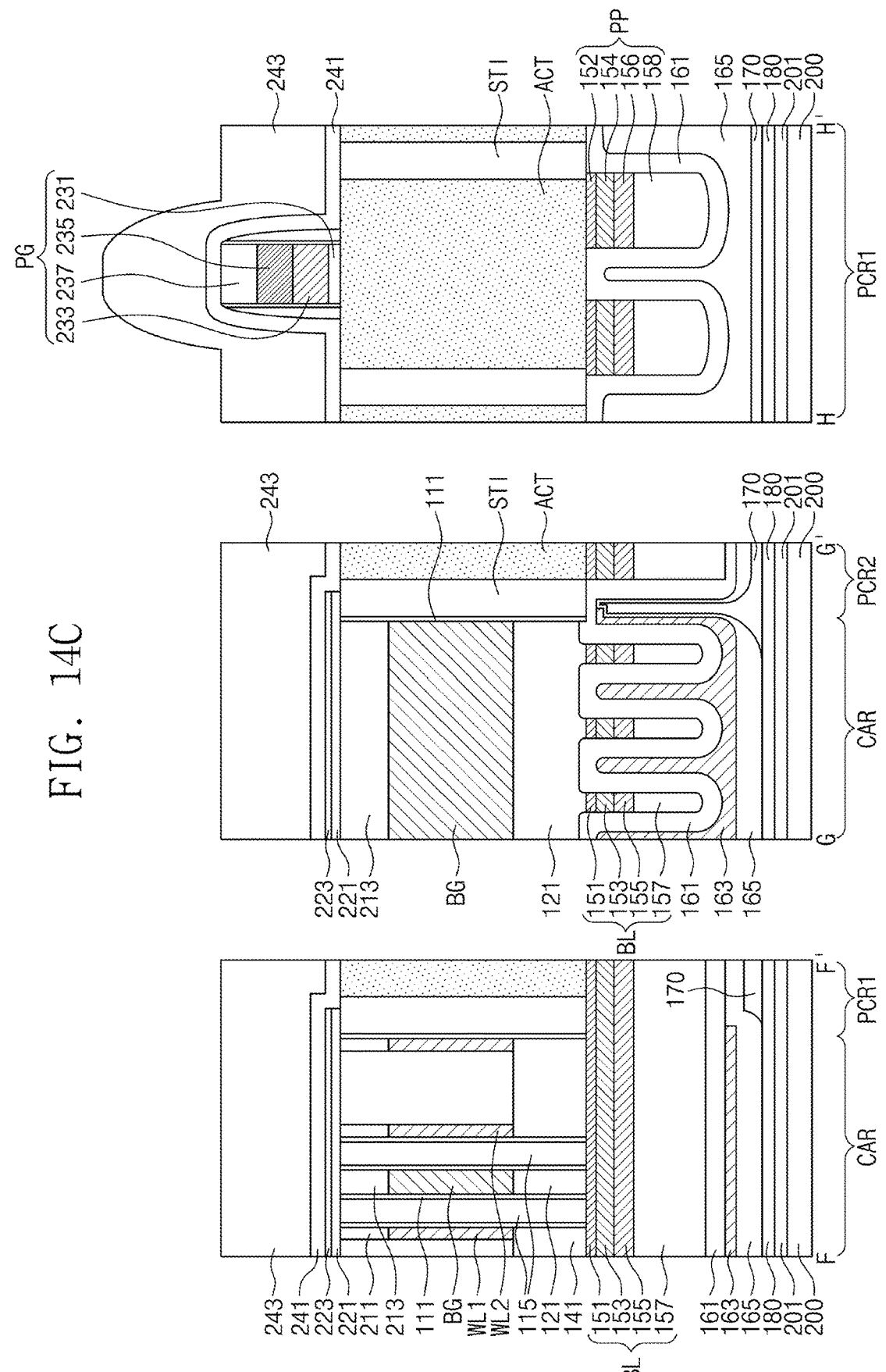
Figure 15A:
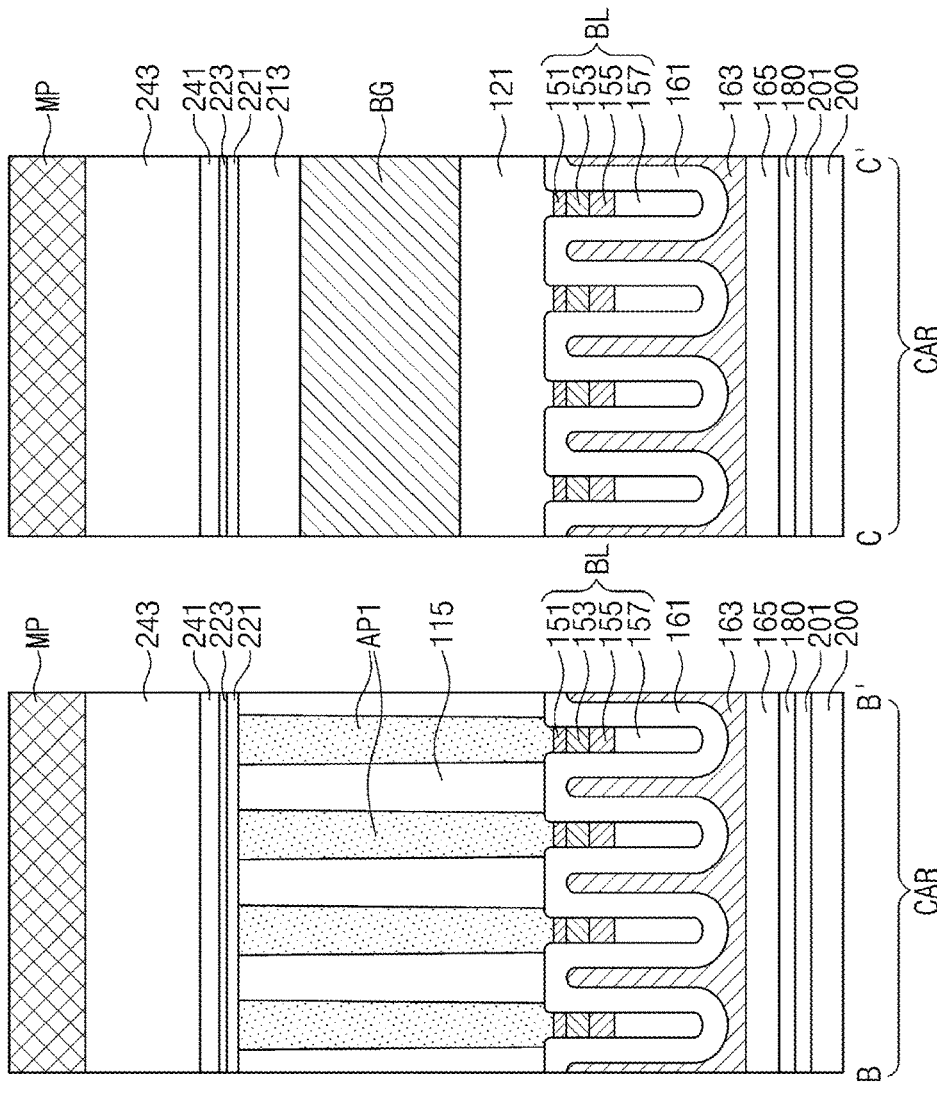
Figure 15A:
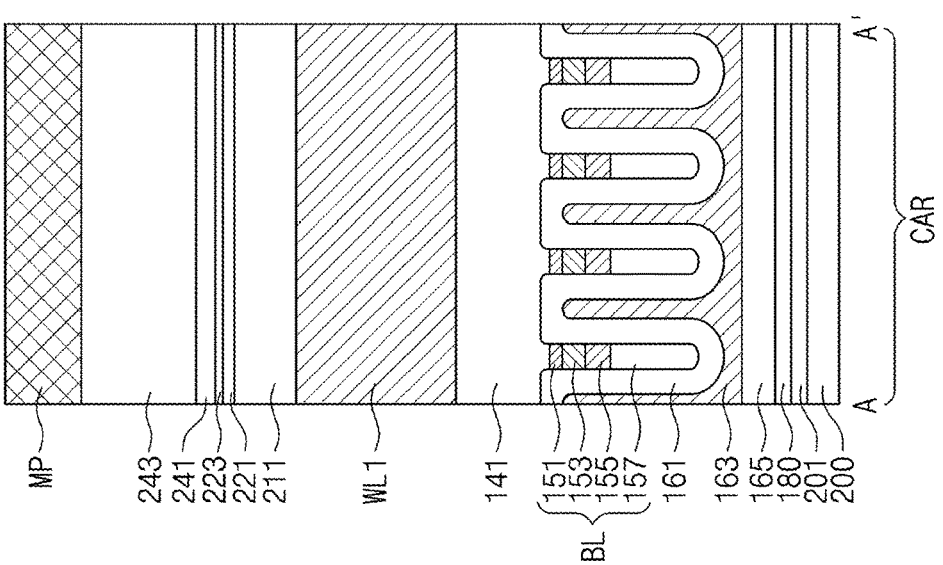
Figure 15B:
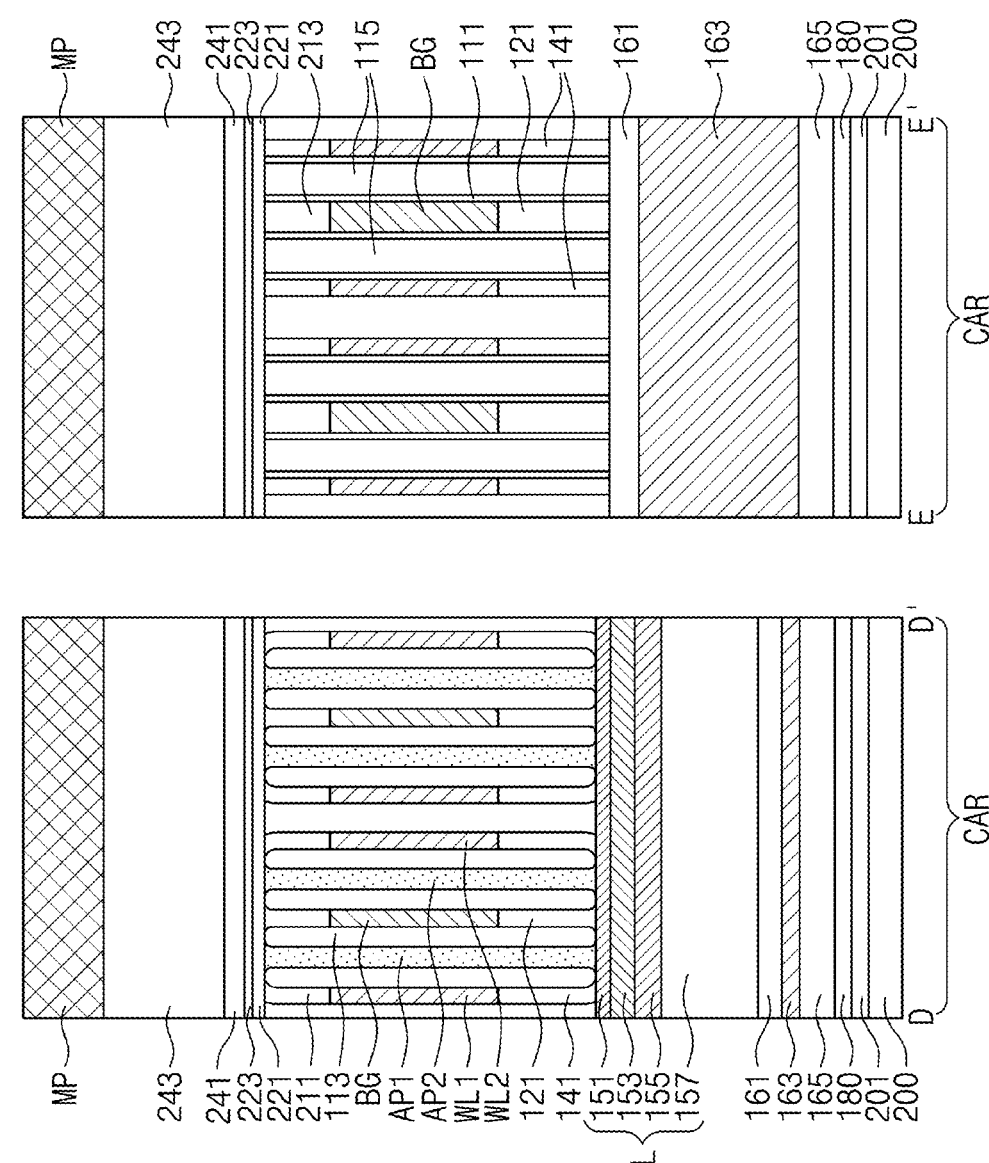
Figure 15C:
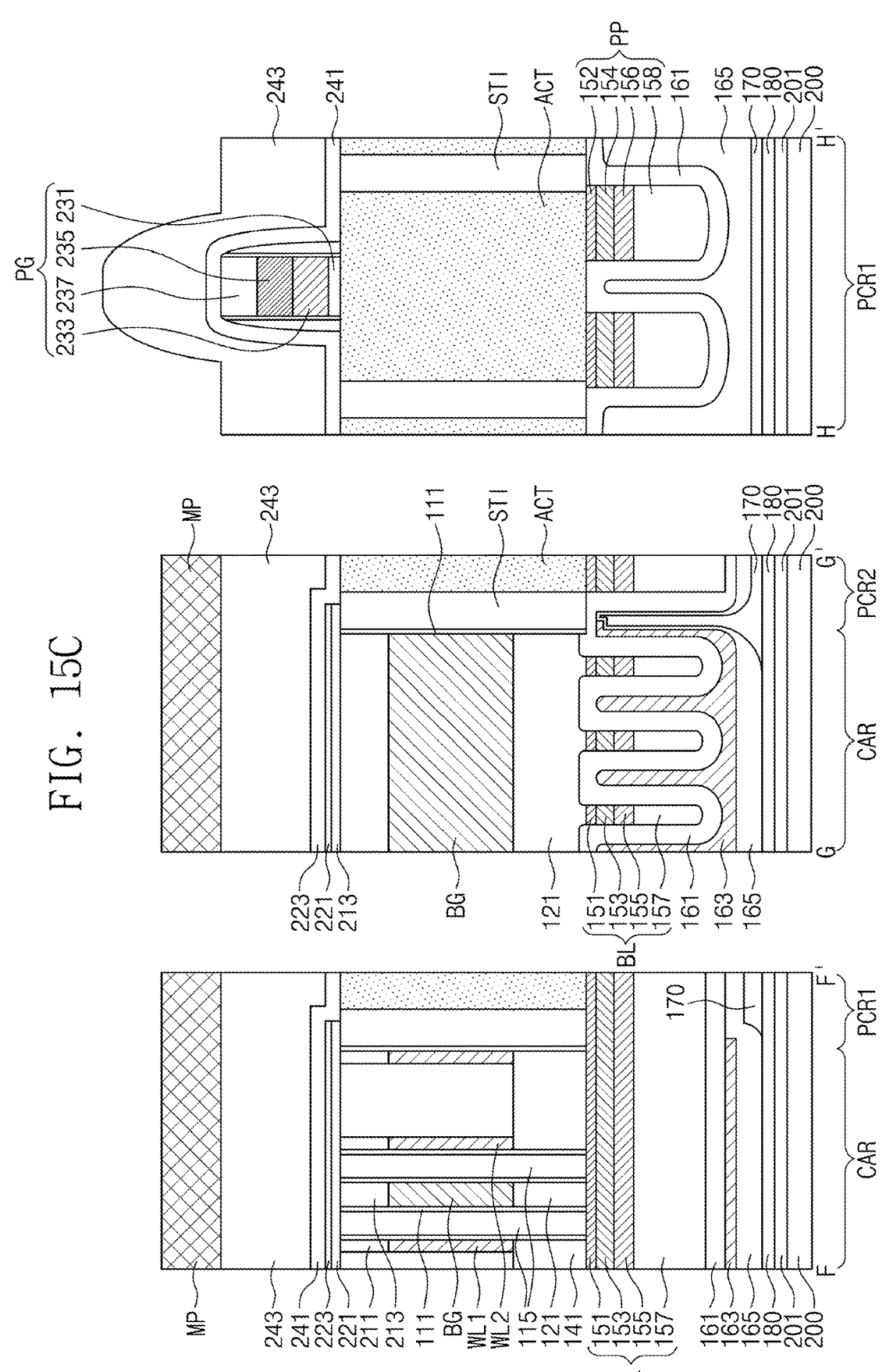
Figure 16A:
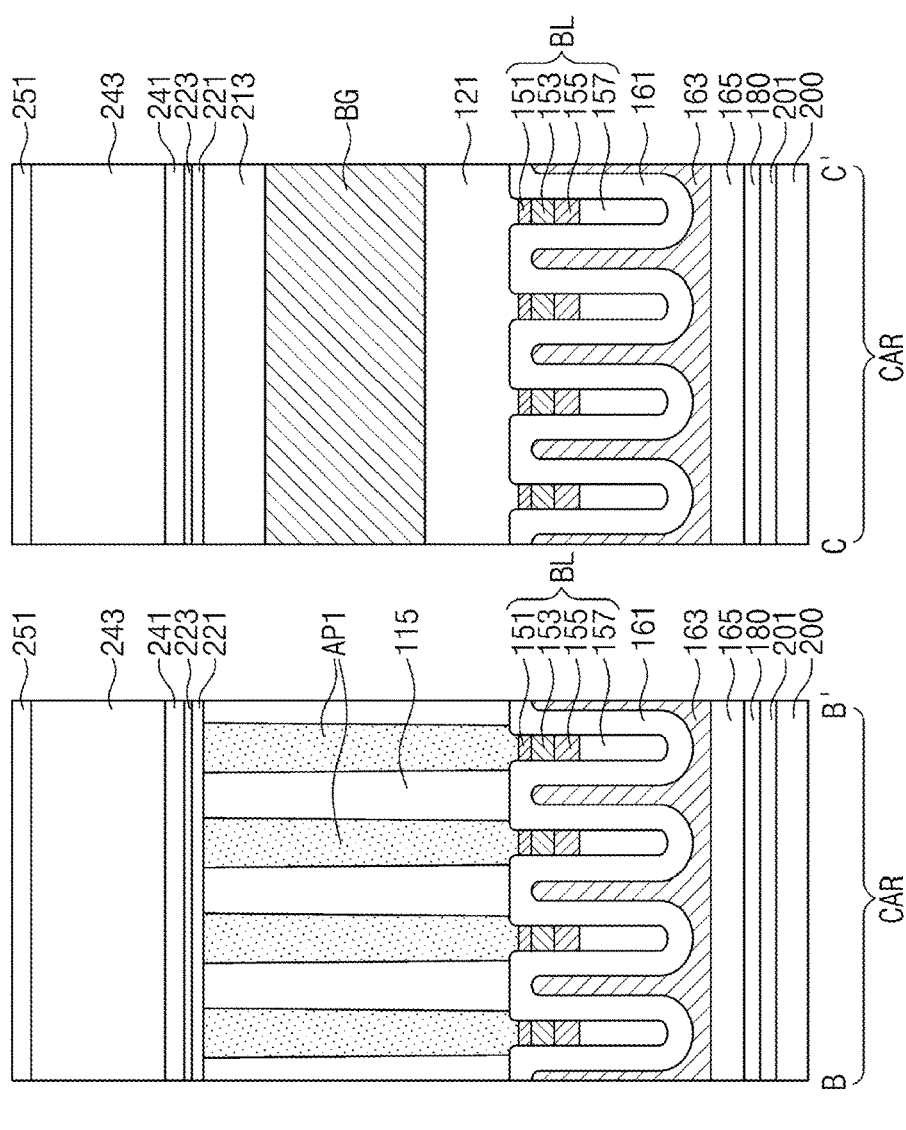
Figure 16A:
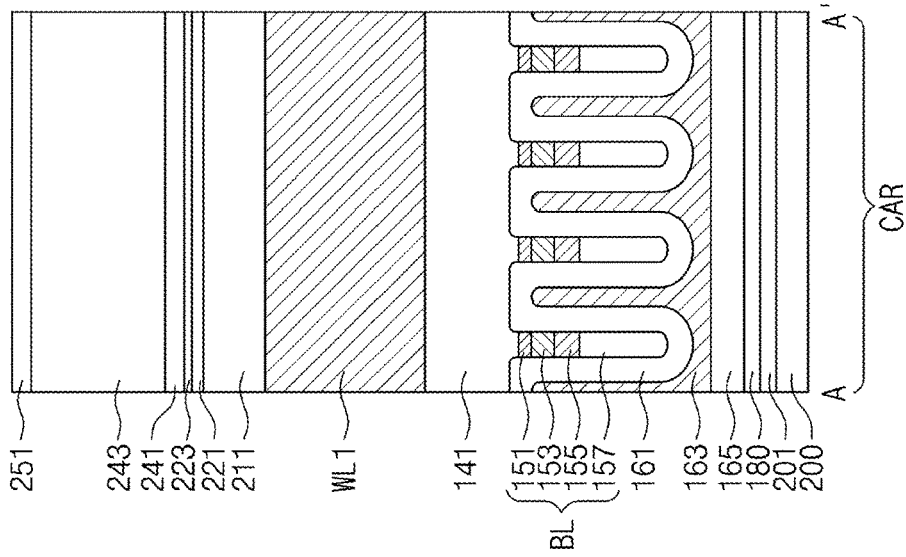
Figure 16B:
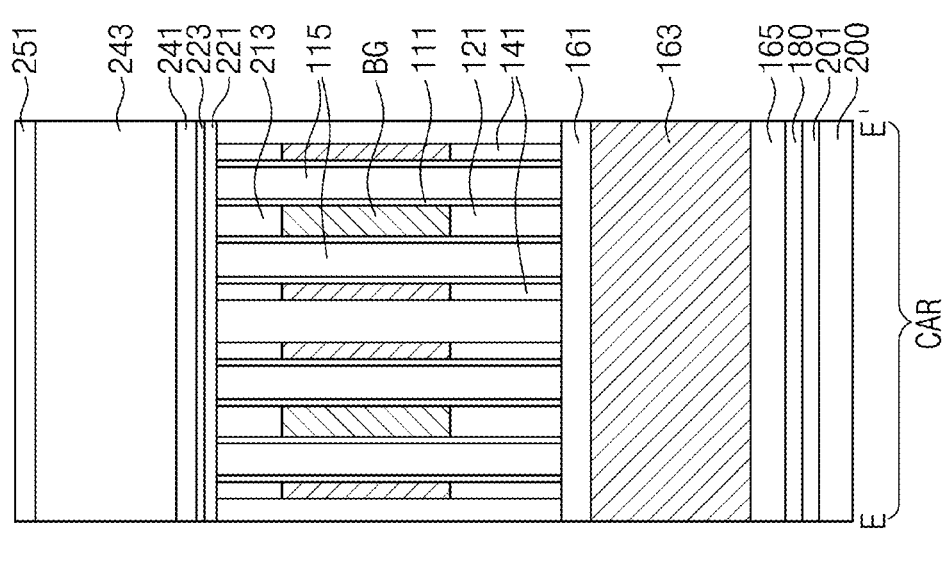
Figure 16B:
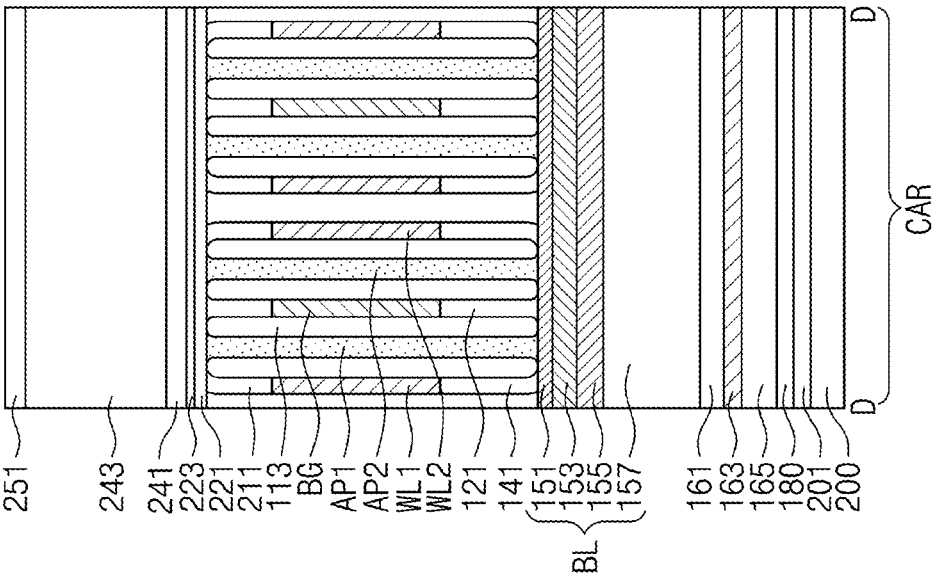
Figure 16C:
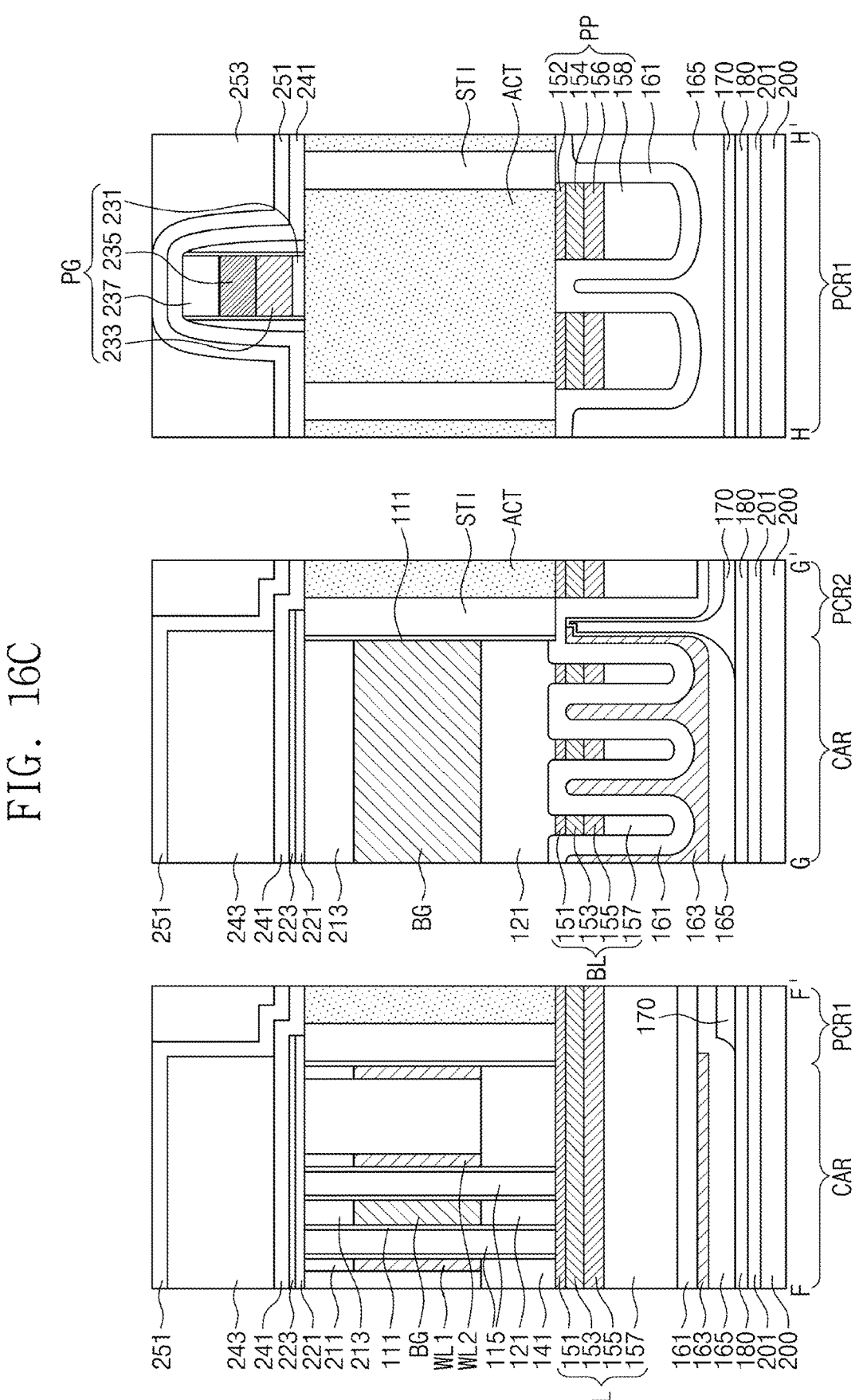

The first back-gate capping patterns 121 may be formed by depositing an insulating layer to fill the second trenches T2 with the first gate conductive layer 120 and planarizing the insulating layer to expose a top surface of the separation insulating layer 110 (e.g., of FIG. 7B). In an embodiment, the first back-gate capping patterns 121 may be formed of or include silicon nitride.

After the formation of the first back-gate capping patterns 121, an etch-back process may be performed on a portion of the separation insulating layer 110. Accordingly, the separation insulating layer 110 on the third mask layer 30 may be removed, and the first back-gate capping patterns 121 may protrude above a top surface of the third mask layer 30.

As a result of the etch-back process on the separation insulating layer 110, a device isolation layer STI may be formed to enclose the peripheral active patterns ACT in the first and second peripheral circuit regions PCR1 and PCR2, and the top surface of the third mask layer 30 may be exposed.

Thereafter, spacers (not shown) may be formed on both side surfaces of the first back-gate capping patterns 121 that protrude above the top surface of the third mask layer 30. The spacers may be formed of or include at least one of insulating or conductive materials. For example, the spacers may be formed of or include at least one of silicon oxide, silicon oxynitride, silicon nitride, silicon carbide, silicon carbon nitride, and combinations thereof.

Next, an anisotropic etching process using the spacers as the etch mask may be performed on the preliminary active patterns PAP and the separation insulating layer 110. Accordingly, a pair of first and second active patterns AP1 and AP2 that are spaced apart from each other may be formed at both sides of each back-gate insulating layer 113. As a result of the formation of the first and second active patterns AP1 and AP2, the buried insulating layer 101 may be exposed. In addition, when the first and second active patterns AP1 and AP2 are formed, first separation insulating patterns 115 may be formed between adjacent ones of the first active patterns AP1 and between adjacent ones of the second active patterns AP2 in the second direction D2.

The first and second active patterns AP1 and AP2 may be spaced apart from each other in the first direction D1 and in the second direction D2. A third trench may be formed between the first and second active patterns AP1 and AP2, which are adjacent to each other in the first direction D1. The third trench may extend in the second direction D2.

The top surface of the third mask layer 30 may be exposed after the formation of the first and second active patterns AP1 and AP2.

Next, a first gate insulating layer 131 may be deposited to conformally cover side surfaces of the first and second active patterns AP1 and AP2, top surfaces of the first back-gate capping patterns 121, top surfaces of the first separation insulating patterns 115, and the top surface of the third mask layer 30.

The first gate insulating layer 131 may be formed by at least one of physical vapor deposition (PVD), thermal chemical vapor deposition (thermal CVD), low-pressure chemical vapor deposition (LP-CVD), plasma-enhanced chemical vapor deposition (PE-CVD), or atomic layer deposition (ALD) techniques.

Before the formation of the first gate insulating layer 131, a thermal oxidation process may be performed to form a second gate insulating layer 133 on side surfaces of the first and second active patterns AP1 and AP2. The second gate insulating layer 133 may be formed of silicon oxide and may be thicker than the first gate insulating layer 131.

Thereafter, a second gate conductive layer 135 may be formed to cover the first and second gate insulating layers 131 and 133 with a uniform thickness. The second gate conductive layer 135 may be formed by at least one of physical vapor deposition (PVD), thermal chemical vapor deposition (thermal CVD), low-pressure chemical vapor deposition (LP-CVD), plasma-enhanced chemical vapor deposition (PE-CVD), or atomic layer deposition (ALD) techniques. A deposition thickness of the second gate conductive layer 135 may be smaller than half of the distance between the first and second active patterns AP1 and AP2 facing each other in the first direction D1. The second gate conductive layer 135 may be deposited on the first and second gate insulating layers 131 and 133 to define a gap region between the first and second active patterns AP1 and AP2 facing each other.

Next, a gap-fill insulating layer 137 may be formed to fill the gap region defined by the second gate conductive layer 135. A top surface of the gap-fill insulating layer 137 may be located at a level that is higher than, or substantially equal to, top surfaces of the second back-gate capping patterns 123. In an embodiment, the gap-fill insulating layer 137 may be formed of or include at least one of silicon nitride, silicon oxynitride, silicon carbide, silicon carbon nitride layer, and combinations thereof.

Referring to FIGS. 1, 9A, 9B, and 9C, after the formation of the gap-fill insulating layer 137, preliminary gate conductive patterns 136 that are spaced apart from each other may be formed by removing an upper portion of the second gate conductive layer 135.

The formation of the preliminary gate conductive patterns 136 may include performing an etching or etch-back process on the second gate conductive layer 135 to form recess regions between upper side surfaces of the first and second active patterns AP1 and AP2 and side surfaces of the gap-fill insulating layer 137. Top surfaces of the preliminary gate conductive patterns 136 may be located at a level lower than the first surfaces of the first and second active patterns AP1 and AP2. Each of the preliminary gate conductive patterns 136 may have a U-shaped section and may extend in the first direction D1. That is, each of the preliminary gate conductive patterns 136 may include vertical portions that are perpendicular to the top surface of the first substrate 100 and face each other, and a horizontal portion t is parallel to the top surface of the first substrate 100 and connects the vertical portions to each other.

After the formation of the preliminary gate conductive patterns 136, a capping insulating layer (e.g., a silicon nitride layer) may be deposited to fill the recess regions. Thereafter, a planarization process using the second mask layer 20 as an etch stop layer may be performed on the capping insulating layer and the second back-gate capping patterns 123. The third mask layer 30 may be removed, during the planarization process.

Next, a planarization process may be performed on the second mask layer 20, the capping insulating layer, and the second back-gate capping patterns 123 to expose the first surfaces of the first and second active patterns AP1 and AP2, and then, a process of etching the first mask layer 10 may be performed. Accordingly, first gate capping patterns 141 may be formed on the preliminary gate conductive patterns 136.

Top surfaces of the first gate capping patterns 141 may be substantially coplanar with the top surfaces of the second back-gate capping patterns 123 and the first surfaces of the first and second active patterns AP1 and AP2.

When the first gate capping patterns 141 are formed in the cell array region CAR, the first surface of the peripheral active pattern ACT in the first and second peripheral circuit regions PCR1 and PCR2 may be exposed.

Referring to FIGS. 1, 10A, 10B, and 10C, bit lines BL, which extend in the first direction D1, may be formed in the cell array region CAR.

The formation of the bit lines BL may include sequentially depositing a poly-silicon layer 151, a metal silicide layer 153, a metal layer 155, and a hard mask layer 157, forming a mask pattern (not shown), which is a line-shaped pattern that extends, on the hard mask layer 157 in the second direction D2, and sequentially and anisotropically etching the hard mask layer 157, the metal layer 155, the metal silicide layer 153, and the poly-silicon layer 151 using the mask pattern as an etch mask.

The poly-silicon layer 151 may be deposited on the entire top surface of the first substrate 100. The poly-silicon layer 151 may be in contact with the top surfaces of the first and second active patterns AP1 and AP2 in the cell array region CAR and may be deposited on the peripheral active pattern ACT in the first and second peripheral circuit regions PCR1 and PCR2.

The metal silicide layer 153 may be formed of or include at least one of metal silicide materials (e.g., titanium silicide, cobalt silicide, or nickel silicide).

The metal layer 155 may be formed by depositing at least one of conductive metal nitride materials (e.g., titanium nitride and tantalum nitride) or metallic materials (e.g., tungsten, titanium, and tantalum). The hard mask layer 157 may be formed by depositing at least one of insulating materials (e.g., silicon nitride and silicon oxynitride).

A mask pattern (not shown) that extends in the second direction D2 and has a line shape, may be formed on the hard mask layer 157. Then, the hard mask layer 157, the metal layer 155, the metal silicide layer 153, and the poly-silicon layer 151 may be sequentially and anisotropically etched using the mask pattern. Thus, the bit lines BL, which extend in the second direction D2, may be formed.

When the bit lines BL are formed, the second back-gate capping pattern 123 and the first gate capping patterns 141 may be partially etched.

In an embodiment, when the bit lines BL are formed, peripheral circuit patterns PP may be formed in the first and second peripheral circuit regions PCR1 and PCR2.

The peripheral circuit patterns PP may have the same stacking structure as the bit lines BL. In other words, the peripheral circuit patterns PP may include a poly-silicon pattern 152, a metal silicide pattern 154, a metal pattern 156, and a hard mask pattern 158, which are sequentially stacked.

When the peripheral circuit patterns PP are formed, the hard mask layer 157, the metal layer 155, the metal silicide layer 153, and the poly-silicon layer 151 in the first and second peripheral circuit regions PCR1 and PCR2 may be etched As a result, the device isolation layer STI and the peripheral active pattern ACT may be partially exposed.

After the formation of the bit lines BL, a spacer insulating layer 161 may be formed to define a gap region between the bit lines BL.

The spacer insulating layer 161 may be deposited on the first substrate 100 and may have a substantially uniform thickness. A deposition thickness of the spacer insulating layer 161 may be smaller than half of the distance between adjacent ones of the bit lines BL. In this case, gap regions may be respectively defined between the bit lines BL. The gap region may extend parallel to the bit lines BL or in the second direction D2. In addition, the spacer insulating layer 161 may conformally cover the peripheral circuit patterns PP in the first and second peripheral circuit regions PCR1 and PCR2.

Thereafter, a shielding conductive pattern 163 may be formed on the spacer insulating layer 161.

The formation of the shielding conductive pattern 163 may include depositing a shielding conductive layer on the spacer insulating layer 161 and patterning the shielding conductive layer to remove the shielding conductive layer from the first and second peripheral circuit regions PCR1 and PCR2. Accordingly, after the formation of the shielding conductive pattern 163, the spacer insulating layer 161 in the first and second peripheral circuit regions PCR1 and PCR2 may be exposed.

In the cell array region CAR, the shielding conductive pattern 163 may fill the gap regions, which are defined by the spacer insulating layer 161. In the case where the shielding conductive layer is deposited using a chemical vapor deposition method, due to a step coverage property in the chemical vapor deposition method, a discontinuous interface (e.g., a seam) may be formed in the gap region. In an embodiment, the shielding conductive pattern 163 may be formed of or include at least one of metallic materials (e.g., tungsten (W), titanium (Ti), nickel (Ni), and cobalt (Co)). In an embodiment, the shielding conductive pattern 163 may be formed of or include at least one of conductive two-dimensional (2D) materials (e.g., graphene).

Thereafter, a capping insulating layer 165 may be formed on the shielding conductive pattern 163. The capping insulating layer 165 may conformally cover the shielding conductive pattern 163 in the cell array region CAR and the spacer insulating layer 161 in the first and second peripheral circuit regions PCR1 and PCR2. In an embodiment, the capping insulating layer 165 may be a silicon nitride layer. A top surface of the capping insulating layer 165 may have a stepwise portion between the cell array region CAR and the first and second peripheral circuit regions PCR1 and PCR2.

A planarization insulating layer 170 may be formed on the capping insulating layer 165 in the first and second peripheral circuit regions PCR1 and PCR2 to remove the stepwise portion between the cell array region CAR and the first and second peripheral circuit regions PCR1 and PCR2. The planarization insulating layer 170 may be formed by depositing an insulating material (e.g., silicon oxide). The planarization insulating layer 170 may be formed of or include an insulating material having an etch selectivity with respect to the capping insulating layer 165. As an example, the planarization insulating layer 170 may be one of insulating layers, which are formed by a spin-on-glass (SOG) technique, or a silicon oxide layer. The planarization insulating layer 170 may have a substantially flat top surface, and a top surface of the planarization insulating layer 170 may be substantially coplanar with the top surface of the capping insulating layer 165.

Next, a first adhesive layer 180 may be formed on the entire top surface of the first substrate 100. That is, the first adhesive layer 180 may cover the top surface of the capping insulating layer 165 and the top surface of the planarization insulating layer 170.

Thereafter, a second substrate 200 may be bonded to the first adhesive layer 180 on the first substrate 100 using a second adhesive layer 201. The second substrate 200 may be formed of or include single-crystalline silicon or glass (e.g., quartz).

Referring to FIGS. 1, 11A, 11B, and 11C, after the bonding of the second substrate 200, a back-side lapping process may be performed to remove the first substrate 100. The structures on the first substrate 100 may be vertically inverted to perform a process of removing the first substrate 100.

The removal of the first substrate 100 may include sequentially performing a grinding process, a dry etching process, and a wet etching process to expose the horizontal portions of the preliminary gate conductive patterns 136 and the first gate conductive layer 120. Accordingly, the buried insulating layer 101 on the horizontal portions of the preliminary gate conductive patterns 136 may be partially removed, and buried insulating patterns 103 may be formed on the first and second active patterns AP1 and AP2 and the peripheral active pattern ACT.

Referring to FIGS. 1, 12A, 12B, and 12C, the horizontal and vertical portions of the preliminary gate conductive patterns 136 may be etched to form first and second word lines WL1 and WL2 crossing side surfaces of the first and second active patterns AP1 and AP2.

In addition, when the first and second word lines WL1 and WL2 are formed, an upper portion of the first gate conductive layer 120 may be etched to form the back-gate electrodes BG between the first and second active patterns AP1 and AP2.

The formation of the first and second word lines WL1 and WL2 and the back-gate electrodes BG may be performed to form recess regions between the back-gate insulating layer 113 and the second gate insulating patterns 133. The recess regions may be extended in the second direction D2 and may expose a portion of the liner insulating layer 111, a portion of the back-gate insulating layer 113, and portions of second separation insulating patterns 139.

Thereafter, second gate capping patterns 211 may be formed on the first and second word lines WL1 and WL2, and second back-gate capping patterns 213 may be formed on the back-gate electrodes BG.

The second gate capping patterns 211 and the second back-gate capping patterns 213 may be formed by depositing a gate capping layer to fill the recess regions and performing a planarization process on the gate capping layer.

In an embodiment, a chemical vapor deposition method may be used to deposit the gate capping layer in the recess regions. Due to a step coverage property in the deposition process, a discontinuous interface (e.g., a seam or a void) may be formed in the recess regions. The seam, which is formed in the gate capping layer, may be extended in the second direction D2.

The gate capping layer may be formed of, or include, an insulating material having an etch selectivity with respect to the second separation insulating patterns 139. The gate capping layer may include, for example, a silicon oxide layer, a silicon nitride layer, a silicon oxynitride layer, and/or a low-k dielectric layer.

Referring to FIGS. 1, 13A, 13B, and 13C, first and second etch stop layers 221 and 223 may be sequentially formed on the entire top surface of the second substrate 200. The first etch stop layer 221 may be formed of or include silicon oxide and may be deposited on the first and second active patterns AP1 and AP2, the first and second separation insulating patterns 115 and 139, and the second back-gate capping patterns 213. The second etch stop layer 223 may be formed of or include a material (e.g., silicon nitride) having an etch selectivity with respect to the first etch stop layer 221.

Thereafter, a patterning process may be performed on the first and second etch stop layers 221 and 223 to expose the peripheral active patterns ACT in the first and second peripheral circuit regions PCR1 and PCR2.

Next, a peripheral transistor may be formed on the peripheral active patterns ACT. In detail, a peripheral gate electrode PG may be formed on the peripheral active patterns ACT and in the first and second peripheral circuit regions PCR1 and PCR2. Then, insulating spacers may be formed on opposite side surfaces of the peripheral gate electrode PG. In addition, source/drain impurity regions SD may be formed by doping the peripheral active patterns ACT, which are located at both sides of the peripheral gate electrode PG, with impurities. The peripheral gate electrode PG may include a peripheral gate insulating pattern 231, a peripheral conductive pattern 233, a peripheral metal pattern 235, and a peripheral mask pattern 237, which are sequentially stacked.

Referring to FIGS. 1, 14A, 14B, and 14C, a third etch stop layer 241 and a first interlayer insulating layer 243 may be sequentially formed on the second substrate 200.

The third etch stop layer 241 may have a substantially uniform thickness and may conformally cover a top surface of the second etch stop layer 223 and the peripheral gate electrode PG. In an embodiment, the third etch stop layer 241 may be formed of or include silicon nitride.

The first interlayer insulating layer 243 may be formed of or include an insulating material having an etch selectivity with respect to the third etch stop layer 241. For example, the first interlayer insulating layer 243 may be formed of or include silicon oxide. The first interlayer insulating layer 243 may have a substantially flat top surface in the cell array region CAR. The first interlayer insulating layer 243 may have a protruding portion, which is formed on the peripheral gate electrode PG, in the first and second peripheral circuit regions PCR1 and PCR2.

Referring to FIGS. 1, 15A, 15B, and 15C, a mask pattern MP may be formed on the first interlayer insulating layer 243. The mask pattern MP may cover a top surface of the first interlayer insulating layer 243 in the cell array region CAR and may expose the protruding portion of the first interlayer insulating layer 243 in the first and second peripheral circuit regions PCR1 and PCR2.

Thereafter, the first interlayer insulating pattern 243 may be formed by anisotropically etching the first interlayer insulating layer 243 using the mask pattern MP as an etch mask. The first interlayer insulating pattern 243 may be formed to expose a top surface of the third etch stop layer 241 in the first and second peripheral circuit regions PCR1 and PCR2. The mask pattern MP may be removed, after the formation of the first interlayer insulating pattern 243.

Referring to FIGS. 1, 16A, 16B, and 16C, after the formation of the first interlayer insulating pattern 243, a fourth etch stop layer 251 may be formed on the entire top surface of the second substrate 200. The fourth etch stop layer 251 may be deposited on the top surface of the first interlayer insulating pattern 243 and the top surface of the third etch stop layer 241 with a substantially uniform thickness. That is, in the first and second peripheral circuit regions PCR1 and PCR2, the fourth etch stop layer 251 may be in direct contact with the top surface of the third etch stop layer 241.

Thereafter, a second interlayer insulating layer may be deposited on the third etch stop layer 241 in the cell array region CAR and the first and second peripheral circuit regions PCR1 and PCR2, and a planarization process may be performed on the second interlayer insulating layer to form a second interlayer insulating pattern 253. The second interlayer insulating layer may be formed of or include an insulating material having an etch selectivity with respect to the fourth etch stop layer 251.

The fourth etch stop layer 251 on the cell array region CAR may be used as an etch stop layer in the planarization process on the second interlayer insulating layer. Accordingly, the second interlayer insulating pattern 253 may be formed in the first and second peripheral circuit regions PCR1 and PCR2. The second interlayer insulating pattern 253 may have a top surface that is substantially coplanar with the top surface of the fourth etch stop layer 251.

Next, referring back to FIGS. 2A, 2B, and 2C, contact patterns BC, which are connected to the first and second active patterns AP1 and AP2, may be formed in the cell array region CAR. The contact patterns BC may be formed to penetrate the fourth etch stop layer 251, the first interlayer insulating pattern 243, and the first, second, and third etch stop layers 221, 223, and 241.

The formation of the contact patterns BC may include patterning the fourth etch stop layer 251, the first interlayer insulating pattern 243, and the first, second, and third etch stop layers 221, 223, and 241 to form holes exposing the first and second active patterns AP1 and AP2, respectively, depositing a conductive layer to fill the holes, and planarizing the conductive layer to expose a top surface of the fourth etch stop layer 251.

After the formation of the contact patterns BC, peripheral contact plugs PCP may be formed in the first and second peripheral circuit regions PCR1 and PCR2.

The formation of the peripheral contact plugs PCP may include patterning the second interlayer insulating pattern 253, the fourth etch stop layer 251, and the third etch stop layer 241 to form contact holes and depositing a conductive material on the second interlayer insulating pattern 253 to fill the contact holes. The peripheral contact plugs PCP may penetrate the second interlayer insulating pattern 253, the fourth etch stop layer 251, and the third etch stop layer 241 and may be connected to the peripheral transistor. In other words, at least one of the peripheral contact plugs PCP may be connected to the source/drain impurity region SD of the peripheral transistor, and another one of the peripheral contact plugs PCP may be connected to the peripheral gate electrode PG.

After the formation of the contact patterns BC and the peripheral contact plugs PCP, a fifth etch stop layer 255 may be formed on the top surface of the fourth etch stop layer 251 and the top surface of the second interlayer insulating pattern 253. The fifth etch stop layer 255 may be formed of or include an insulating material having an etch selectivity with respect to the second interlayer insulating pattern 253.

Next, the landing pads LP, which are respectively connected to the contact patterns BC, may be formed in the cell array region CAR. The landing pads LP may be formed in the fifth etch stop layer 255. The formation of the landing pads LP may include depositing a conductive layer on the third etch stop layer 241 and patterning the conductive layer using mask patterns.

When the landing pads LP are formed, peripheral interconnection lines PCL, which are connected to the peripheral contact plugs PCP, may be formed in the first and second peripheral circuit regions PCR1 and PCR2.

Thereafter, storage electrodes 261 may be formed to be connected to the landing pads LP, respectively. The storage electrodes 261 may be formed of or include at least one of doped polysilicon, conductive metal nitride materials (e.g., titanium nitride and tantalum nitride), metallic materials (e.g., tungsten, titanium, and tantalum), conductive metal silicide materials, or conductive metal oxide materials.

Next, a capacitor dielectric layer 263 may be formed to conformally cover the storage electrodes 261, and a plate electrode 265 may be formed on the capacitor dielectric layer 263.

After the formation of the data storage patterns DSP, a peripheral circuit insulating layer 267 may be formed to cover the first and second peripheral circuit regions PCR1 and PCR2, and an upper insulating layer 270 may be formed on the data storage patterns DSP and the peripheral circuit insulating layer 267.

According to an embodiment, in the semiconductor memory device including the vertical channel transistors, the active patterns may be formed of a single-crystalline semiconductor material. In this case, the leakage current property of the vertical channel transistor may be improved.

According to an embodiment, the back-gate electrode may be provided to increase the threshold voltage of the vertical channel transistor. Thus, it may be possible to suppress a reduction of the threshold voltage of the vertical channel transistor, which could occur when the vertical channel transistor is scaled down, and thereby prevent the leakage current property of the vertical channel transistor from being deteriorated.

According to an embodiment, the vertical channel transistors may be formed in the cell array region. Then, the interlayer insulating layer may be formed to cover the cell array region and the peripheral circuit region. It may be possible keep a stepwise structure from being formed by the peripheral transistor when the interlayer insulating layer is formed. Accordingly, it may be possible to prevent a dishing phenomenon from occurring in the cell array region when the interlayer insulating layer is formed.

By way of summation and review, embodiments may provide a semiconductor memory device with improved electrical characteristics and an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including a cell array region and a peripheral circuit region;
an active pattern on the cell array region of the substrate;
a peripheral active pattern on the peripheral circuit region of the substrate;
a peripheral gate electrode disposed on a top surface of the peripheral active pattern;
a first interlayer insulating pattern provided on the cell array region to cover a top surface of the active pattern;
a first etch stop layer covering the first interlayer insulating pattern and the peripheral gate electrode with a uniform thickness; and
a second interlayer insulating pattern disposed on the first etch stop layer and in the peripheral circuit region,
wherein, in the cell array region, the second interlayer insulating pattern has a top surface that is located at substantially the same level as a top surface of the first etch stop layer.

2. The semiconductor memory device as claimed in claim 1, further including:
a contact pattern that is provided in the cell array region to penetrate the first etch stop layer and the first interlayer insulating pattern and to be in contact with the top surface of the active pattern; and
a peripheral contact plug, which is provided in the peripheral circuit region to penetrate the second interlayer insulating pattern and the first etch stop layer and to be in contact with the top surface of the peripheral active pattern.

3. The semiconductor memory device as claimed in claim 2, further comprising a data storage pattern disposed on the contact pattern.

4. The semiconductor memory device as claimed in claim 1, further including a second etch stop layer, which is disposed between the first interlayer insulating pattern and the top surface of the active pattern in the cell array region and between the first etch stop layer and the top surface of the peripheral active pattern in the peripheral circuit region.

5. The semiconductor memory device as claimed in claim 4, wherein the first etch stop layer is in contact with a top surface of the second etch stop layer in the peripheral circuit region.

6. The semiconductor memory device as claimed in claim 1, further including a third etch stop layer, which is disposed in the cell array region to cover the top surface of the first etch stop layer and is disposed in the peripheral circuit region to cover the top surface of the second interlayer insulating pattern.

7. The semiconductor memory device as claimed in claim 1, wherein:
the top surface of the peripheral active pattern is substantially coplanar with the top surface of the active pattern, and
a bottom surface of the peripheral active pattern is substantially coplanar with a bottom surface of the active pattern.

8. The semiconductor memory device as claimed in claim 1, further including:
a bit line, which is in contact with a bottom surface of the active pattern and is extended in a first direction;
a word line, which is adjacent to a first side surface of the active pattern and is extended in a second direction crossing the first direction; and
a back-gate electrode, which is adjacent to a second side surface of the active pattern and is extended in the second direction.

9. The semiconductor memory device as claimed in claim 8, wherein a top surface of the word line and a top surface of the back-gate electrode are located at a level lower than the top surface of the active pattern.

10. The semiconductor memory device as claimed in claim 8, further including:

a spacer insulating layer conformally covering the bit line; and a shielding conductive pattern on the spacer insulating layer, the shielding conductive pattern including a line portion extended parallel to the bit line and in the first direction.

11. The semiconductor memory device as claimed in claim 8, further including:

a spacer insulating layer conformally covering the bit line; and peripheral circuit patterns disposed on a bottom surface of the peripheral active pattern, wherein the spacer insulating layer conformally covers the peripheral circuit patterns, in the peripheral circuit region.

12. A semiconductor memory device, comprising:

a substrate including a cell array region and a peripheral circuit region;

a bit line extended from the cell array region in a first direction;

a first active pattern and a second active pattern disposed on the bit line;

a back-gate electrode disposed between the first and second active patterns and extending in a second direction to cross the bit line;

a first word line disposed adjacent to a first side surface of the first active pattern and extending in the second direction;

a second word line disposed adjacent to a second side surface of the second active pattern and extending in the second direction;

a peripheral active pattern on the peripheral circuit region of the substrate;

a peripheral gate electrode on the peripheral active pattern;

a first interlayer insulating pattern disposed in the cell array region to cover top surfaces of the first active pattern and the second active pattern;

a first etch stop layer covering the first interlayer insulating pattern and the peripheral gate electrode with a uniform thickness;

a second etch stop layer disposed between the first interlayer insulating pattern and the top surfaces of the first active pattern and the second active pattern in the cell array region and between the first etch stop layer and a top surface of the peripheral active pattern and the peripheral gate electrode in the peripheral circuit region; and a second interlayer insulating pattern disposed on the first etch stop layer in the peripheral circuit region.

13. The semiconductor memory device as claimed in claim 12, wherein:

the top surface of the peripheral active pattern is substantially coplanar with the top surfaces of the first and second active patterns, and a bottom surface of the peripheral active pattern is substantially coplanar with bottom surfaces of the first and second active patterns.

14. The semiconductor memory device as claimed in claim 13, further including peripheral circuit patterns disposed on the bottom surface of the peripheral active pattern.

15. The semiconductor memory device as claimed in claim 12, wherein a top surface of the second interlayer insulating pattern is substantially coplanar with a top surface of the first etch stop layer in the cell array region.

16. The semiconductor memory device as claimed in claim 12, further including:

contact patterns, which are provided in the cell array region to penetrate the first etch stop layer, the first interlayer insulating pattern, and the second etch stop layer and are coupled to the first and second active patterns, respectively; and a peripheral contact plug, which is provided in the peripheral circuit region to penetrate the second interlayer insulating pattern, the first etch stop layer, and the second etch stop layer to be in contact with the top surface of the peripheral active pattern.

17. The semiconductor memory device as claimed in claim 12, wherein top surfaces of the first and second word lines and a top surface of the back-gate electrode are located at a level lower than the top surfaces of the first and second active patterns.

18. A semiconductor memory device, comprising:

a substrate including a cell array region and a peripheral circuit region;

bit lines provided on the cell array region of the substrate and extending in a first direction;

a shielding conductive pattern including line portions, which are respectively disposed between adjacent ones of the bit lines and extend in the first direction;

first active patterns and second active patterns alternately disposed in the first direction on each of the bit lines;

back-gate electrodes, which are respectively disposed between the first active patterns and the second active patterns that are adjacent to each other in the first direction, and which extend in a second direction to cross the bit lines;

first word lines, which are respectively disposed adjacent to first side surfaces of the first active patterns and extend in the second direction;

second word lines, which are respectively disposed adjacent to second side surfaces of the second active patterns and extend in the second direction;

a first interlayer insulating pattern disposed in the cell array region to cover top surfaces of the first active patterns and the second active patterns;

a peripheral active pattern on the peripheral circuit region of the substrate;

a peripheral gate electrode on the peripheral active pattern;

a first etch stop layer covering the first interlayer insulating pattern and the peripheral gate electrode with a uniform thickness;

a second interlayer insulating pattern disposed on the first etch stop layer and in the peripheral circuit region;

a second etch stop layer, which is disposed between the first interlayer insulating pattern and the top surfaces of the first active patterns and the second active patterns in the cell array region and is disposed between the first etch stop layer and a top surface of the peripheral active pattern in the peripheral circuit region;

contact patterns, which are disposed in the cell array region to penetrate the first etch stop layer, the first interlayer insulating pattern, and the second etch stop layer and are respectively coupled to the first and second active patterns;

a peripheral contact plug, which is disposed in the peripheral circuit region to penetrate the second interlayer insulating pattern, the first etch stop layer, and the second etch stop layer and is in contact with the top surface of the peripheral active pattern; and data storage patterns coupled to the contact patterns, respectively.

19. The semiconductor memory device as claimed in claim 18, further including:

a first back-gate capping pattern between the contact patterns and the back-gate electrodes;

first gate capping patterns between the contact patterns and the first and second word lines;

a second back-gate capping pattern between the bit lines and the back-gate electrodes; and second gate capping patterns between the bit lines and the first and second word lines.

20. The semiconductor memory device as claimed in claim 18, further including:

a spacer insulating layer conformally covering the bit lines; and peripheral circuit patterns disposed on a bottom surface of the peripheral active pattern, wherein the spacer insulating layer conformally covers the peripheral circuit patterns, in the peripheral circuit region.

* * * * *